(12) United States Patent
Ooishi et al.

(10) Patent No.: US 7,672,173 B2
(45) Date of Patent: Mar. 2, 2010

(54) NON-VOLATILE SEMICONDUCTOR MEMORY DEVICE AND SEMICONDUCTOR MEMORY DEVICE

(75) Inventors: Tsukasa Ooishi, Tokyo (JP); Tomohiro Uchiyama, Tokyo (JP); Shinya Miyazaki, Maebaru (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 147 days.

(21) Appl. No.: 11/902,232

(22) Filed: Sep. 20, 2007

(65) Prior Publication Data
US 2008/0019195 A1 Jan. 24, 2008

Related U.S. Application Data

(62) Division of application No. 11/194,777, filed on Aug. 2, 2005, now Pat. No. 7,286,416.

(30) Foreign Application Priority Data

Aug. 13, 2004 (JP) ............................. 2004-236069
Dec. 8, 2004 (JP) ............................. 2004-355793

(51) Int. Cl.
*G11C 7/00* (2006.01)
(52) U.S. Cl. ...................... 365/189.05; 365/189.02; 365/191; 365/230.02; 365/230.08
(58) Field of Classification Search ........... 365/189.05, 365/189.02, 230.02, 230.08, 191
See application file for complete search history.

(56) References Cited

U.S. PATENT DOCUMENTS 5,668,772 A * 9/1997 Hotta .................... 365/230.06
5,673,270 A * 9/1997 Tsujimoto .................... 714/718
5,910,807 A * 6/1999 Ueda et al. .................... 345/531
6,865,112 B2 * 3/2005 Kawai et al. ........... 365/185.22

OTHER PUBLICATIONS

Campardo, et al., "An Overview of Flash Architectural Developments," Proceedings of the IEEE, Apr. 2003, pp. 523-536, vol. 91, No. 4.

Micheloni, et al., "The Flash Memory Read Path: Building Blocks and Critical Aspects," Proceedings of the IEEE, Apr. 2003, pp. 537-553, vol. 91, No. 4.

(Continued)

*Primary Examiner*—Pho M. Luu
(74) *Attorney, Agent, or Firm*—McDermott Will & Emery LLP

(57) ABSTRACT

For each memory block, a predecoder for predecoding an applied address signal, an address latch circuit for latching the output signal of the predecoder, and a decode circuit for decoding an output signal of the address latch circuit and performing a memory cell selecting operation in a corresponding memory block are provided. Propagation delay of latch predecode signals can be made smaller and the margin for the internal read timing can be enlarged. In addition, the internal state of the decoder and memory cell selection circuitry are reset to an initial state when a memory cell is selected and the internal data output circuitry is reset to an initial state in accordance with a state of internal data reading. Thus, a non-volatile semiconductor memory device that can decrease address skew and realize an operation with sufficient margin is provided.

6 Claims, 28 Drawing Sheets

OTHER PUBLICATIONS

Silvagni, et al., "An Overview of Logic Architectures Inside Flash Memory Devices," Proceedings of the IEEE, Apr. 2003, pp. 569-580, vol. 91, No. 4.

Chimenton, et al., "Overerase Phenomena: An Insight Into Flash Memory Reliability," Proceedings of the IEEE, Apr. 2003, pp. 617-625, vol. 91, No. 4.

* cited by examiner

_US 7,672,173 B2_

NON-VOLATILE SEMICONDUCTOR MEMORY DEVICE AND SEMICONDUCTOR MEMORY DEVICE

RELATED APPLICATIONS

This application is a Divisional of U.S. application Ser. No. 11/194,777, filed Aug. 2, 2005 now U.S. Pat. No. 7,286,416, claiming priority of Japanese Application Nos. 2004-236069, filed Aug. 13, 2004, and 2004-355793, filed Dec. 8, 2004, the entire contents of each of which are hereby incorporated by reference.

BACKGROUND OF THE INVENTION

1. Field of the Invention

The present invention relates to a semiconductor memory device and a construction of a portion related to data reading for reading data accurately at high speed. Specifically, the present invention relates to a construction for achieving high-speed data reading in a non-volatile semiconductor memory device.

2. Description of Background Art

A non-volatile semiconductor memory device such as a flash memory is widely used in the field of portable equipments and the like as it can store data in a non-volatile manner. A memory cell structure of the non-volatile semiconductor memory device is roughly divided into a structure utilizing a stacked gate type transistor in which charges are stored in a conductive floating gate formed of polysilicon or the like, and insulating film trap type memory cell structure in which charges are stored in an insulation film such as a nitride film. In either memory cell structure, a threshold voltage of the memory cell transistor is set in accordance with the amount of trapped charges, and the data is stored in accordance with the magnitude of the threshold voltage.

Such a non-volatile semiconductor memory device is characterized in that it has smaller area of cell occupation per bit as compared with an SRAM (Static Random Access Memory) that typically requires six transistors per memory cell, and that a refresh operation for holding data required in a DRAM (dynamic Random Access Memory) is unnecessary. Storage of a large amount of data such as sound or image is required also for a non-volatile semiconductor memory device, and hence, increase in storage capacity thereof has been desired.

In such a non-volatile semiconductor memory device having large storage capacity, a construction is generally used in which the memory array is divided into a plurality of blocks, an X decoder and a Y decoder for selecting memory cells are arranged for each block, and memory cell selection is performed in a block basis. As only a selected block is operated, power consumption can be reduced. Further, the number of memory cells connected to a bit line can be reduced by such block division, and therefore, load of the bit line is reduced, achieving higher speed of accessing.

Such a construction of the non-volatile semiconductor memory device having large storage capacity is disclosed, for example, in "An Overview of Flash Architectural Developments", PROCEEDINGS of the IEEE, Vol. 91, No. 4, April 2003, pp. 523-536.

As disclosed in the reference above, in a non-volatile semiconductor memory device, an address decode circuit (including a predecode circuit) is provided for each memory array block. An address signal applied in synchronization with an external clock signal is latched by an address latch circuit arranged commonly to the memory array blocks, predecoded and then, supplied to each address decode circuit.

In the non-volatile semiconductor memory device, a command designating an operation mode is supplied to an address input circuit through an address signal line. The address latch circuit is arranged on one end side of the memory array, in the vicinity of the address input circuit. Further, the predecode circuit is arranged on one end side of the memory array in the vicinity of the address latch circuit, in order to reduce the number of internal address signal lines and to reduce charging/discharging current of the internal address signal lines, and supplies a predecode signal to each address decode circuit. Therefore, when the memory array size increases as the storage capacity increases, the signal line transmitting the internal address signal from the address predecode circuit to each address decode circuit becomes longer to have an increased load. Consequently, the address predecode signal comes to have large skew, that is, difference in arrival time of address predecode signal becomes larger between the leading end and terminating end of the address predecode signal transmitting line. Accordingly, a margin for the timing of starting memory cell selection becomes smaller, making it difficult to guarantee accurate memory cell selecting operation. In order to ensure sufficient margin for the memory cell selecting operation and the data reading operation, it is necessary to set the timing of memory cell selection/data reading operation, taking into account the worst case of arrival of the address predecode signal to the address decode circuit, which makes it difficult to achieve a high-speed operation.

For accurate data reading, it is necessary to correct an erroneous bit if present. Provision of the error correction function (ECC function) improves efficiency in repairing a defective bit, and hence improves production yield. When the bit width of the internal read data increases to 64 bits or to 128 bits, the number of bits for error detection/correction must be increased for accurate error detection/correction.

When an error of the stored data is simply to be detected, an even/odd parity bit (s) is added, and typically, 1 bit of parity bit is added on the basis of 8-bit unit. In this case, whether there is an error or not can be detected, dependent on whether the least significant bit of the addition result value of the read out 8 bit data matches the parity bit or not. Parity check using even/odd parity bit (s) can detect an error while it cannot specify the bit that causes the error. Therefore, error correction is impossible. When an ECC code is used to realize the error detection/correction function, typically, an ECC code typically of 7 bits is added to the data of 64 bits. Here, information data and the ECC data must be read at the same speed, to perform error detection and correction. In the aforementioned reference, the manner how the data bit for error detection/correction is stored in the memory array and how the data bit and the ECC code bit are read substantially at the same speed to achieve high-speed reading are not at all considered.

In order to achieve high-speed data reading, it is necessary to initialize the internal circuitry at a timing as fast as possible, to be ready for the next reading cycle. Generally, a non-volatile semiconductor memory device operates in a static manner like an SRAM, for decoding an address and providing data output. In a large storage capacity memory, signal lines in the data reading path are of different length, propagation time of internal data differs dependent on the position of a selected memory cell, and hence the timing at which the data is made definite differs for each data bit in the data output circuit. Therefore, in this case also, in order to read data accurately, the data reading timing and the timing for initializing the data output path must be set considering the worst case. Therefore, the cycle time of data reading cannot be reduced, and it becomes difficult to achieve high-speed reading.

SUMMARY OF THE INVENTION

An object of the present invention is to provide a non-volatile semiconductor memory device capable of reading data accurately at high speed.

Another object of the present invention is to provide a semiconductor memory device having an enlarged operation margin for data reading.

According to a first aspect, the present invention provides a non-volatile semiconductor memory device including: a memory array having a plurality of memory cells, arranged in rows and columns, each storing data in a non-volatile manner; predecode circuitry arranged along one side of the memory array, for predecoding an address signal designating a memory cell of the memory array and generating a predecoded address signal; address latch circuitry arranged along one side of the memory array in correspondence with the predecode circuitry, for latching the predecoded address signal from the predecode circuitry; cell selecting circuitry responsive to address latched by the address latch circuitry, for selecting an addressed memory cell of the memory array, in accordance with the latched address signal from the address latch circuitry; and data reading circuitry for reading data of the memory cell selected by the cell selecting circuitry in a data reading mode of operation.

According to a second aspect, the present invention provides a semiconductor memory device including: a memory array having a plurality of memory cells arranged in rows and columns; address latch circuitry for latching an address signal designating a memory cell of the memory cell array; cell selecting circuitry for selecting an addressed memory cell of the memory array in accordance with the latched address signal of the address latch circuitry; and data reading circuitry for reading data of the memory cell selected by the cell selecting circuitry in a data reading mode of operation, for generating internal data. In the data reading mode of operation, the cell selecting circuitry resets the address latch circuitry to the initial state, after a memory cell is selected.

According to a third aspect, the present invention provides a semiconductor memory including a memory array divided into a plurality of memory mats. Each memory mat includes a plurality of memory cells and memory cell selection and data reading are performed in parallel in a data reading mode of operation. Each memory mat includes a data region for storing data bits, and an error correction bit region for storing parity bits forming error correction codes for the data.

A predecoded signal from the predecode circuitry is latched by the address latch circuitry and then, the latched address signal is transmitted from the address latch circuitry to the address decode circuit, for selecting a memory cell. The predecode circuitry and the address latch circuitry are arranged along one side of the memory array. Therefore, time difference of transmission of the latch address to the cell selecting circuitry can be reduced, and data reading margin can be enlarged.

Further, in the data reading cycle, after a memory cell is selected, the address latch circuitry is reset. Therefore, the direction of change of the latch address signal in the next reading cycle can be set always in one direction from the reset state (inactive state) to a state different from the reset state (active state), so that occurrence of multi-selection state can be prevented regardless of the designated address. Thus, the timing of address change can always be made substantially the same, and the reading timing can be made faster.

Further, as the parity bits for error correction are arranged dispersed over the memory mats, the size of the memory mats can be made the same, so that memory cell selecting lines can have substantially the same load, and data can be read from each memory mat at substantially the same timing. Further, in a nonvolatile semiconductor memory device, the number of memory cells connected to each source line can be made the same. Therefore, increase in source line potential at the time of data reading can be suppressed, and accordingly, the current that can be driven by the selected memory cell in each memory mat can be made uniform. Thus, accurate data reading at high Speed becomes possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
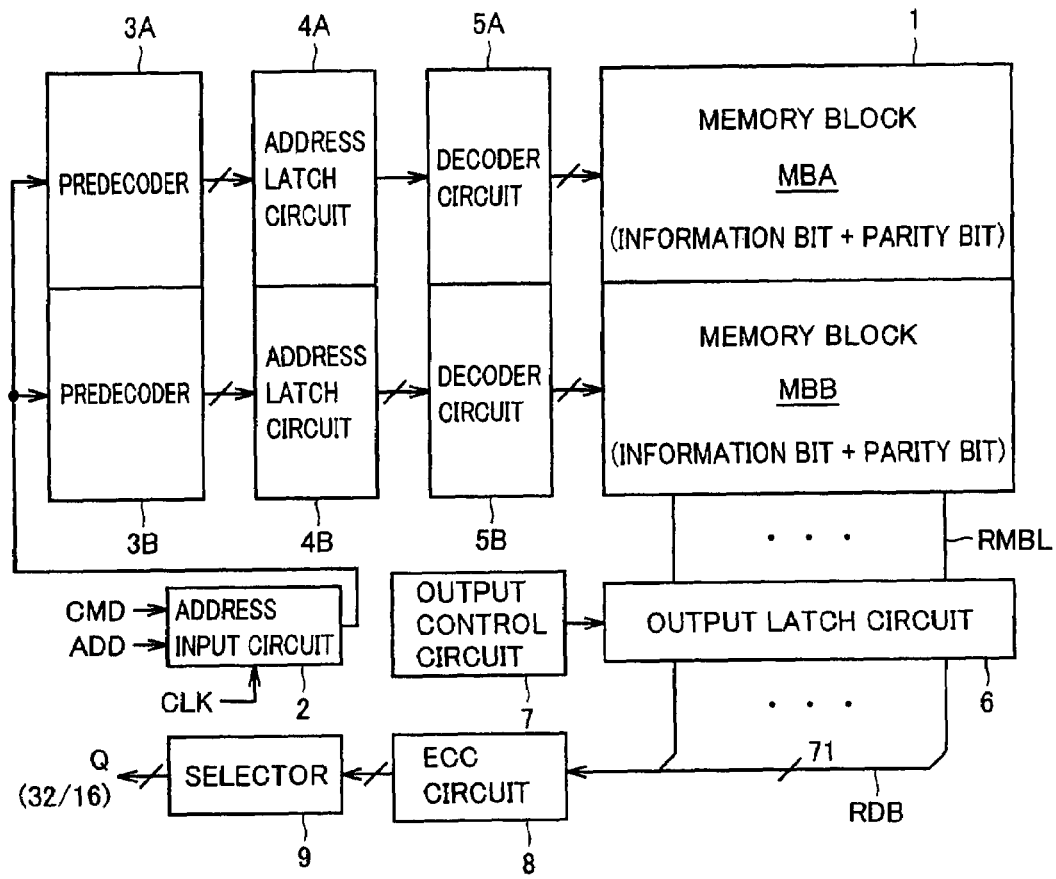
FIG. 1 schematically shows a construction of a main portion of a non-volatile semiconductor memory device according to a first embodiment of the present invention.

FIG. 1 schematically shows a construction of a main portion of a non-volatile semiconductor memory device in accordance with the first embodiment of the present invention.

FIG. 1 shows only the construction of the portion related to data reading, and constructions of portions related to data writing (programming) and erasure are not shown.

Referring to FIG. 1, the non-volatile semiconductor memory device includes a memory array 1 having non-volatile memory cells arranged in rows and columns. Memory array 1 is divided into two memory blocks MBA and MBB. Memory blocks MBA and MBB each store information (data) bits and parity bits for forming ECC codes for error detection/correction of the information bits. The parity bits are stored dispersed uniformly in each of the memory blocks MBA and MBB.

The non-volatile semiconductor memory device further includes: an address input circuit 2 taking an external command CMD and an address signal ADD in accordance with a clock signal CLK; predecoders 3A and 3B provided corresponding to memory blocks MBA and MBB, respectively, for predecoding an internal address signal from address input circuit 2; address latch circuits 4A and 4B latching predecoded signals from predecoders 3A and 3B, respectively; and decode circuits 5A and 5B further decoding the latched predecoded signals from address latch circuits 4A and 4B, and generating selection signals for selecting memory cells in corresponding memory blocks MBA and MBB.

Address input circuit 2 is arranged on one end side (lower side) of the memory array, takes in an external address signal in synchronization with the clock signal CLK to generate an internal address signal, and transmits the internal address signal to predecoders 3A and 3B.

Predecoders 3A and 3B are activated when an address signal from address input circuit 2 designates the corresponding memory blocks, perform predecoding operation and generate predecoded signals, which in turn are transmitted to corresponding address latch circuits 4A and 4B. Therefore, in memory blocks MBA and MBB, memory cell selecting operation is performed alternatively in data reading.

Predecoders 3A and 3B are provided corresponding to memory blocks MBA and MBB, respectively. Interconnection lines from address input circuit 2 to predecoders 3A and to 3B have substantially the same length. The distance of interconnection is the same from predecoders 3A and 3B to address latch circuits 4A and 4B. Therefore, when the predecoded signal is transmitted from one end (lower side) of memory array 1 to the other end side (upper side) of memory array 1, propagation delay of the predecoded signal can be suppressed, address skew can be suppressed, and hence reading at a faster timing becomes possible.

Further, the distance of interconnection for the address signals is the same from address latch circuits 4A and 4B to decode circuits 5A and 5B, respectively, so that the timing at which the address is made definite in memory blocks MBA and MBB can be made the same. Thus, a margin for the decoding operation can be enlarged, achieving stable and high-speed reading.

The non-volatile semiconductor memory device further includes: an output latch circuit 6 receiving data of a selected memory cell of memory block MBA or MBB through a read main bit line RMBL and generating an internal output data; an ECC circuit (error detection/correction circuit) 8 receiving the internal output data from output latch circuit 6 through a read data bus RDB, for performing error detection/correction of information bits based on parity bits; and a selector 9 selecting, from the information bits from ECC circuit 8, data of the number of bits corresponding to the output data bit width, and generating an external read data Q.

By way of example, from memory block MBA or MBB, 64 information bits and 7 parity bits are read in parallel and applied to output latch circuit 6. From 64 bits of data that have been subjected to error detection/correction by ECC circuit 8, selector 9 selects 32 bits or 16 bits, to generate external read data Q.

The non-volatile semiconductor memory device further includes an output control circuit 7 that resets output latch circuit 6, in accordance with the state of transfer of data read to read main bit line RMBL. The output control circuit 7 monitors the state of reading of the internal read data, and in accordance with the result of monitoring, resets the output latch circuit after the internal output data is reliably generated in accordance with the internal read data.

As the output control circuit 7 resets the output latch circuit 6 at a certain timing after the data is latched, even when the propagation time of the internal read data differs dependent on the position of the selected memories, the latched data of output latch circuit 6 is read after the data has been latched and read in the output latch circuit 6. Therefore, the timing of read control can be made the same regardless of the positions of the selected memory cells in memory array 1, and operation margin for data reading can be enlarged.

Figure 2:
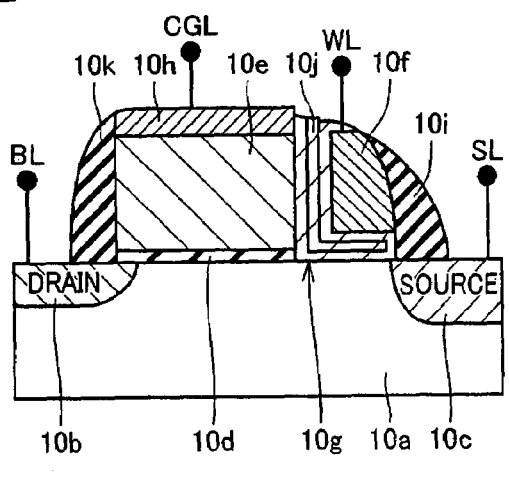
FIG. 2 schematically shows a structure of a memory cell used in the non-volatile semiconductor memory device shown in FIG. 1.

FIG. 2 shows an exemplary structure of the non-volatile memory cell included in memory array 1 shown in FIG. 1. Referring to FIG. 2, non-volatile memory cell MC includes impurity regions 10$b$ and 10$c$ formed spaced apart from each other on a surface of a substrate region 10$a$, a control gate 10$e$ formed on substrate surface 10$a$ close to impurity region 10$b$, with a gate insulating film 10$d$ interposed, and a memory gate 10$f$ formed on insulating film 10$g$, close to impurity region 10$c$. Insulating layer 10$g$ is formed extended between control gate 10$e$ and memory gate 10$f$. Insulating layer 10$g$ is formed, for example, of an ONO film (silicon Oxide-Nitride-Oxide film), and includes a charge trap layer 10$j$ formed, for example, of a silicon nitride film.

On a sidewall of memory gate 10$f$, a sidewall insulating film 10$i$ reaching impurity region 10$c$ is formed. On a sidewall of control gate 10$e$, a sidewall insulating film 10$k$ reaching impurity region 10$b$ is formed. A low resistance metal 10$h$ such as Cobalt Silicide film (CoSi film), for example, is formed on the control gate 10$e$.

Impurity regions 10$b$ and 10$c$ function as drain and source, respectively, at the time of data reading, and impurity region 10$b$ is connected to a bit line BL and impurity region 10$c$ is connected to a source line SL. Control gate 10$e$ is connected to a control gate line CGL, and memory gate 10$f$ is connected to a word line WL. Low-resistance metal layer 10$h$ on control gate 10$e$ lowers resistance of control gate line CGL.

In non-volatile memory cell MC shown in FIG. 2, when charges are stored in charge trap layer 10$j$ (in writing operation), a voltage, for example, of 1.5V is applied to control gate line CGL, and a high voltage of, for example, 11V is applied to word line WL, so as to form a channel below control gate 10$e$. Substrate region 10$a$ is held at the ground potential level. At the time of writing, a voltage, for example, of 5.5V is applied to source line SL, and a constant current source is connected to the drain through bit line BL. A current is caused to flow from source line SL to bit line BL, so that electric field is concentrated in substrate region 10$a$ between control gate 10$e$ and memory gate 10$f$. By the high electric field, hot carriers (electrons) are generated and the generated hot carriers are accelerated in accordance with the voltage applied to memory gate 10$f$, and captured in charge trap layer 10$j$ (source side injection). By this writing operation, the threshold voltage of the memory cell is set to a voltage level higher than the memory gate voltage (for example, 1.5V) applied at the time of data reading.

In erasure, impurity region (drain) 10$b$ is set to an open state, control gate 10$e$ is set to the ground voltage level through control gate line CGL, and substrate region 10$a$ is kept at the ground voltage level. A negative voltage of, for example, -6V is applied to memory gate 10$f$ through word line WL, and a voltage of 5.5V, for example, is applied to impurity region (source) 10$c$ through source line SL. In this state, hot carriers (holes) generated by the high electric field below memory gate 10$f$ are injected to charge trap layer 10$j$, attracted by the negative voltage of memory gate 10$f$ and combined to the trapped electrons, so that electrons stored in the charge trap layer 10$j$ are neutralized. By this erasing operation, the threshold voltage of the memory cell decreases to a voltage level lower than the memory gate voltage applied at the time of reading.

In data reading, a read voltage of 1.5V is applied to memory gate 10$f$, and impurity region 10$c$ is kept at the ground voltage level. To impurity region 10$b$, a read voltage of about 1.5V is supplied through bit line BL. To control gate 10$e$, 1.5V is applied through control gate line CGL. Dependent on the amount of accumulated carriers in charge trap layer 10$j$, memory cell MC assumes either a state in which the threshold voltage has large absolute value, or a state in which the threshold value has small absolute value, in the case when binary data is stored.

When control gate line CGL is driven to the selected state, a channel is formed below control gate 10$e$. When electrons are trapped in charge trap layer 10$j$ and the threshold voltage is high (for the case of N channel transistor), an inversion layer is not formed below charge trap layer 10$j$, and therefore, a current does not flow between impurity regions 10$b$ and 10$c$. On the other hand, when the amount of electrons trapped in charge trap layer 10$j$ is small because of hole injection or when the amount of holes is large and the threshold voltage is low (for the case of N channel transistor), an inversion layer is formed below charge trap layer 10$j$, and a current flows between impurity regions 10$b$ and 10$c$. By sensing the amount of current flowing through bit line BL, the data stored in non-volatile memory cell MC is read.

The structure of non-volatile memory cell MC is not limited to the one shown in FIG. 2, and other memory cell structures may be used. Further, different methods may be employed for the method of writing/erasing data. By way of example, by discharging the electrons trapped in charge trap layer 10$j$ to substrate region 10$a$ or to memory gate 10$f$, erasure may be performed.

Further, the erased state of the memory cell may be the state having high threshold voltage, and the written state may be the state of low threshold voltage.

In the memory cell structure, a memory transistor for storing data and a selection transistor for selecting the memory transistor are connected in series between the bit line and the source line. Therefore, even when the memory transistor enters an over-erased state and the threshold voltage attains negative, data reading of the selected memory cell is not affected by the over-erased cell, as long as the selection transistor is in a non-conductive state. Therefore, the step of adjusting threshold voltage to prevent the over-erased state becomes unnecessary, and thus, the time for writing can be reduced. Further, the influence of the over-erased cell on the data reading can be suppressed, and a defective cell can be repaired simply by replacement with a redundant cell.

Figure 3:
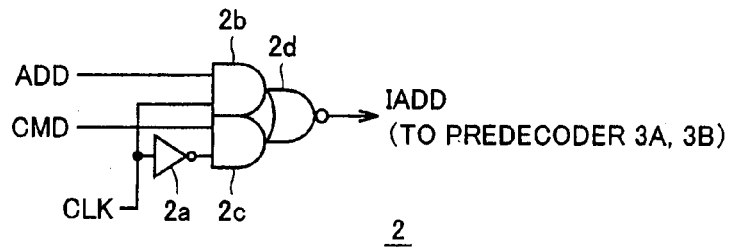
FIG. 3 shows an exemplary construction of an address input circuit shown in FIG. 1.

FIG. 3 shows an exemplary construction of address input circuit 2 shown in FIG. 1. Referring to FIG. 3, address input circuit 2 includes an inverter 2$a$ inverting the clock signal CLK, an AND gate 2$b$ receiving the clock signal CLK and an external address signal ADD, an AND gate 2$c$ receiving an output signal from inverter 2$a$ and an external command CMD, and an NOR gate 2$d$ receiving output signals from AND gates 2b and 2c and generating an internal address signal IADD. These gates 2b to 2d are formed by a composite gate.

In the address input circuit 2 shown in FIG. 3, when clock signal CLK is at an H level (logical high level), internal address signal IADD is generated in accordance with the external address signal ADD. When the clock signal CLK attains to an L level (logical low level), the output signal of inverter 2a attains to the H level, and based on command CMD, internal address IADD is generated and applied to predecoders 3A and 3B shown in FIG. 1. Command CMD and address signal ADD are generally applied through a common terminal. Command CMD designates an operation mode such as data writing, erasure, and test mode. When command CMD is applied, internal address signal IADD is applied, as a command, to a sequence controller, not shown, and decoded, whereby the designated operation is executed.

In address input circuit 2, by taking the command CMD and the address signal ADD at different phases of the clock signal CLK, the address signal and the command can surely be distinguished from each other, even when an operation mode (write or erase) is designated in accordance with a write enable signal.

Figure 4:
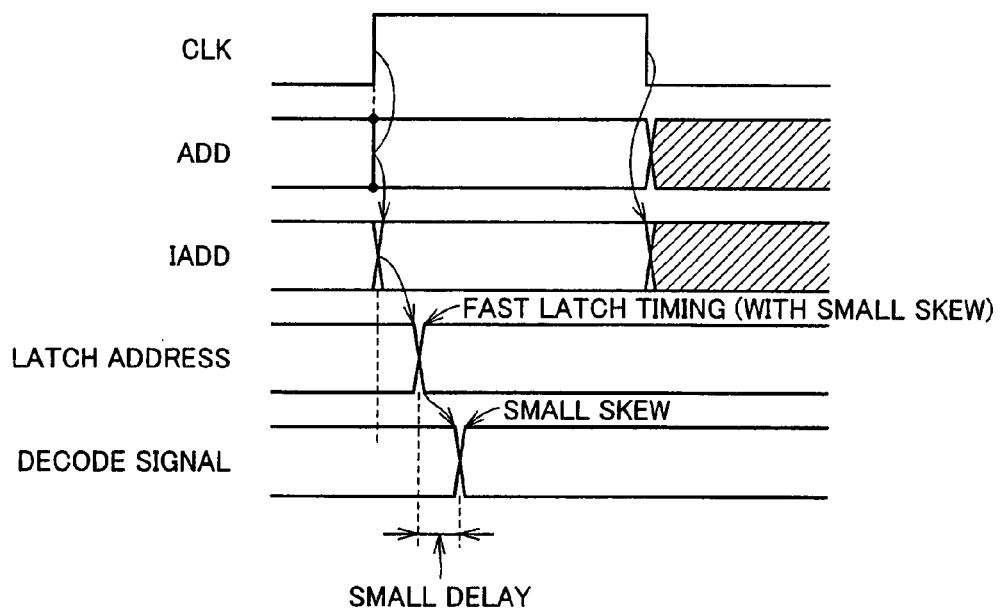
FIG. 4 is a timing diagram representing timings of address latching and decoding operations of the non-volatile semiconductor memory device shown in FIG. 1.

FIG. 4 schematically shows propagation waveforms of the address signal in the non-volatile semiconductor memory device shown in FIG. 1. In response to a rise of clock signal CLK, address input circuit 2 generates, from external address signal ADD, an internal address signal IADD. Interconnection distance from address input circuit 2 to predecoder 3A is substantially the same as that to predecoder 3B, and therefore, predecoders 3A and 3B start predecoding operation substantially at the same timing. The predecoded signals are transmitted to corresponding address latch circuits 4A and 4B. Therefore, in a selected memory block, only the predecoded address signal is transmitted from an associated predecoder over a short interconnection distance, and therefore, it can be transmitted stably with small skew to the address latch circuit. Therefore, address latch timing in address latch circuits 4A and 4B can be set faster.

The latch predecoded signal is simply transmitted from address latch circuit 4A or 4B to the corresponding decode circuit 5A or 5B, and the interconnection distance therebetween is short. Therefore, when decode circuit 5A or 5B generates a decode signal in accordance with the latched address, high speed transmission is possible, and hence, address decode circuit 5A or 5B can perform the decoding operation and generate the decode signal at a faster timing. Therefore, in this case also, the decode signal can be generated from the latched address from address latch circuits 3A and 3B and can attain to the definite state in a short period of time, and hence, the decode signal can be driven to the definite and settled state at high speed. Accordingly, the margin for reading operation can be enlarged, and the timing for starting the reading operation can be made faster. Thus, high-speed reading becomes possible.

As described above, according to the first embodiment of the present invention, the memory array is divided into memory blocks, and for each memory block, a predecoder, an address latch circuit and an address decode circuit are arranged, whereby the address decoding operation can be performed in accordance with the internal address signal transmitted with sufficiently small skew from the address input circuit. Consequently, the margin for the timing of starting a reading operation can be enlarged, and accurate and high-speed reading is achieved.

Second Embodiment

Figure 5:
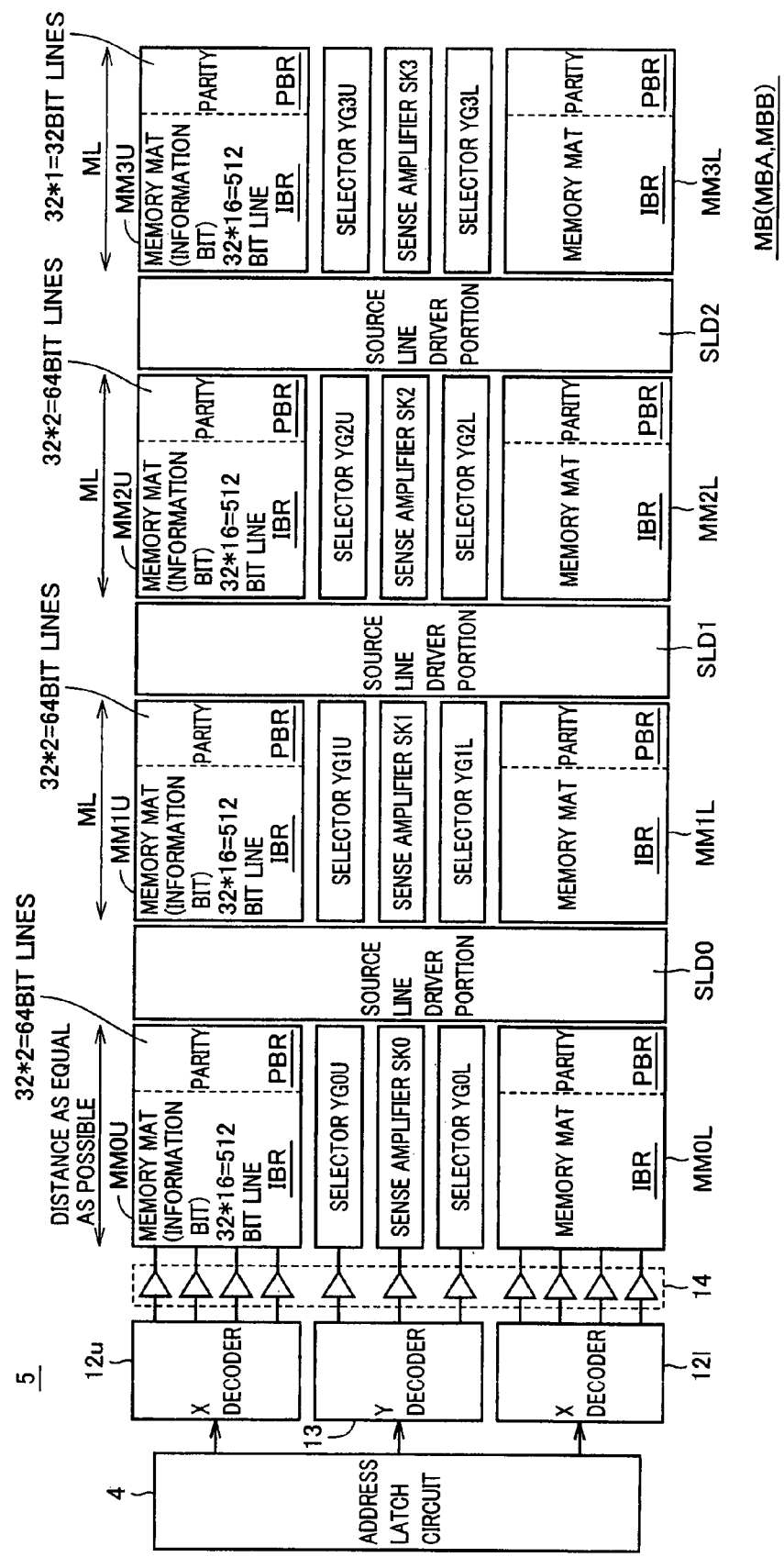
FIG. 5 shows a specific construction of a memory block in accordance with a second embodiment of the present invention.

FIG. 5 more schematically shows the construction of memory array 1 and decode circuits 5a and 5b shown in FIG. 1. FIG. 5 shows a construction in one memory block of memory blocks MBA and MBB of memory array 1. Memory block MB (MBA or MBB) includes 8 memory mats MM0U-MM3U and MM0L-MM3L. Each of the memory mats MM0U-MM3U and MM0L-MM3L includes an information bit region IBR for storing information (data) bits and a parity region PBR for storing parity bits. In information bit region IBR, 16 bit line blocks each including 32 bit lines (subbit lines) are provided, and a total of 512 bit lines (subbit lines) are arranged.

Decode circuit 5 (5A or 5B) includes an X decoder 12u provided corresponding to memory mats MM0U-MM3U arranged in alignment in a row extending direction, an X decoder 12l provided corresponding to memory mats MM0L-MM3L arranged in the row extending direction, and a Y decoder 13. X decoders 12u and 12l decode a latched address (predecode address signal) from corresponding address latch circuit 4, and based on the result of decoding, drive a control gate line through a driver included in a driver band 14.

The control gate line from X decoder 12u is arranged extending commonly to corresponding memory mats MM0U-MM3U. A control gate driving signal applied from X decoder 12l through driver band 14 is commonly applied to memory mats M0L-M3L, One of X decoders 12u and 12l is selected, and either in the upper memory mats MM0U-MM3U or in lower memory mats MM0L-MM3L, a control gate line is driven to a selected state.

It is noted, however, that one of the memory blocks MBA and MBB is driven to the selected state, and the control gate lines are not simultaneously driven to the selected state in both of the blocks.

Further, as will be described in detail later, in one memory block, two sets of memory mats MM0U-MM3U and MM0L-MM3L shown in FIG. 5 are arranged. In the second embodiment, for simplicity of drawings, only one set of memory mat trains MM0U-MM3U and MM0L-MM3L is shown.

Corresponding to memory mats MM0U-MM3U, selectors YG0U-YG3U are provided, for selecting a corresponding bit line in accordance with a Y selection signal from Y decoder 13, and corresponding to memory mats MM0L-MM3L, selectors YG0L-YG3L are provided, each for selecting a column (bit line) from a respective memory mat. Between these selectors YG0U-YG3U and selectors YG0L-YG3L, sense amplifier circuits SK0-SK3 for sensing and amplifying selected memory cell data in accordance with a sense amplifier enabling signal from Y decoder 13 are provided.

In data reading, in each of memory mats MM0U-MM3U or MM0L-MM3L, 16 information bits are read, and a total of 64 information bits are read. For detecting and correcting any error in 64 bits of information, an ECC code of 7 bits is used. The ECC code is formed by dividing 64 information bits into 7 sets of bits in accordance with a prescribed algorithm, and by finding a parity bit for the bits of each divided set. The parity bits forming the ECC code are arranged uniformly dispersed over memory mats MM0U-MM3U or MM0L-MM3L. Specifically, in each of memory mats MM0U-MM2U, 2 parity bits are stored in the parity region PBR, and in memory mat MM0U, 1 parity bit is stored in the parity region PBR. The length MML of each of memory mats MM0U-MM3U and MM0L-MM3L is set to be as equal as possible among the memory mats.

Between memory mats MM0U-MM3U and MM0L-MM3L, source line driver portions SLD0-SLD2 are provided. These source line driver portions SLD0-SLD2 supply a prescribed voltage to the source lines in writing or erasing data. In data reading, source line driver portions SLD0-SLD2 maintain the source lines of the corresponding memory mats at the ground voltage level. As the parity bits are stored being uniformly dispersed over memory mats MM0U-MM3U and MM0L-MM3L, the following effects can be provided.

Figure 6A:
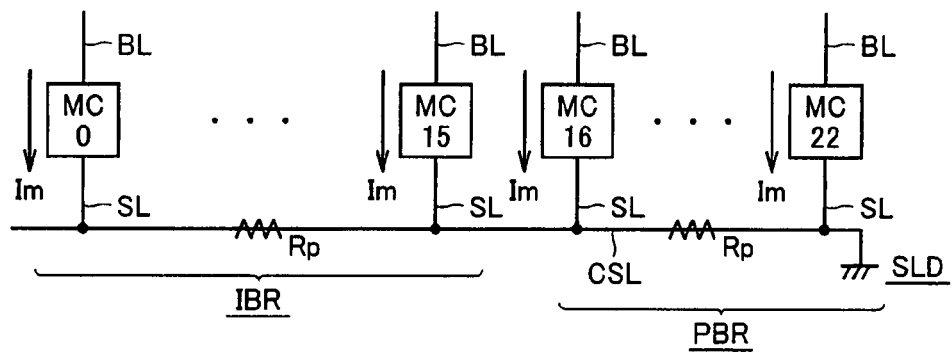
FIG. 6A schematically shows distribution of a source line current when ECC codes are arranged in a concentrated manner, and FIG. 6B schematically shows distribution of source current when ECC codes are stored in a dispersed manner, in accordance with the first embodiment of the present invention.

Assume that the ECC code is arranged concentrated on one memory mat MM, as shown in FIG. 6A. In this case, in data reading, common source line CSL is coupled to the ground potential at the source line driver portion SLD, as shown in FIG. 6A. The common source line CSL is arranged extending commonly over information bit region IBR and parity bit region PBR in one memory mat. At the time of data reading, 16 bits of memory cells MC0-MC15 are coupled to common source line CSL in the information bit region IBR, and 7 bits of memory cells MC16-MC22 are coupled to common source line CSL in the parity bit region PBR. Reading of data is performed by sensing a magnitude of a memory cell current Im flowing from bit line BL through memory cells MC (MC0-MC22).

Here, as there is a line resistance Rp of common source line CSL, in the case when a total of 23 memory cells are coupled, the common source line CSL becomes longer and comes to have larger line resistance Rp. Therefore, when the memory cell current Im flows, the potential of the common source line CSL floats up much greater, because of the large line resistance and the increase in current resulting from the increased number of memory cells through which the memory cell current flows. As a result, source potential distribution occurs among memory cells MC0-MC22, and possibly the magnitude of memory current Im to be driven in the state of same threshold voltage may differ. Particularly, in a memory cell at which the source line potential floats up significantly, the memory cell current Im becomes smaller, and therefore, a state having a small threshold voltage may possibly be determined erroneously as a state having large threshold voltage.

Figure 6B:
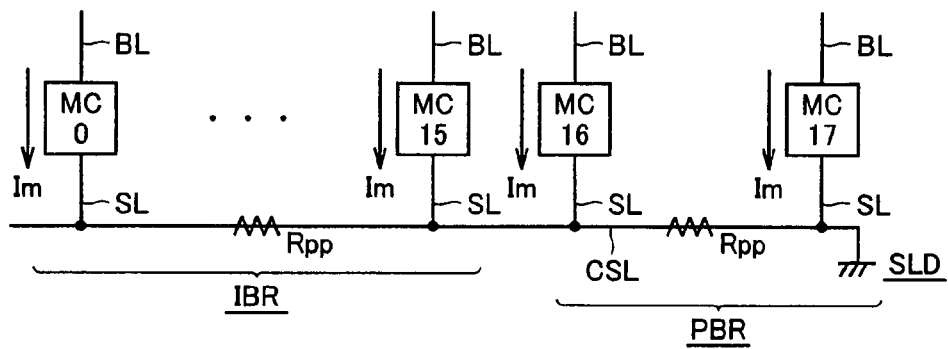

When the parity bit region PBR is arranged uniformly in each memory mat as shown in FIG. 6B, it follows that the memory cells MC16 and MC17 storing parity bits of at most 2 bits are coupled to one common source line CSL, through which the memory cell current Im flows. In this case, the length of common source line CSL becomes shorter than in FIG. 6A, line resistance Rpp becomes smaller, and the driving source line current is also reduced. Therefore, floating up of the potential of common source line CSL can be suppressed, the memory cell current Im corresponding to the threshold voltage of the memory cell can be driven stably, and accurate data reading is achieved.

Therefore, when the memory mat MM is set to have the equal length ML as shown in FIG. 5, the length of the common source line CSL can be made equal, variation in floating up of the source potential among memory cells of a memory mat can be suppressed, and stable data reading becomes possible.

The arrangement of the common source line CSL is similar in a hierarchical structure having a sub source line connected common to memory cells MC connected to 32 bit lines BL and a global source line arranged common to the sub source lines of the memory mat. Floating up of potential of the global source line is transmitted to the common sub source line, causing the same problem. Therefore, by arranging the memory cells storing parity bits uniformly dispersed over a plurality of memory mats, the number of selected memory cells connected to one global source line can be made uniform, and the variation in source potential can be suppressed.

Further, the number of selected memory cells connected to the common source line CSL becomes smaller, the total sum of memory cell currents Im flowing into the common source line is reduced, and accordingly, floating up of the potential of common source line CSL can further be suppressed.

In the construction described above, 64 bits of data are stored dispersedly in four memory mats. The bit width of information (data) may be of a different size, and the number of divided memory mats is not limited to 4, and may be 8 or other number of divisions.

As described above, according to the second embodiment of the present invention, the parity bits of the ECC code are stored uniformly dispersed over divided regions of the memory block, that is, over a plurality of memory mats, and in each memory mat, the memory cell current flowing into a source line and a source line resistance can be made uniform, for each of the source line driver portions SDL0-SDL3. Thus, floating up of the potential of the common source line can be suppressed. Accordingly, sufficient memory cell current flows in each memory cell, enabling accurate and high speed data reading.

Third Embodiment

Figure 7:
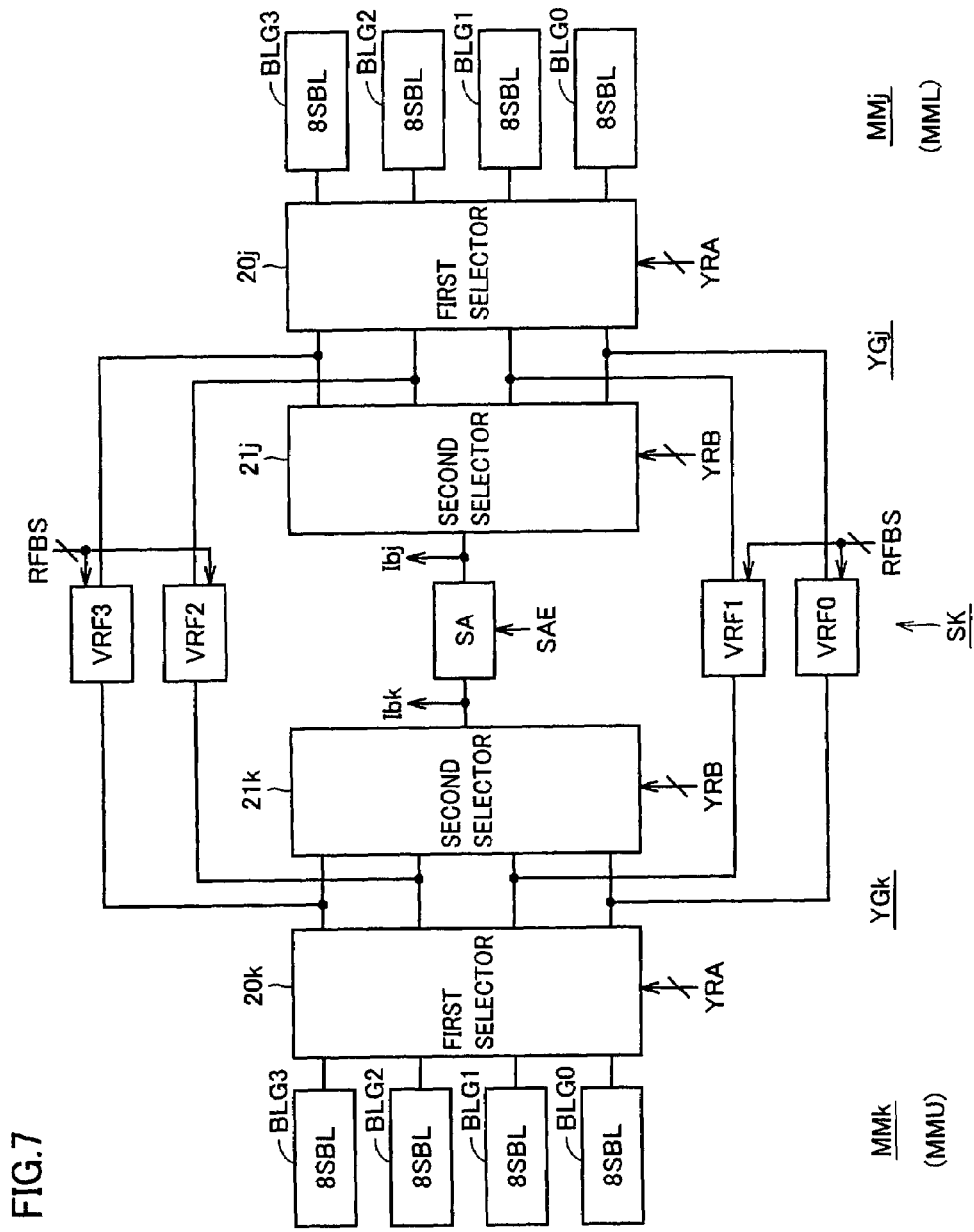
FIG. 7 schematically shows a construction of a portion related to one sense amplifier of a non-volatile semiconductor memory device in accordance with a third embodiment of the present invention.

FIG. 7 schematically shows a construction of a portion for reading 1 bit of internal data, of the non-volatile semiconductor memory device according to the third embodiment of the present invention. In FIG. 7, a construction of a portion for reading 1 bit of memory cell data from memory mats MMk and MMj is shown as a representative. Memory mats MMk and MMj correspond to the memory mat MMU (MM0U-MM3U) and MML (MM0L-MM3L) shown in FIG. 5.

In each of memory mats MMk and MMj, one bit line (subbit line) is selected from 32 bit lines (subbit lines) SBL. Here, 32 subbit lines are divided into subbit line groups BLG0-BLG3 each including 8 subbit lines SBL. A memory cell is connected to a subbit line SBL. Here, in an internal data reading path, the data is successively transmitted through the common bit line to the main bit line, and therefore, the bit line to which the memory cell is connected will be referred to as the subbit line.

In memory mat MMk, there are provided a first selector $20k$ for selecting one subbit line in accordance with a Y selection signal YRA from each of the subbit line groups BLG0-BLG3, and a second selector $21k$ for selecting one subbit line from four subbit lines selected by the first selector $20k$ in accordance with a Y selection signal YRB. Similarly, in memory mat MMj, there are provided a first selector $20j$ for selecting 1 bit of subbit line in accordance with the Y selection signal YRA from each of the subbit line groups BLG0-BLG3, and a second selector $21j$ for selecting one subbit line from the four subbit lines selected by the first selector $20j$ in accordance with the Y selection signal YRB.

The first selector $20k$ and the second selector $21k$ are included in a set of selectors YG0U-YG3U or selectors YG0L-YG3L shown in FIG. 5, and the first selector $20j$ and the second selector $21j$ are included in the other set of selectors.

To the data lines (common bit lines) between the first selector $20k$ and the second selector $21k$ and to the common bit lines between the first selector $20j$ and the second selector $21j$, reference current supplying circuits VRF0-VRF3 are coupled, respectively. In accordance with a block selection signal RFBS, these reference current supplying circuits VRF0-VRF3 supply a reference current to (extract the reference current from) the unselected memory mats.

Outputs of the second selectors 21k and 21j are coupled to a sense amplifier circuit SA. The sense amplifier circuit SA differentially amplifies a current flowing through the common bit lines selected by the second selectors 21k and 21j, in accordance with activation of a sense amplifier activating signal (sense amplifier enabling signal) SAE, and drives sense output lines (internal data read lines) Ibk and Ibj in accordance with the result of amplification. The internal read data lines Ibk and Ibj are coupled to an internal read buffer circuit, not shown, and the sense amplifier circuit output signal is further amplified, so that the amplified internal read data is transmitted to output latch circuit 6 (see FIG. 1).

In memory mats MMk and MMj, 16 sets of subbit line groups BLG0-BLG3 are provided in the information bit region, and 1 bit of memory cell is selected in each set, so that a total of 16 bits of memory cell data (information bits) are read. Similar construction is provided in the parity region, and 1 bit or 2 bits of parity bits are read simultaneously in parallel.

Figure 8:
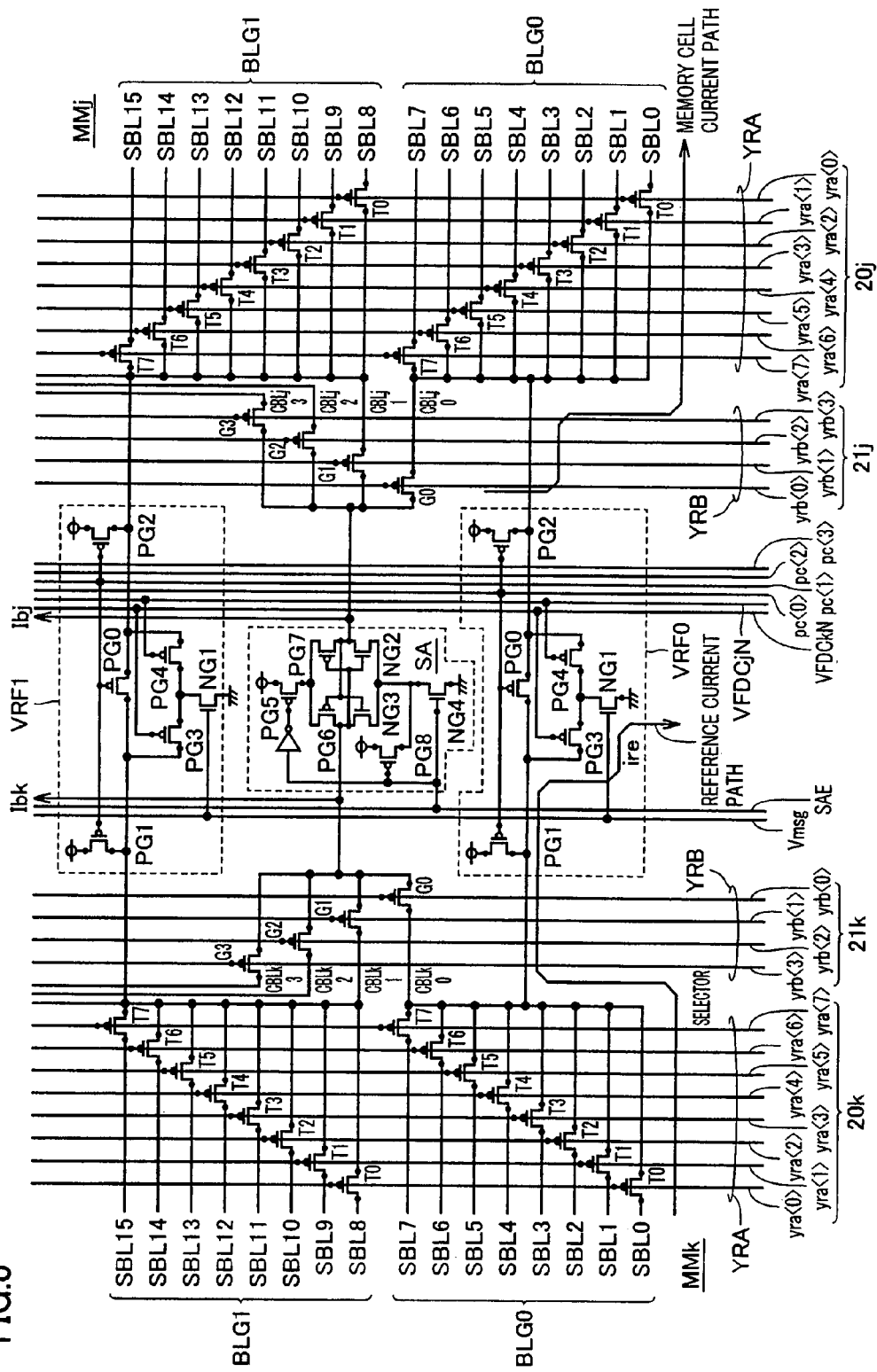
FIG. 8 schematically shows constructions of a sense amplifier, a selector and a reference current supplying circuit shown in FIG. 7.

FIG. 8 more specifically shows the configuration of the selectors, the reference current supplying circuits and the sense amplifier circuit for two subbit line groups in the internal data reading portion shown in FIG. 7. Referring to FIG. 8, in each of memory mats MMk and MMj, subbit line group BLG0 includes subbit lines SBL0-SBL7 and subbit line group BLG1 includes subbit lines SBL8-SBL15.

Each of the first selectors 20k and 20j includes subbit line selecting gates T0-T7 formed of P channel MOS transistors provided corresponding to 8 subbit lines of each subbit line group. To the subbit line selecting gates T0-T7, first Y selection signals yra <0>-yra <7> are applied, respectively. One of the first Y selection signals yra <0>-yra <7> is set to a selected state (L level), one of the subbit line selecting gates T0-T7 is set to the selected state, and the selected subbit line is coupled to the corresponding common bit line. When the Y selection signal yra <0> attains to the selected state of L level, subbit line selecting gate T0 is rendered conductive, and subbit lines SBL0 and SBL8 are coupled to common bit lines CBL0 (CBLk0, CBLj0) and CBL1 (CBLk1, CBLj1), respectively. The common bit lines are arranged corresponding to each subbit line group, and the selected subbit line of each subbit line group is coupled to the corresponding common bit line.

The first Y selection signals yra <0>-yra <7> correspond to Y selection signal YRA shown in FIG. 7.

Each of the second selectors 21k and 21j includes common bit line selecting gates G0-G3 formed of P channel MOS transistors provided corresponding to common bit lines CBL0 (CBLk0, CBLJ0)-CBL3 (CBLk3, CBLj3), respectively. To the gates of these common bit line selecting gates G0-G3, second Y selection signals yrb <0>-yrb <3> are applied, respectively. These second Y selection signals yrb <0>-yrb <3> correspond to the Y selection signal YRB shown in FIG. 7.

One of the second Y selection signals yrb <0>-yrb <3> is driven to the selected state, a corresponding one of the common bit line selecting gates G0-G3 is turned on and the corresponding one of the common bit lines CBLk0-CBLk3 and the corresponding one of common bit lines CBLj0-CBLj3 are coupled to the sense amplifier circuit SA.

Reference current supplying circuit VRF0 is coupled to common bit lines CBLk0 and CBLj0, and reference current supplying circuit VRF1 is coupled to common bit lines CBLk1 and CBLj1. Reference current supplying circuits VRF0 and VRF1 have the same construction, and corresponding components are denoted by the same reference characters.

Reference current supplying circuit VRF0 includes: P channel MOS transistors PG1 and PG2 rendered conductive in response to a precharge designating signal pc<0> and coupling common bit lines CBLk0 and CBLj0 to a power supply node when made conductive; a P channel MOS transistor PG0 isolating the common bit lines CBLk0 and CBLj0 in response to precharge designating signal pc<0>; an N channel MOS transistor NG1 receiving, at its gate, a reference voltage Vmsg; a P channel MOS transistor PG4 coupling N channel MOS transistor NG1 to common bit line CBLj in response to a reference block selection signal VFDCjN; and a P channel MOS transistor PG3 rendered conductive in response to the reference block selection signal VFDCkN and coupling N channel MOS transistor NG1 to common bit line CBLk0 when made conductive.

Similarly, reference current supplying circuit VRF1 includes: precharging P channel MOS transistors PG1 and PG2 coupling common bit lines CBLk1 and CBLj1 to a power supply node in response to a precharge designating signal pc<1>; a P channel MOS transistor PG0 isolating the common bit lines CBLk1 and CBLj1 in response to the precharge designating signal pc<1>; an N channel MOS transistor NG1 receiving, at its gate, the reference voltage Vmsg and serving as a constant current source; and P channel MOS transistors PG4 and PG3 coupling N channel MOS transistor NG1 to common bit lines CBLk1 and CBLj1 in accordance with the reference block selection signals VFDCjN and VFDCkN, respectively.

In these reference current supplying circuits VRF0 and VRF1, when the precharge designating signals pc<0> and pc<1> are at the active state of L level, common bit lines CBLk0 and CBLj0 are precharged to and equalized at the power supply voltage level, and common bit lines CBLk1 and CBLj1 are precharged to and equalized at the power supply voltage level, by P channel MOS transistors PG0-PG2. When the precharge designating signals pc<0> and pc<1> attain to the inactive state of H level, the precharging operation is finished, and the equalizing operation of the common bit lines is finished.

In data reading, one of the reference block selection signals VFDCjN and VFDCkN attains to the active state of L level. Therefore, the common bit lines are discharged through constant current source MOS transistor NG1 to the memory mat different from the memory mat including the selected memory cell, that is, the reference block. FIG. 8 shows, as an example, a state in which no memory cell is selected in memory mat MMk, through the selected subbit line selecting gate of the first selector 20k, the charging subbit line current is discharged through the reference current supplying circuit VRF0, and in memory mat MMj, the precharged current flows on the subbit line SBL through the selected memory cell.

The reference current driven by the reference current supplying circuit VRF0 or VRF1 is compared with the subbit line current driven by the memory cell, by the sense amplifier circuit SA.

The sense amplifier circuit SA includes a P channel MOS transistor PG5 and an N channel MOS transistor NG4 rendered conductive when the sense amplifier activating signal SAE is active (at H level); a P channel MOS transistor PG6 and an N channel MOS transistor NG3 connected between MOS transistors PG5 and NG4 and forming a CMOS inverter; and a P channel MOS transistor PG7 and an N channel MOS transistor NG2 connected between MOS transistors PG5 and NG4 and forming a CMOS inverter. MOS transistors PG6 and NG3 have their gates coupled to sense output line (internal data read line) Ibj, and MOS transistors PG7 and NG2 have their gates coupled to sense output line (internal data read line) Ibk.

Sense amplifier circuit SA further includes a P channel MOS transistor PG8 precharging a common source node of MOS transistors NG2 and NG3 to the level of the power supply potential, when the sense amplifier activating signal SAE is rendered inactive.

The sense amplifier circuit SA is a CMOS inverter latch circuit, and by the cross-coupled MOS transistors PG6 and PG7 and cross-coupled N channel MOS transistors NG3 and NG2, it differentially amplifies and latches the potentials of sense output lines Ibk and Ibj reflecting the difference between the memory cell current and the reference current.

Therefore, through sense output lines (internal data read lines) Ibk and Ibj, complementary differential signals are transmitted. The potentials on sense output lines Ibk and Iblj are amplified by an internal read buffer circuit, not shown, and transmitted to a read main bit line.

The current, ire, driven by reference current supplying circuits VRF0 and VRF1 is set to a current level of an intermediate value (½) between the current driven by a memory cell storing data of H level and a current driven by a memory cell storing L level. By comparing the reference current, ire, with the memory cell current Im, the data stored in the selected memory cell can be read.

Here, the correspondence between the threshold voltage of the memory cell and data of H and L levels may be appropriately defined. Specifically, the state of high threshold voltage and the state of low threshold voltage may correspond to the H level data and L level data, respectively, or vice versa. Further, the correspondence between the written (programmed) state and erased state and the state of high threshold voltage and the state of low threshold voltage may be appropriately defined, as described above.

Figure 9:
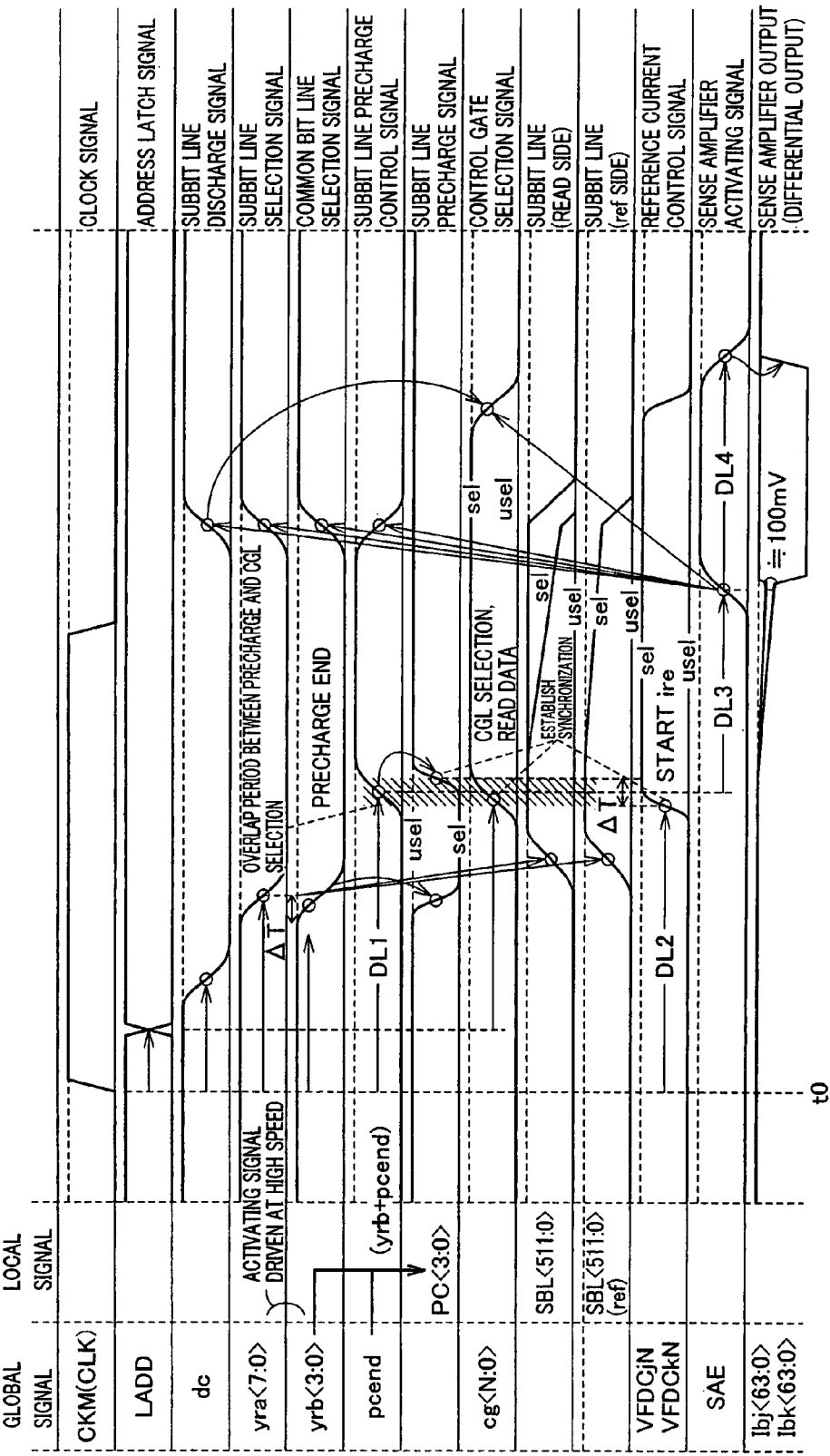
FIG. 9 is a timing diagram representing an operation of the circuits shown in FIGS. 7 and 8.

FIG. 9 is a timing diagram representing an operation of the internal data reading portion shown in FIG. 8.

The operation of the internal data reading portion shown in FIG. 8 will be described with reference to FIG. 9.

In synchronization with a rise of a main clock signal CKM (clock signal CLK), an internal address signal is generated from the address input circuit, transmitted through a predecoder to the address latch circuit, and a latch address (predecoded address) signal LADD output from the address latch circuit is made definite (see FIGS. 1 and 5).

When the main clock signal CKM rises, the address latch circuit is set in the latch state and the latched address signal LADD is made definite and settled, a subbit line discharge signal, dc, is driven to the L level, and an internal data reading cycle starts. In this state, memory cell selecting operation is not yet performed in the memory mat, the control gate signals cg <N:0> driving the control gate lines CGL are all at the L level, and the memory cells are all at the unselected state. In one memory mat, as an example, 256 control gate lines are arranged (N=255).

The precharge signals pc <3:0> are all at the H level, and reference current supplying circuits VRF0-VRF3 are all inactive. Further, the sense amplifier activating signal SAE is also at the L level, and sense amplifier circuit SA is in the inactive state, as MOS transistors PG5 and NG4 are off.

Further, subbit lines SBL <511:0> (512 subbit lines for storing information bits in one memory mat) are all at the unselected state of L level.

When the internal read cycle starts, first, by the Y decoder, one common bit line selection signal among the second Y selection signals (common bit line selection signals) yrb <3:0> is driven to the selected state (L level), and in each of the second selectors 21k and 21j, one of the common bit line selecting gates G0-G3 is set to the on state, and the sense amplifier circuit SA is coupled to the selected common bit lines.

After a prescribed time period ΔT from settlement of the common bit line selection signals yrb <3:0>, the first Y selection signals (subbit line selection signals) yra <7:0> are driven to the definite state similarly by the Y decoder. By the subbit line selection signals yra <7:0>, in the first selectors 20k and 20j, one of the subbit line selecting gates T0-T7 is rendered conductive, and corresponding subbit lines are connected to the corresponding common bit lines, respectively. To the common bit lines CBL0-CBL3, reference current supplying circuits VRF0-VRF3 are coupled, respectively. Based on the common bit line selection signals yrb <3:0> and a precharge end enable signal pcend, one of the precharge signals pc <3:0> is driven to the selected state. In FIG. 9, the selected state is denoted by "sel" and the unselected state is denoted by "usel". Consequently, the reference current supplying circuit connected to the common bit line coupled to the sense amplifier circuit is activated, the common bit line is precharged to a prescribed voltage (power supply voltage) by MOS transistors PG0-PG2, the precharge current is supplied to the selected subbit line, and the voltage level of the selected subbit line SBL increases. In this case, in each of the memory mats MMk and MMj, precharge current is supplied to the subbit line of the same position, and the potential of the selected subbit line increases to the H level. At the time of precharging operation, in the reference current supplying circuit VRF (any of VRF0-VRF3), MOS transistors PG3 and PG4 are both on, and therefore, the reference current is driven in accordance with the reference voltage Vmsg.

When the selected subbit line is precharged to a prescribed voltage level, one of the reference block selection signals VFDCjN and VFDCkN attains to the H level immediately before the start of decoding operation by the X decoder, and in the reference current supplying circuit, one of the MOS transistors PG3 and PG4 turns off, so that the common bit line of the selected memory mat is isolated from MOS transistor NG1 serving as the constant current source.

Then, X decoders 12u and 12l shown in FIG. 5 perform the decoding operation, and drive one of the control gate signals cg <N:0> to the selected state. The control gate signals cg <N:0> are transmitted to the control gate lines (CGL) to each of which memory cells are connected, and in the memory cell connected to the selected control gate line, an inversion layer is formed at a surface of the substrate region immediately below the control gate. Though memory gates are similarly driven to the selected state, the inversion layer is selectively formed below the memory gate, dependent on the stored data. In one of the memory mats MMk and MMj, the control gate line CGL is driven to the selected state and in the other memory mat, the control gates are all at the unselected state.

In synchronization with the driving of the control gate line to the selected state, the precharge end enable signal pcend attains to the H level and, in response, the precharge signal pc in the selected state (any of pc <3:0>) attains to the H level, MOS transistors PG0-PG2 turn off in the reference current supplying circuit VRF (VRF0-VRF3) corresponding to the selected common bit line, and the precharge operation is completed.

By establishing synchronization as much as possible between the timings of driving the memory cell current and driving the reference current to the subbit line, the potential difference in accordance with the reference current and the memory cell current is reliably transmitted to internal read data lines (sense output lines) Ibk and Ibj. In FIG. 9, the rise of the main clock signal CKM is used as a reference and after the delay time of DL2, the subbit line is driven by the constant current, thereafter, the control gate line is driven to the selected state, and after the delay time DL1 from the rise of the main clock signal CKM, the precharge end enable signal pcend is activated to finish the precharging operation. There is an overlapping period, ΔT, between the precharging operation of the selected subbit line and driving of the selected control gate line CGL to the selected state. Thus, erroneous reading resulting from unstable memory cell current, which may occur when the control gate line CGL is at the state of intermediate voltage level, can be prevented.

In the subbit line connected to the selected memory cell, the voltage level changes at different speed dependent on the data stored in the memory cell. FIG. 9 shows both changes in potential of the subbit line SBL in the cases of high threshold voltage and low threshold voltage. The subbit line SBL driven by the reference current is discharged by the MOS transistor NG1 serving as a constant current source, and therefore, the potential level thereof decreases gradually. The speed of change of the potential of reference subbit line SBL is intermediate between the speeds of change of the potential to the H level and to the L level, of the selected subbit line SBL to which the selected memory cell is connected.

Because of the change in potential of the selected subbit line and the reference subbit line, potential difference appears in the voltage levels of sense output lines Ibk and Ibj connected to the sense amplifier circuit, and when the difference becomes about 10 mV, the sense amplifier activating signal SAE is activated, and the potential difference between the internal read data lines (sense output lines) Ibk and Ibj is differentially amplified.

In response to activation of the sense amplifier activating signal SAE, a subbit line discharge signal dc, the subbit line selection signals yra <7:0> and the common bit line selection signals yrb <3:0> are inactivated (Y decoder is inactivated). In response, sense amplifier circuit SA is isolated from the common bit lines and subbit lines, the load thereon is alleviated, and high speed sensing operation is achieved. The sensing operation is performed on 64 bits of data (not considering parity bits), that is, data Ibj <63:0> and Ibk <63:0> in parallel, and 64 bits of data (71 bits of data including parity bits) are internally read in parallel.

After a prescribed time period from activation of the sense amplifier activating signal SAE, the X decoder is inactivated provided that the subbit line discharge signal dc is inactivated, the control gate signals cg <N:0> are inactivated, and the control gate lines are driven to the ground voltage level. As the sense amplifier has been activated, the subbit line SBL is isolated from the reference current supplying circuit, and thus, the subbit line SBL is discharged to the ground voltage level (as will be described later, there is provided a subbit line discharging transistor).

Thereafter, of the reference current control signals VFDCjN and VFDCkN, one that corresponds to the selected memory mat is driven to the inactive state, and by the transistor NG1 serving as the constant current source of the reference current supplying circuit, the common bit line is discharged to the ground voltage level.

Thereafter, the sense amplifier activating signal SAE is inactivated, and thus one data reading cycle ends.

Further, as shown in FIG. 9, in response to activation of the sense amplifier activating signal SAE, the subbit lines are driven to the unselected state, that is, the Y decoder is inactivated and the control gate line CGL is inactivated (X decoder is reset). Therefore, at the start of the next reading cycle, what is required is simply to drive the Y selection signal, that is, the subbit line selection signals yra <7:0> and the common bit line selection signals yrb <3:0> from the initial state of H level to the L level, for the selected signal. Different from the static decoding operation, it is unnecessary to drive the subbit line selection signals and the common bit line selection signals from the H level to the L level and from the L level to the H level at high speed. Therefore, the driving power of the Y decoder can be reduced (high-speed operation is required only for activation). Further, the subbit line selection signals yra <7:0> and the common bit line selection signals yrb <3:0> are not set to a multi-selection state (transition to the unselected state and transition to the selected state do not overlap), and hence, can be driven to the definite and settled state at a faster timing.

Further, as the control gate line is inactivated (X decoder is reset) in accordance with the sense amplifier activating signal SAE, the end time of the reading cycle can be made earlier, and hence, the start timing of the next reading cycle can be set faster.

Further, the predecoded address signal is latched by the address latch circuit to generate the latched address signal LADD, and when the address latch circuit enters the latching state, the latched address signal LADD has already been settled, and therefore, the skew of the latched address signal LADD can be reduced. Therefore, the decoding operation can be performed at a faster timing in the address decode circuit (X decoder and Y decoder) in accordance with the latched address signal (latched predecoded signal) LADD, so that the margin for the decoding operation can be enlarged and the reading timing can be set faster.

Figure 10:
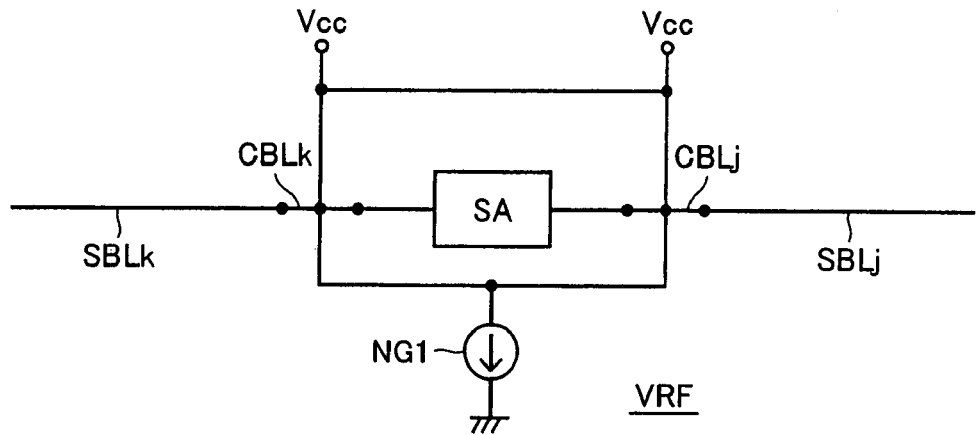
FIG. 10 schematically shows an operation of the circuit shown in FIG. 8 at the time of precharging.

FIG. 10 schematically shows a state of a portion related to the sense amplifier at the time of precharging, in a data reading. As shown in FIG. 10, at the time of precharging, the reference current supplying circuit VRF supplies the power supply voltage VCC to subbit lines SBLk and SBLj through common bit lines CBLk and CBLj, and drives a constant current by constant current source transistor NG1 (as the signals VFDCjN and VFDCkN are both at the L level). At this time, the common bit lines CBLj and CBLk are equalized (by MOS transistor PG0).

Figure 11:
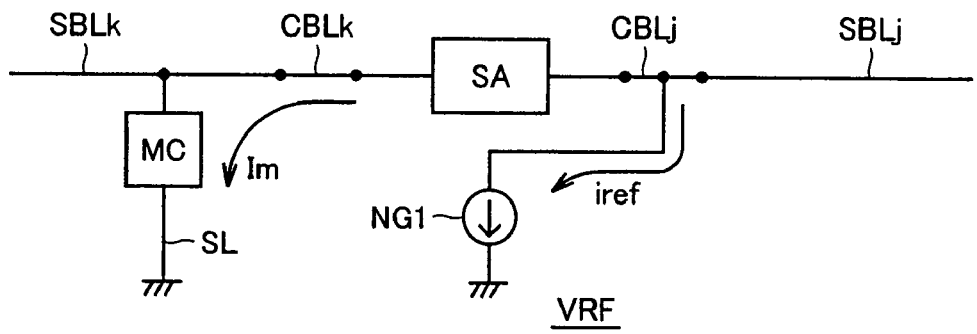
FIG. 11 schematically shows circuit connection of the circuit shown in FIG. 8 at the time of a sensing operation.

Thereafter, there is an overlap period between driving of the selected control gate line to the selected state and precharging operation of the subbit line, and then, the memory cell data is read, from the subbit line currents, as shown in FIG. 11. Here, as an example, a memory cell MC is connected to subbit line SBLk, and the memory cell current Im corresponding to the stored data is driven to the source line SL. For subbit line SBLj, the control gate line is in the unselected state, and from common bit line CBLj, the reference current iref is driven (discharged), by the constant current source transistor NG1 in the reference current supplying circuit VRF. The constant current source transistor NG1 is isolated from the common bit line CBLk. When the potential difference between the sense nodes (sense output lines Ibk and Ibj) of the sense amplifier circuit SA increases because of the difference between the memory cell current Im and the reference current iref, the sense amplifier circuit SA is isolated from common bit lines CBLk and CBLj, to perform the sensing operation.

Therefore, in the unselected subbit line groups, even when the subbit line is coupled to the common bit line by the first selector, the corresponding common bit line is simply discharged to the ground voltage level by the constant current source transistor of the reference current supplying circuit, and precharging operation is not performed (the precharge signal pc is kept at the H level). Therefore, current is not consumed in the unselected subbit line groups.

Particularly, as the decoder is reset after reading, the common bit line selection signal can be set to the initial state at the start of the next data read cycle, and the precharge signal can easily be generated based on the common bit line selection signal.

Figure 12:
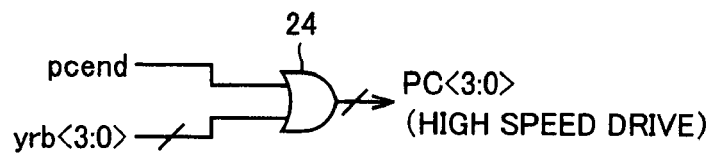
FIG. 12 schematically shows a construction of a portion generating a precharge signal, shown in FIG. 8.

FIG. 12 shows an example of the construction of a circuit for generating the precharge signals pc <3:0>.

Referring to FIG. 12, the precharge signal generating portion includes an OR circuit 24 that receives the precharge end enable signal, pcend, and the common bit line selection signals yrb <3:0>. The OR circuit 24 includes OR gates provided for respective bits of the common bit line selection signal yrb <3:0>, and generates a precharge signal pc <3:0> of 4 bits. Therefore, when the precharge end enable signal, pcend, and one of the common bit line selection signals yrb <3:0> both attain to the L level, the corresponding one of precharge signals pc <3:0> attains to the L level, and the precharge operation is executed for the selected subbit line.

In each memory mat, in accordance with the common bit line selection signals yrb <3:0> from the Y decoder and the main precharge end enable signal, pcend, the corresponding one of precharge signals pc <3:0> is generated, and therefore, in each memory mat, the precharge signal can be generated at high speed, alleviating the load on the precharge signal.

In the above described construction, using the reference current supplying circuit VRF, the reference current for the memory cell is driven. It is noted, however, that a dummy cell may be provided in the memory mat, and the reference current may be generated using such dummy cell.

As described above, according to the third embodiment of the present invention, the address decode circuit is reset by the sense amplifier activating signal SAE, so that internal reading circuitry can be recovered at high speed to the initial state. Therefore, the read cycle can be made shorter, and high-speed data reading becomes possible.

Further, the direction of signal change in the next cycle is simply in the direction to the activation state. Thus, it is unnecessary to perform both activation and inactivation of signals. Consequently, various selection signals and control signals can be reliably driven to the active state at high speed.

Further, the precharge signal is generated based on the main precharge control signal and the common bit line selection signals. Therefore, what is necessary is simply to generate the precharge signal in each memory mat. Thus, based on the common bit line selection signal in the reset state, the precharge signal can be generated accurately.

Fourth Embodiment

Figure 13:
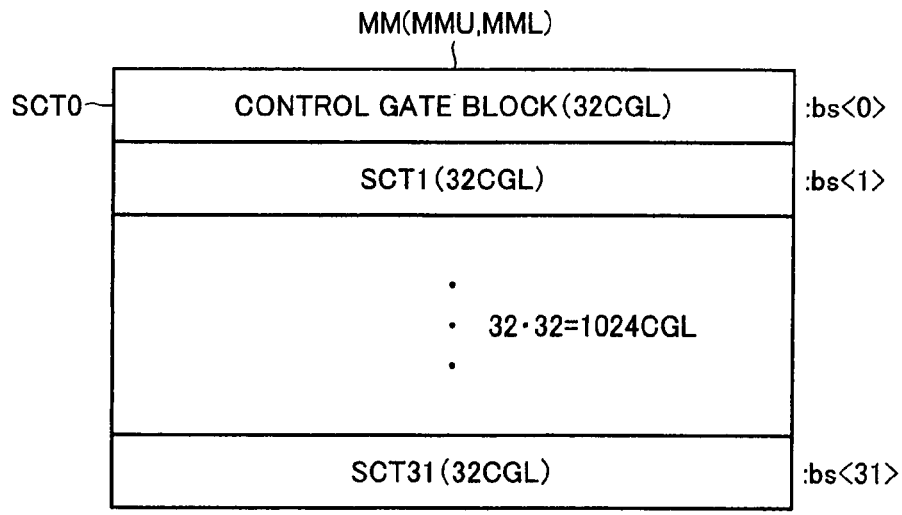
FIG. 13 schematically shows a construction of a memory mat in accordance with a fourth embodiment of the present invention.

FIG. 13 schematically shows correspondence between an output of one X decoder (12u or 12l) and the control gate lines of memory mat MM, of the non-volatile semiconductor memory device according to the present invention. Memory mat MM corresponds to one memory mat (MM0U-MM3U (MMU) and MM0L-MM3L (L)) shown in FIG. 5 described previously.

Referring to FIG. 13, by the X decoder outputs, memory mat MM is divided into control gate blocks SCT0-SCT31 each including 32 control gate lines CGL. Each of the control gate blocks SCT0-SCT31 may form one sector, and erasure may be performed in units of sectors. Control gate blocks SCT0-SCT31 are designated by the predecoded block designating signals bs <0>-bs <31>, respectively. The predecoded block designating signals bs <0>-bs <31> are generated from the X decoder (12u or 12l) shown in FIG. 5. Therefore, it follows that 1024 control gate lines are arranged on one memory mat. In a selected memory block (memory block MBA or MBB of FIG. 1), one control gate block is designated.

Figure 14:
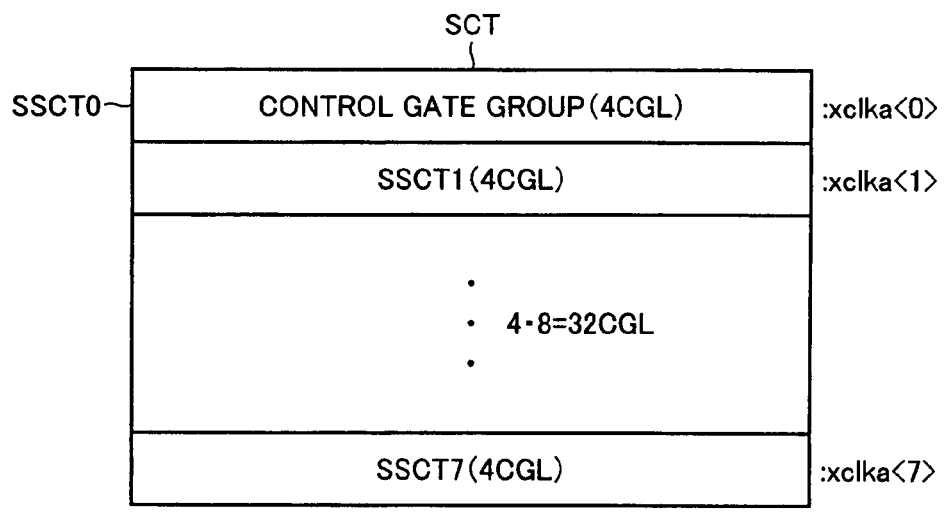
FIG. 14 schematically shows a construction of a control gate block shown in FIG. 13.

FIG. 14 shows a more detailed construction of the control gate block shown in FIG. 13. As shown in FIG. 14, control gate block SCT (one of SCT0-SCT31) is divided into control gate groups SSCT0-SSCT7 each including four control gate lines CGL. The control gate groups SSCT0-SSCT7 are specified by the predecoded signal bits xclka <0>-xclka <7>, respectively. The predecoded signal bits xclka <0>-xclka <7> are applied from the address latch circuit shown in FIG. 5, namely, they are the predecoded signal bits generated from predecoder 3 (3A or 3B) shown in FIG. 1. The control gate group SCCT includes four control gate lines CGL, and one control gate block includes 8 control gate groups, and therefore, 32 control gate lines CGL are included in total in one control gate block.

As will be described later, a memory mat corresponding to one sense amplifier band (sense amplifiers) includes 8 control gate blocks. Therefore, in a memory mat corresponding to one sense amplifier band, there are 256 control gate lines CGL. The control gate lines are shared by memory cells aligned along the column direction (word line extending direction), in one memory block.

Figure 15:
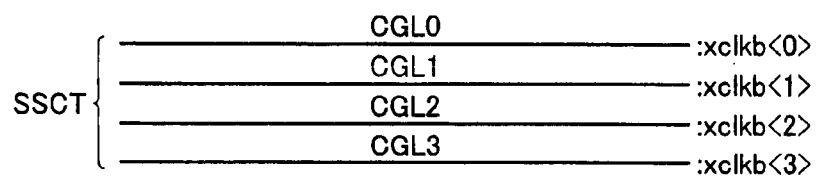
FIG. 15 schematically shows a construction of a control gate group shown in FIG. 14.

FIG. 15 shows a detailed construction of the control gate group shown in FIG. 14. Each control gate group SSCT (one of SSCT0-SSCT7) includes four control gate lines CGL0-CGL3. The control gate lines CGL0-CGL3 are specified by the predecoded signal bits xclkb <0>-xclkb <3>, respectively. The predecoded signal bits xclkb <0>-xclkb <3> are also the predecoded signal bits applied from address latch circuit 4 shown in FIG. 5.

As shown in FIGS. 13 to 15, in the selected memory block, in accordance with the combination of predecode block designating signal bits bs <0:31> and predecoded signal bits xclka <0:7> and xclkb <0:3>, one control gate line CGL is driven to the selected state, in accordance with the output signals from X decoder.

Figure 16:
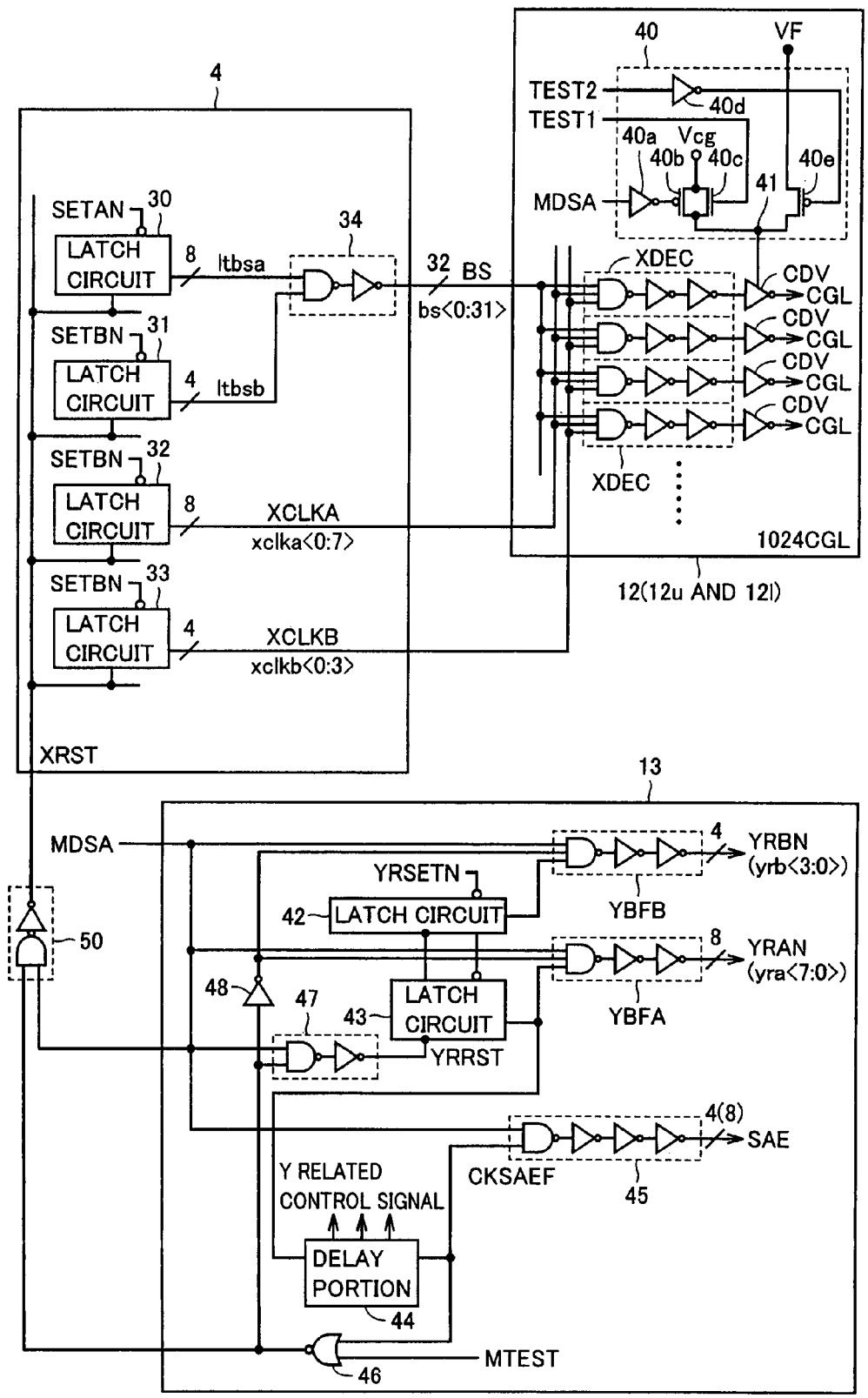
FIG. 16 shows an example of a specific construction of an address latch circuit and an address decode circuit in accordance with the fourth embodiment of the present invention.

FIG. 16 schematically shows constructions of the address latch circuit and the decode circuit in accordance with the fourth embodiment of the present invention. FIG. 16 shows address latch circuit 4, X decoder 12 and Y decoder 13 that are provided for one memory block (MB). X decoder 12 corresponds to the construction shown in FIG. 5 that includes X decoders 12u and 12l.

Address latch circuit 4 includes a latch circuit 30 for latching an 8-bit predecoded signal from the predecoder in accordance with a set designating signal SETAN and outputting an 8-bit latch predecoded signal ltbsa; a latch circuit 31 for latching the predecoded signal from the predecoder in accordance with a set designating signal SETBN and outputting a 4-bit latch predecoded signal ltbsb; a latch circuit 32 for latching the predecoded signal from the predecoder in accordance with the set designating signal SETBN and outputting an 8-bit latch predecoded signal XCLKA; a latch circuit 33 for latching the predecoded signal of 4 bits from the predecoder in accordance with the latch designating signal SETBN and outputting a 4-bit latch predecoded signal XCLKB; and a block decode circuit 34 for decoding the latch predecoded signals ltbsa and ltbsb and driving a control gate block designating signal BS of 32 bits.

The set designating signals SETAN and SETBN are activated when the corresponding memory block is selected, and latch the predecoded signal applied from the predecoder. The set designating signals SETAN and SETBN are generated, therefore, based on the address latch timing signal and the block address signal predecoded by the predecoder.

The latch predecoded signals XCLKA and XCLKB correspond to the predecoded signal bits xclka <0:7> and- xclkb <0:3>, respectively. Block decode circuit 34 is formed of an AND type decode circuit, and generates, from the 8-bit latch predecoded signal ltbsa and the 4-bit latch predecoded signal ltbsb, the control gate block signal BS (control gate block designating signals bs <0:31>) that designates one control gate block among 32 control gate blocks.

To latch circuits 30-33, X address reset signal XRST is applied. When the reset signal XRST is active (H level), the contents held by the latch circuits 30-33 are reset to the initial state (unselected state).

In latch circuits 30-33, when in a set state, a corresponding one of the predecoded signal bits is set to the active state when selected in accordance with the output signal from the predecoder, and the remaining bits are kept at the unselected state.

X decoder 12 (X decoder 12u and 12l of FIG. 5) includes: a control gate power supply circuit 40; an X unit decode circuit XDEC receiving 1 bit from each of the control gate block designating signals bs <0:31> and the predecode signals xclka <0:7> and xclkb <0:3>; and a control gate drive circuit CDV provided corresponding to each unit decode circuit XDEC, receiving the power supply from control gate power supply circuit 40 as an operational power supply voltage, and driving the corresponding control gate line CGL in accordance with an output signal from the corresponding X unit decode circuit XDEC.

The X unit decode circuit XDEC and the control gate drive circuit CDV are arranged for the control gate line CGL provided in the corresponding memory block.

The control gate block designating signal BS designates one of 32 control gate blocks, and by the predecoded signals xclka and xclkb, one control gate group and a control gate are designated. Therefore, in X decoder 12, 32×32=1024 X unit decode circuits are provided, and one of 1024 control gate lines CGL is driven to the selected state.

Control gate power supply circuit 40 includes: an N channel MOS transistor 40c for transmitting a control gate voltage Vcg to a power supply node 41 in accordance with a test mode designating signal TEST1; an inverter 40a receiving a data read mode designating signal MDSA; a P channel MOS transistor 40b for transmitting the control gate voltage Vcg to power supply node 41 in accordance with an output signal from inverter 40a; an inverter 40d receiving a test mode designating signal TEST2; and a P channel MOS transistor 40e for transmitting a test voltage VF to power supply node 41 in accordance with an output signal from inverter 40d.

In the read mode, in accordance with the data read mode designating signal MDSA, the control gate voltage Vcg is supplied to the control gate line drive circuit CDV through P channel MOS transistor 40b. In the test mode, in accordance with the test mode designating signal TEST1, a voltage of Vcg-Vth is transmitted to the control gate line drive circuit CDV. Here, Vth represents threshold voltage of MOS transistor 40c. When the test mode designating signal TEST1 is activated, the read mode designating signal MDSA is at the inactive state of L level, and internal data reading is stopped (column selecting operation is stopped).

When the test mode designating signal TEST2 is activated, the test voltage VF is supplied as an operational power supply voltage to control gate drive circuit CDV. By changing the voltage VF, the margin for the control gate voltage, for example, in the write mode is measured.

Y decoder 13 includes: a latch circuit 42 for latching a 4-bit predecoded signal from the predecoder in response to activation of a set designating signal YRSETN; an inversion buffer circuit YBFB for generating, when activated, a 4-bit Y selection signal (common bit line selection signal) YRBN (yrb <0:3>) in accordance with a latch predecoded signal outputted from latch circuit 42; a latch circuit 43 for latching the predecoded signal from the predecoder in response to activation of the set designating signal YRSETN; an inversion buffer circuit YBFA for outputting, when activated, a Y selection signal (subbit line selection signal) YRAN (yra <0:7>) in accordance with a latch predecoded signal from latch circuit 43; a delay portion 44 for generating a Y related control signal controlling various operations related to column selection (Y related circuitry operation) in accordance with transition of the output signal from latch circuit 43; a buffer circuit 45 for outputting a sense amplifier activating signal SAE in accordance with an output signal CKSAEF of delay portion 44 and the read mode designating signal MDSA; an NOR gate 46 receiving the output signal CKSAEF of delay portion 44 and the test mode designating signal MTEST; an inverter 48 receiving an output signal of NOR gate 46; and a buffer circuit 50 receiving an output signal of NOR gate 46 and the read mode designating signal MDSA and outputting an X address reset signal XRST.

Inversion buffer circuits YBFA and YBFB are both activated when the output signal from inverter 48 is at the H level and the read mode designating signal MDSA is at the active state of H level, invert the latch predecoded signal from corresponding latch circuits 43 and 42, and output the Y selection signals YRAN and YRBN.

The test mode designating signal MTEST is set to the H level when the test mode is designated in the non-volatile semiconductor memory device, the output signal of NOR gate 46 is fixed to the L level and, in response, the X address reset signal XRST is fixed to the L level.

Y decoder 13 further includes an AND circuit 47 receiving an output signal of NOR gate 46 and the read mode designating signal MDSA and outputting a reset signal YRRST. When the output signal YRRST of AND circuit 47 attains to the H level, latch circuits 42 and 43 are reset. Accordingly, when the test mode designating signal MTEST is at the active state, the reset signal YRRST for the latch circuits 42 and 43 are fixed to the L level. Therefore, in a test operation, when one control gate line is to be continuously kept at the selected state, or when switching of memory cell selection/unselection is to be performed in synchronization with the clock signal, activation of the reset signals XRST and YRRST in response to activation of the sense amplifier is inhibited.

Figure 17:
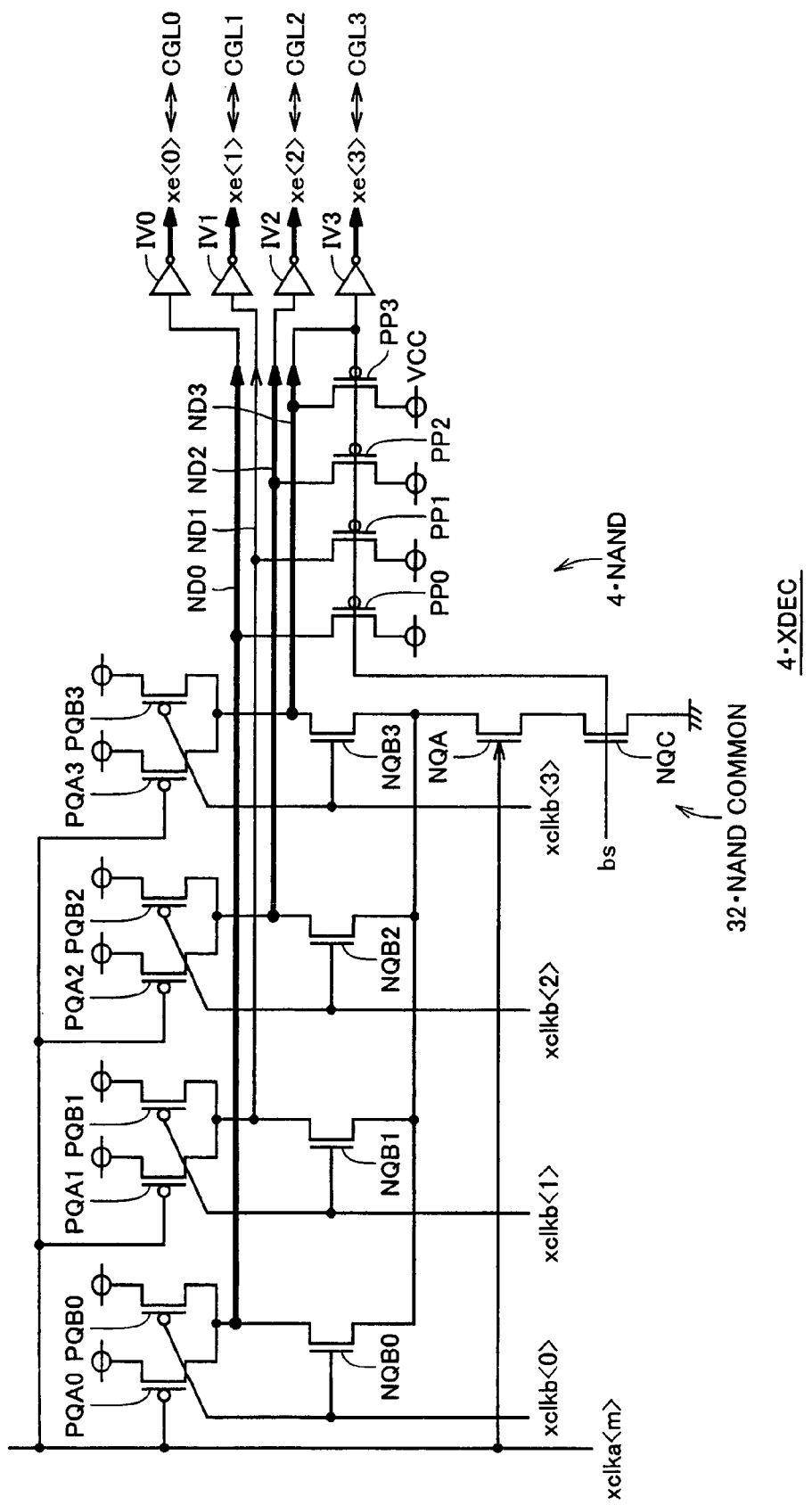
FIG. 17 more specifically shows the configuration of the X decoder shown in FIG. 16.

FIG. 17 shows a specific construction of a portion of four X unit decode circuits of the X decoder shown in FIG. 16. Referring to FIG. 17, the X decode circuit (four X unit decode circuits) includes: P channel MOS transistors PQA0-PQA3 connected to output nodes ND0-ND3, respectively, and commonly receiving, at their gates, a predecode signal xclka <m>; P channel MOS transistors PQB0-PQB3 connected to output nodes ND0-ND3, respectively, and receiving, at their gates, the predecode signals xclkb <0>-xclkb <3>, respectively; N channel MOS transistors NQB0-NQB3 connected to output nodes ND0-ND3, respectively, and receiving, at their respective gates, the predecode signals xclkb <0>-xclkb <3>; an N channel MOS transistor NQA connected commonly to MOS transistors NQB0-NQB—and receiving, at its gate, the predecode signal xclka <m>; an N channel MOS transistor NQC coupled to MOS transistor NQA and to a ground node, and receiving, at its gate, a predecoded block designating signal bs for selecting a control gate block; P channel MOS transistors PP0-PP3 provided for output nodes ND0-ND3, respectively, and commonly receiving, at their gates, the predecoded block designating signal bs for selecting a control gate block; and inverter drivers IV0-IV3 provided for output nodes ND0-ND3, respectively.

In accordance with the output signals xe <0>-xe <3> of inverter drivers IV0-IV3, control gate lines CGL0-CGL3 are driven to the selected or unselected state.

MOS transistor NQC is provided commonly to 32 X unit decode circuits receiving the predecode block designating signal bs. MOS transistor NQA is provided commonly to 8 unit X decode circuits arranged corresponding to 8 control gate lines included in the control gate block.

When the predecoded block designating signal bs for designating a control gate block is in the unselected state, the output nodes ND0-ND3 are precharged and maintained at the power supply voltage level by MOS transistors PP0-PP3. Further, as the MOS transistor NQC is off and the discharge path of output nodes ND0-ND3 is shut off, the output signals xe <0>-xe <3> of inverter drivers IV0-IV3 all attain to the L level. Therefore, when the control gate block shown in FIG. 13 is in the unselected state, the control gate driving signals for 32 control gate lines CGL included therein are all kept at the inactive state of L level.

When the predecoded block designating signal bs attains to the selected state of H level, MOS transistor NQC turns on and MOS transistors PP0-PP3 are kept off.

When the predecoded signal bit xclka <m> is at the L level, MOS transistor NQA turns off and MOS transistors PQA0-PQA3 turn on, output nodes ND0-ND3 are kept at the power supply voltage level, and corresponding control gate lines CGL0-CGL3 are set to the unselected state. Therefore, even when control gate block SCT (any of SCT0-SCT31) shown in FIG. 13 is selected, the corresponding control gate lines CGL0-CGL3 are kept unselected, as long as the control gate group SSCT (any of SSCT0-SSCT7) shown in FIG. 14 is in the unselected state.

When the predecoded block designating signal bs and the predecoded signal bit xclka <m> are set to the selected state, MOS transistors NQC and NQA turn on and MOS transistors PQA0-PQA3 and PP0-PP3 are all kept off. In this case, one of the predecoded signal bits xclakb <0>-xclkb <3> attains to the selected state of H level, and a corresponding one of output nodes ND0-ND3 is driven to the ground voltage level. In response, the corresponding one of the output xes <0>-xe <3> of inverter drivers IV0-IV3 is driven to the H level, and one of the four control gate lines of the corresponding control gate group SSCT is driven to the selected state.

As shown in FIG. 17, in the X decoder, MOS transistor NQC selecting a control gate block is arranged common to 32 X unit decode circuits provided for the control gate block, and MOS transistor NQA is arranged common to 8 X unit decode circuits included in the control gate group, whereby the number of elements forming the X decoder circuit can be reduced and power consumption can be reduced. Further, load on the predecoded signals bs and xclkb <m> can be alleviated (associated gate capacitance is small), and therefore, decoding operation can be performed at high speed in accordance with the predecoded signal.

Figure 18:
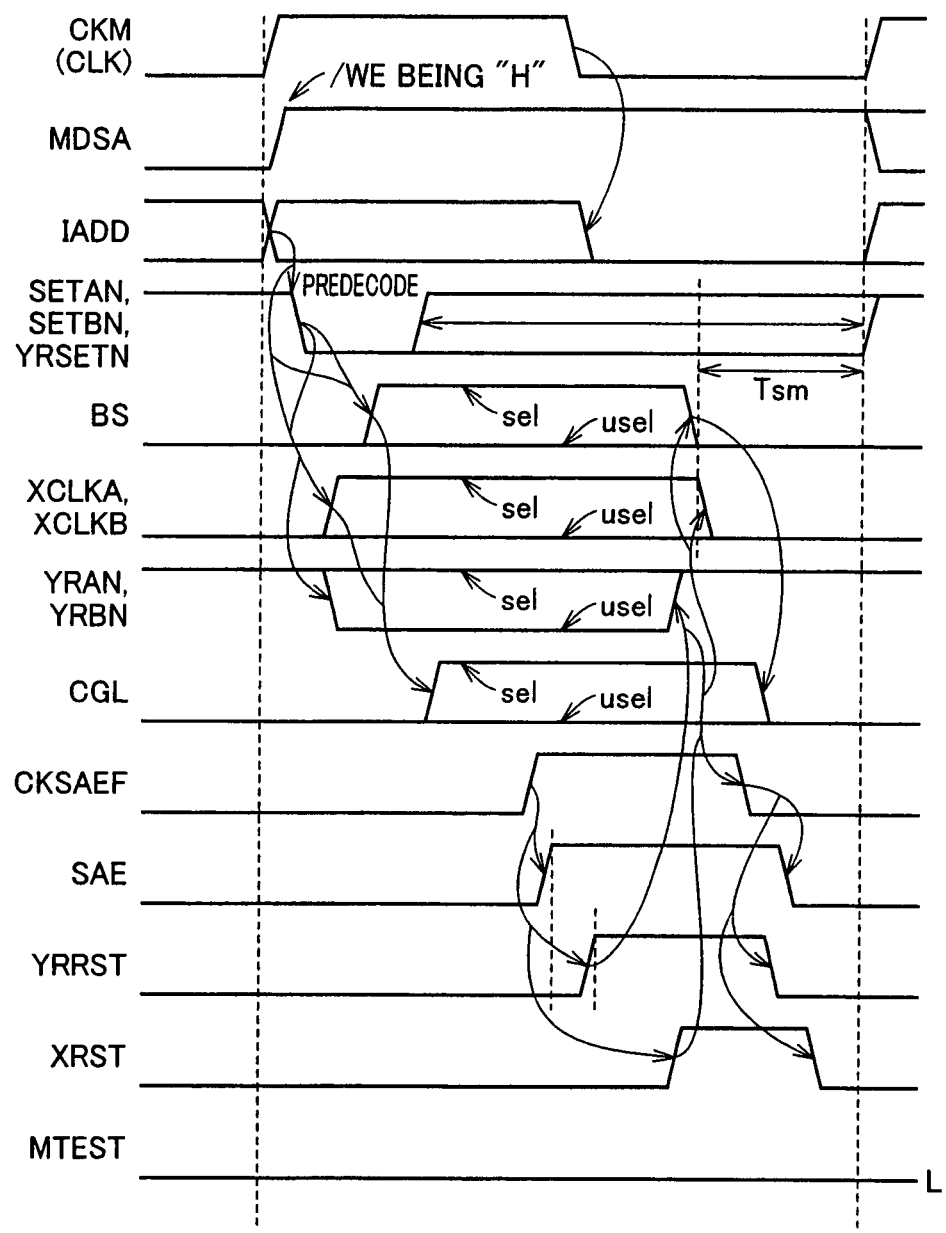
FIG. 18 is a timing diagram representing an operation of the circuit shown in FIG. 16.

FIG. 18 is a timing diagram representing operations of address latch circuit 4, X decoder 12 and Y decoder 13 shown in FIG. 16. The operations of the circuits shown in FIG. 16 will be described with reference to FIG. 18.

In response to a rise of the clock signal CKM (CLK), the internal address signal IADD is output from the address input circuit. When a command (write enable signal) designates a data read mode before the rise of clock signal CLM, the read mode designating signal MDSA attains to the H level.

When the internal address signal IADD is predecoded by a predecoder, the latch designating signals SETAN and SETBN as well as YRFSTN for the selected memory block (MBA or MBB) attain to the active state of L level. In response, latch circuits 30-33 and 42 and 43 attain to the latching state, latching the predecoded signal applied from the predecoder.

In address latch circuit 4, by X address decode circuit 34, the predecoded block selection signal BS (bs <0:31>) is output, and the latch predecoded signals btbsb, XCLKA and XCLKB output from latch circuits 31-33 attain to the definite state. These predecode signals are at the H level in the selected state (sel) and L level in the unselected state (usel).

In Y decoder 13, as the signal MDSA and the output signal of inverter 48 are at the H level, inversion buffer circuits YBFA and YBFB buffer (invert the logic of) the output signals from latch circuits 43 and 42, and output the Y selection signals YRAN and YRBN. The subbit line selection signal YRAN (yra <0:7>) and the common bit line selection signal YRBN (yrb <0:3>) are at the L level in the selected state and at the H level in the unselected state. In accordance with the buffered predecoded signals YRAN and YRBN, a subbit line is selected and coupled to a corresponding sense amplifier. Further, in accordance with these signals BS, XCLKA and XCLKB, a control gate line CGL is driven to the selected state.

In accordance with the change in the output signal of latch circuit 43, delay portion 44 successively activates/inactivates the Y related control signals, charging/discharging the sub bit line. Then, when the signal CKSAEF from delay portion 44 is activated, the sense amplifier activating signal SAE from buffer circuit 45 is driven to the active state, and a sensing operation is performed. When the output signal CKSAEF of delay portion 44 attains to the H level, the output signal of NOR gate 46 attains to the H level. As the read mode designating signal MDSA is at the H level, the output signal YRRST of buffer circuit 47 attains to the H level, latch circuits 42 and 43 are reset, the latch predecoded signals are returned to the initial state of unselected state, and accordingly, the signals YRAN and YRBN are also driven to the unselected state.

Further, in accordance with an output signal from NOR gate 46, the X address reset signal XRST from buffer circuit 50 attains to the H level, latch circuits 30-33 are reset, and the latched predecoded signals are returned to the initial state. In accordance with the activation of the X address reset signal XRST, the signals BS, XCLKA and XCLKB are set to the unselected state, and in response, control gate line CGL is driven to the unselected state.

When the output signal CKSAEF of delay portion 44 is driven to the inactive state as Y decoder 13 is reset, the sense amplifier activating signal SAE is inactivated in response, and the reset signals YRRST and XRST are both inactivated.

In this data reading, after activation of the sense amplifier, the predecoded signals latched by latch circuits 30-33, 42 and 43 are reset, and therefore, the time Tsm until the next read cycle can be made longer, the data reading process of the next cycle can be started at a faster timing, and high-speed reading becomes possible.

Further, not only the latch circuits but also the Y selection signals YRAN and YRBN are reset. Therefore, even in such a situation that only resetting of the predecoded signals of latch circuits would cause any delay of resetting operation because of gate propagation delay in decode circuits and others of the succeeding stage, the output signal of the Y decoder can be reset quickly, and similarly, at the start of the next cycle, the internal state can reliably be returned to the initial state (inactive state).

In the construction described above, the reset signal is not applied to the X unit decoder circuit XDEC driving the control gate line CGL. The X address reset signal XRST may be applied also to the unit X decoder XDEC. In this case also, the timing of inactivating control gate line CGL can be made faster and therefore, the reading operation can surely be started earlier in the next cycle.

Figure 19:
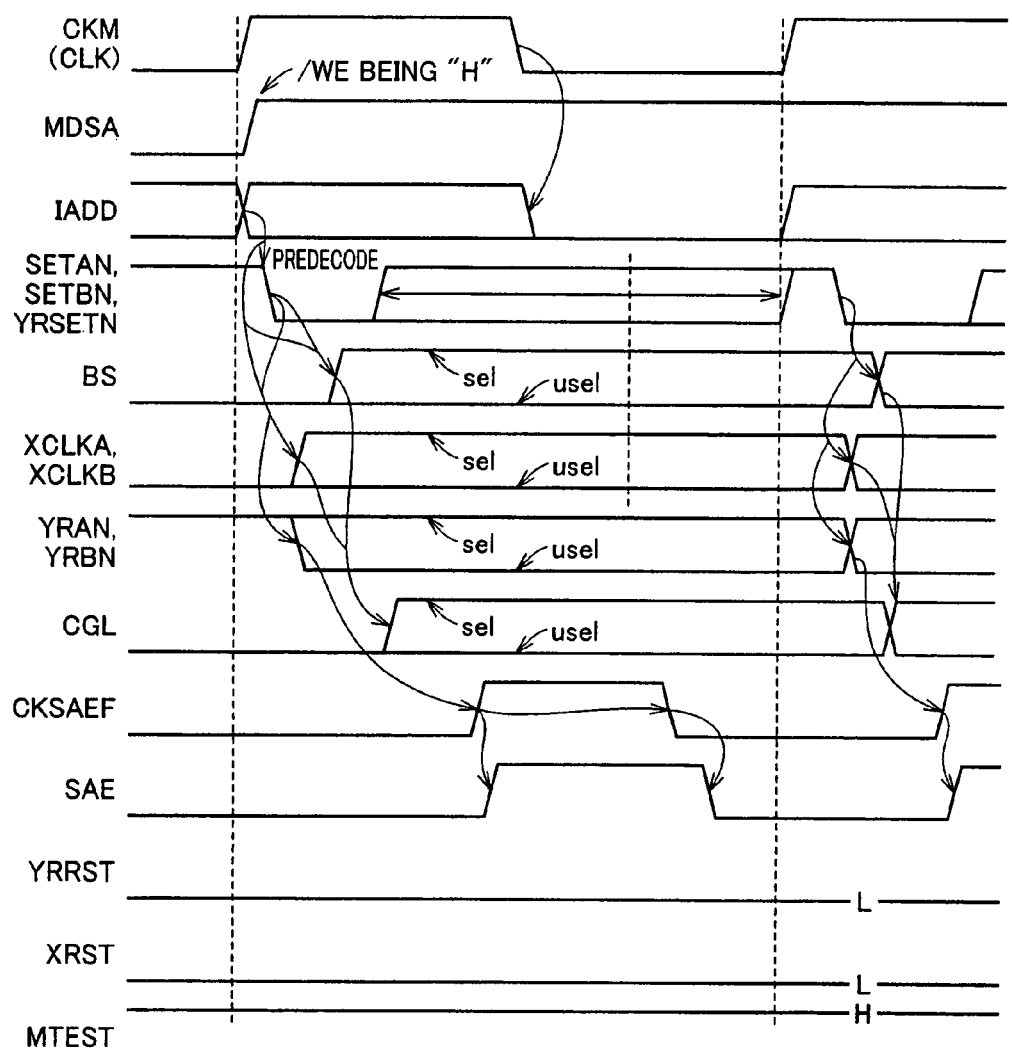
FIG. 19 is a diagram of signal waveforms showing timings in a test operation of the circuit shown in FIG. 17.

FIG. 19 is a signal waveform diagram representing an operation in the case when the test mode designating signal MTEST shown in FIG. 16 is set to the H level. When the test mode designating signal MTEST is set to the H level, the output signal of NOR gate 46 shown in FIG. 16 is fixed at the L level, and in response, the output signals of AND circuits 47 and 50 are fixed to the L level. The output signal of inverter 48 is kept at the H level.

As shown in FIG. 19, in accordance with the internal address signal LADD, the predecoded signals XCLKA and XCLKB change, and the predecoded block designating signal BS (bs) for designating a control gate block also changes in accordance with the latched internal address signal. After the control gate CGL is driven to the selected state (sel), the reset control signal CKSAEF is driven to the active state by delay portion 44, and thereafter, the sense amplifier activating signal SAE is activated. After a prescribed time period, the reset signal CKSAEF from delay portion 44 attains to the L level and the sense amplifier activating signal SAE is inactivated.

Even when the reset control signal CKSAEF is generated (activated) from delay portion 44, the reset signals XRST and YRRST are fixed at the L level, and therefore, the states of selected control gate line CGL and selected subbit line do not change.

In the next cycle, when the internal address signal IADD changes, again, the control gate block designating signal BS (bs) and the predecode signals XCLKA, XCLKB, YRAN and YRBN change in accordance with the new internal address signal. In accordance with such signal changes, the control gate line CGL is changed, and the selected subbit line is changed.

Therefore, when the test mode designating signal MTEST is set to the H level, the control gate line and the subbit line selection signal are switched in accordance with the internal address signal latched in accordance with the clock signal CKM (CLK). Therefore, it becomes possible to test the margin for the internal operation for the cycle time of main clock signal CKM.

When the internal address signal is latched and then, the clock signal CLM (CLK) is kept at the L level, the internal state is kept unchanged, and therefore, a control gate line CGL can be continuously maintained at the selected state, and therefore, a voltage stress acceleration test, for example, can be performed.

Thus, when the activation of reset signals YRST and XRST is inhibited using the test mode designating signal MTEST, it is possible to inhibit resetting of the control gate line selection signal and the subbit line selection signal in one read cycle. The test mode designating signal MTEST is generated from an internal control circuit such as a sequence controller (CPU), not shown, in accordance with an external command. Specific functions of the test mode designating signal MTEST will be described in detail later. Here, it is described simply as a signal for setting the test mode.

As described above, according to the fourth embodiment, the address latch circuit and the Y decode circuit are configured to be reset internally in the data read cycle, so that the internal state can be returned to the initial state with sufficient margin with respect to the next read cycle, and therefore, the next read cycle can be started at a faster timing.

Further, by inhibiting the reset operation in the test mode, the control gate line and the subbit line can be selected in a static manner, in accordance with an address signal applied in synchronization with the clock signal.

Fifth Embodiment

Figure 20:
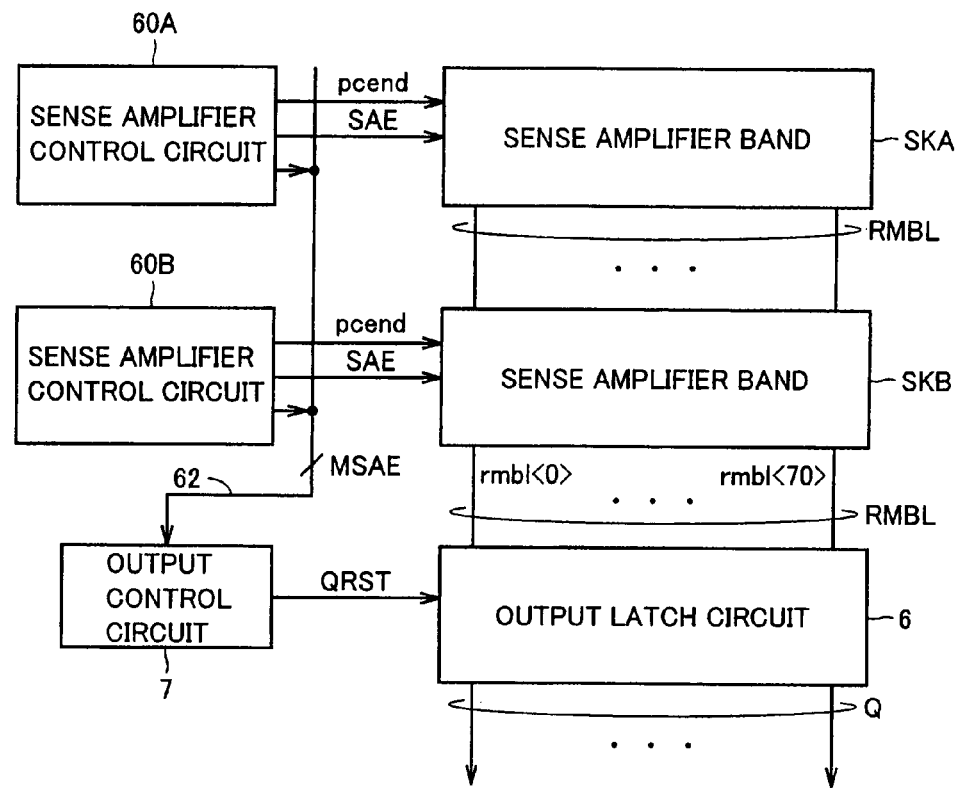
FIG. 20 schematically shows a construction of a main portion of a non-volatile semiconductor memory device in accordance with a fifth embodiment of the present invention.

FIG. 20 schematically shows a construction of a data reading portion according to the fifth embodiment of the present invention. Referring to FIG. 20, corresponding to memory blocks (A and MBB), sense amplifier bands SKA and SKB are arranged, respectively. The sense amplifier bands SKA and SKB each include sense amplifiers SK0-SB3 shown in FIG. 5. As will be described in detail later, one memory block is divided into four trains of memory mats, and two trains of sense amplifiers are arranged. Here, the propagation time of internal read data will be discussed, and therefore, a construction in which a sense amplifier band is arranged for each memory block is shown as a representative example.

A read main bit line group RMBL is arranged common to sense amplifier bands SKA and SKB, and the data amplified by sense amplifier circuits in sense amplifier band SKA or SKB are transmitted through main bit line group RMBL to output latch circuit 6. By way of example, the read main bit line group RMBL includes, for transmitting 64-bit data and 7-bit ECC code in parallel, read main bit lines rmbl <0>-rmbl <70> of 71 bits.

Sense amplifier bands SKA and SKB have their subbit line precharge/equalize and sensing operations controlled in accordance with a precharge end enable signal, pcend, and the sense amplifier activating signal SAE applied from sense amplifier control circuits 60A and 60B, respectively. Sense amplifier control circuits 60A and 60B also generate a monitor signal MSAE in synchronization with the sense amplifier activating signal SAE and transmit the monitor signal MSAE to output control circuit 7, through a monitor signal line 62. Monitor signal line 62 has the same load as read main bit line RMBL, and the monitor signal MSAE reflects the state of propagation of the internal read data to output latch circuit 6.

In accordance with the monitor signal MSAE, output control circuit 7 outputs an output reset signal QRST including a buffer reset signal, rstqbn, and a main bit line precharge designating signal, mblpcn, for resetting output latch circuit 6. Consequently, even if the propagation time of internal read data varies dependent on the position of the selected memory cell (dependent on the position of the activated sense amplifier band), the operation of output latch circuit 6 can be controlled accurately in accordance with the state of propagation of the internal read data.

Figure 21:
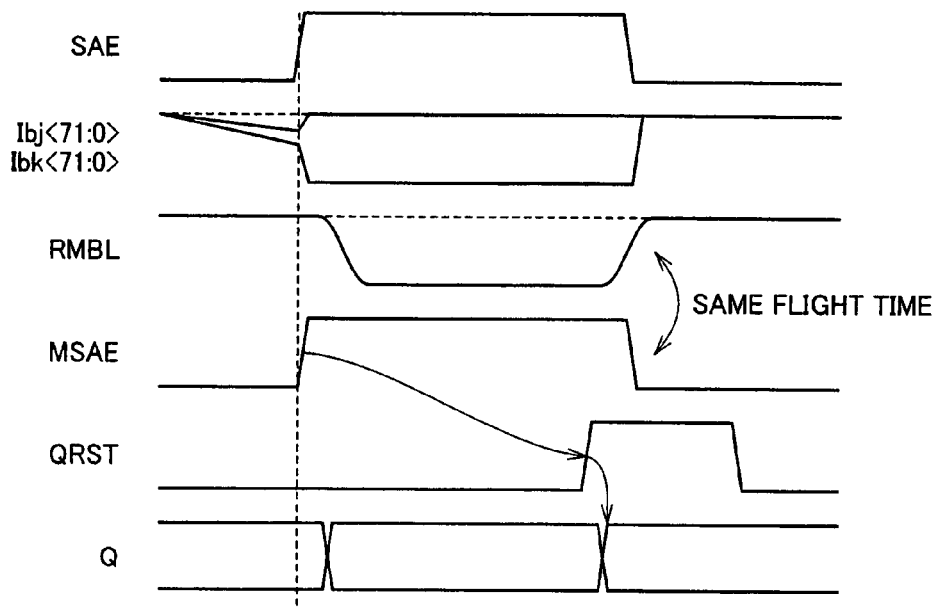
FIG. 21 is a timing diagram representing an operation of the circuit arrangement shown in FIG. 20.

FIG. 21 schematically shows an operation of the internal data reading portion shown in FIG. 20. In the following, an operation of the internal data reading portion shown in FIG. 20 will be described with reference to FIG. 21.

Sense amplifier control circuit 60A or 60B activates the sense amplifier activating signal SAE, to activate the sense amplifier circuit of the corresponding sense amplifier band SKA or SKB. In the activated sense amplifier band SKA or SKB, the sense amplifier circuits perform a sensing operation, amplifying the data read from the memory cells. Based on the amplified data, the read main bit line group RMBL is driven, so that its potential changes. To the read main bit line group RMBL, differential signals reflecting the outputs of the sense amplifier circuits are transmitted, as will be described later.

In synchronization with activation of the sense amplifier activating signal SAE, the monitor signal MSAE is generated (activated) from sense amplifier control circuit 60A or 60B and outputted to monitor signal line 62. After a prescribed time period from activation of the transmitted monitor signal MSAE, output control circuit 7 activates the reset signal QRST, and the latch data of output latch circuit 6 is reset.

The monitor signal line 62 has the same signal propagation time as the data propagation time of sense output line (Ibk, Ibj) as the internal read data transmission line and of the read main bit line group RMBL. The monitor signal MSAE and the sense amplifier activating signal SAE are output from the same circuit. Therefore, the monitor signal MSAE and the internal read data sensed and amplified by the sense amplifier circuit and transmitted on read main bit line group RMBL have substantially the same flight time. Therefore, output control circuit 7 can accurately monitor the state of propagation of the internal read data, using the monitor signal MSAE. By controlling the operation of output latch circuit 6 based on the monitor signal MSAE, it becomes possible to drive the output latch circuit 6 to the reset state accurately, after the read data is latched in output latch circuit 6 and the internal data is transferred to the ECC circuit.

Specifically, dependent on the position of the selected memory block, propagation time of the internal read data to output latch circuit 6 varies. Therefore, if the circuit were reset at a faster timing, the internal read data would be reset and inverted before it reaches and latched by output latch circuit 6. However, by using the monitor signal MSAE, the margin for the reset timing of each data transfer can be ensured, and thus, undesired inversion of the read data caused by resetting of the output latch circuit 6 during data reading can be prevented.

More specifically, the distance between output latch circuit 6 and sense amplifier band SKA or SKB is different, and therefore, the time necessary for the read data from the selected memory block (or sense amplifier column) to reach the output latch circuit 6 is different. When resetting of output latch circuit 6 is controlled by using the monitor signal MSAE, the data holding time can be made constant, regardless of the position of the selected memory block, in output latch circuit 6.

By the resetting operation in accordance with the state of internal data reading of output latch circuit 6, the data holding period of time and the margin for the reset timing of output latch circuit 6 can be made constant, regardless of the position of the selected memory block, whereby accurate data reading becomes possible. Further, by the resetting of the read main bit line and output latch circuit 6, the internal state can be returned to the initial state at a fast timing for the next read cycle, to be ready for the next reading operation.

Figure 22:
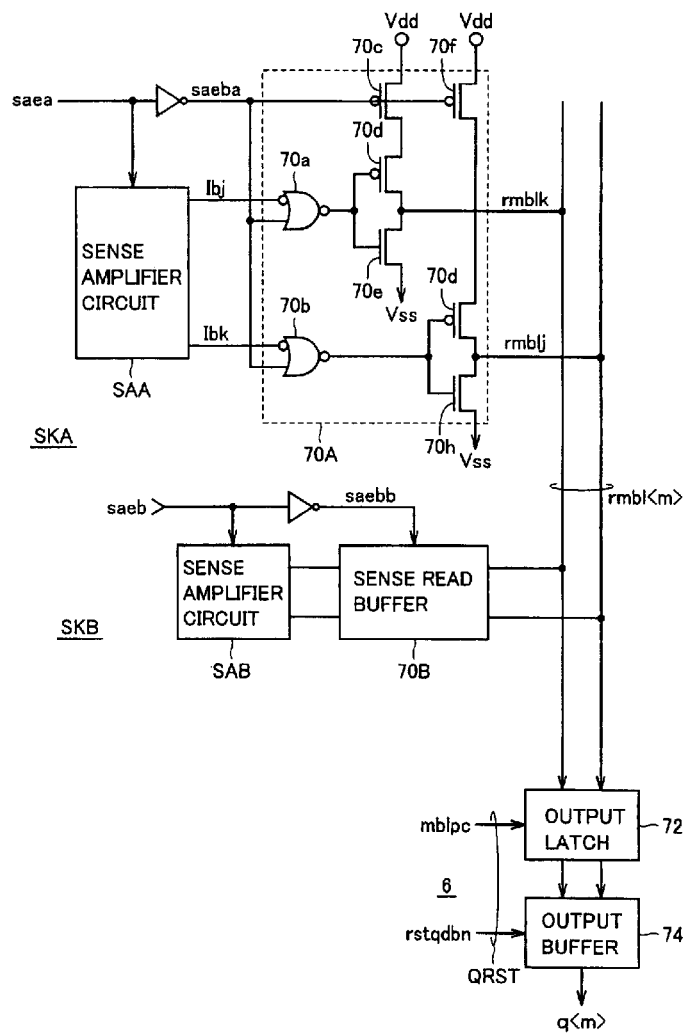
FIG. 22 schematically shows a construction of an internal data transmitting portion of the non-volatile semiconductor memory device in accordance with the fifth embodiment of the present invention.

FIG. 22 specifically shows a construction of a portion related to 1 bit data reading of the internal data reading portion shown in FIG. 20. In sense amplifier band SKA, there are provided a sense amplifier SAA and a read buffer 70A driving read main bit lines rmblk and rmblj in accordance with output signal lines (sense output lines) Ibj and Ibk of the sense amplifier SAA.

In sense amplifier band SKB, there are provided a sense amplifier SAB, and a read buffer 70B driving read main bit lines rmblk and rmblj in accordance with an output signal from sense amplifier SAB. Read main bit lines rmblk and rmblj form the read main bit line rmbl <m>, and transmit complementary data.

Output latch circuit 6 includes an output latch 72 latching the internal read data on read main bit line rmbl <m>, and output buffer 74 generating a single end internal output data q <m> from output latch 72.

The reset signal QRST includes a read main bit line precharge signal mblpc applied to output latch 72, and a buffer reset signal rstqdbn applied to output buffer 74.

Read buffers 70A and 70B have the same construction, and therefore, only the specific construction of read buffer 70A is shown in FIG. 22.

Read buffer 70A includes: gate circuits 70a and 70b buffering and transmitting signals transmitted from sense amplifier SAA to sense output lines (internal data read line) Ibj and Ibk when an inverted signal, saeba, of sense amplifier activating signal, saea, is activated (L level); p channel MOS transistors 70c and 70f rendered conductive in response to activation of the sense amplifier activating signal saeba; a p channel MOS transistor 70d rendered conductive when an output signal from gate circuit 70a is at the L level, for coupling P channel MOS transistor 70c to the read main bit line rmblk; an N channel MOS transistor 70e rendered conductive when an output signal from gate circuit 70a is at the H level, for coupling the read main bit line rmblk to the ground voltage VSS; a p channel MOS transistor 70g rendered conductive when an output signal from gate circuit 70b is at the L level, for coupling MOS transistor 70f to the read main bit line rmblj; and an n channel MOS transistor 70h rendered conductive when an output signal of gate circuit 70b is at the H level for coupling the read main bit line rmblj to the ground voltage VSS.

Gate circuits 70a and 70b output a signal of L level, when the sense amplifier activating signal saeba is inactive (H level). At this time, MOS transistors 70d and 70g are on, while MOS transistors 70c and 70f are off, so that read buffer 70A is at an output high impedance state.

When the sense amplifier activating signal saeba is activated (attains to the L level), MOS transistors 70c and 70f turn on, MOS transistors 70d and 70e form a CMOS inverter, and MOS transistors 70g and 70h form another CMOS inverter. Gate circuits 70a and 70b operate as a buffer circuit, and respectively output the buffered signals of the signals transmitted from sense amplifier SAA to sense output lines Ibj and Ibk.

By MOS transistors 70d and 70e, the output signal of gate circuit 70a is inverted and transmitted to read main bit line rmblk, and by MOS transistors 70g and 70h, the output signal of gate circuit 70b is inverted and transmitted to read main bit line rmblj.

In the sensing operation of sense amplifier band SKA, the sense amplifier activating signal saebb for sense amplifier band SKB is inactive, and read buffer 70B is at the output high impedance state. Therefore, the output data of read buffer 70A is transmitted over read main bit line rmbl <m> to output latch 72.

On the contrary, when sense amplifier band SKB is in operation, sense amplifier band SKA is inactive, and read buffer 70A is kept at the output high impedance state.

Figure 23:
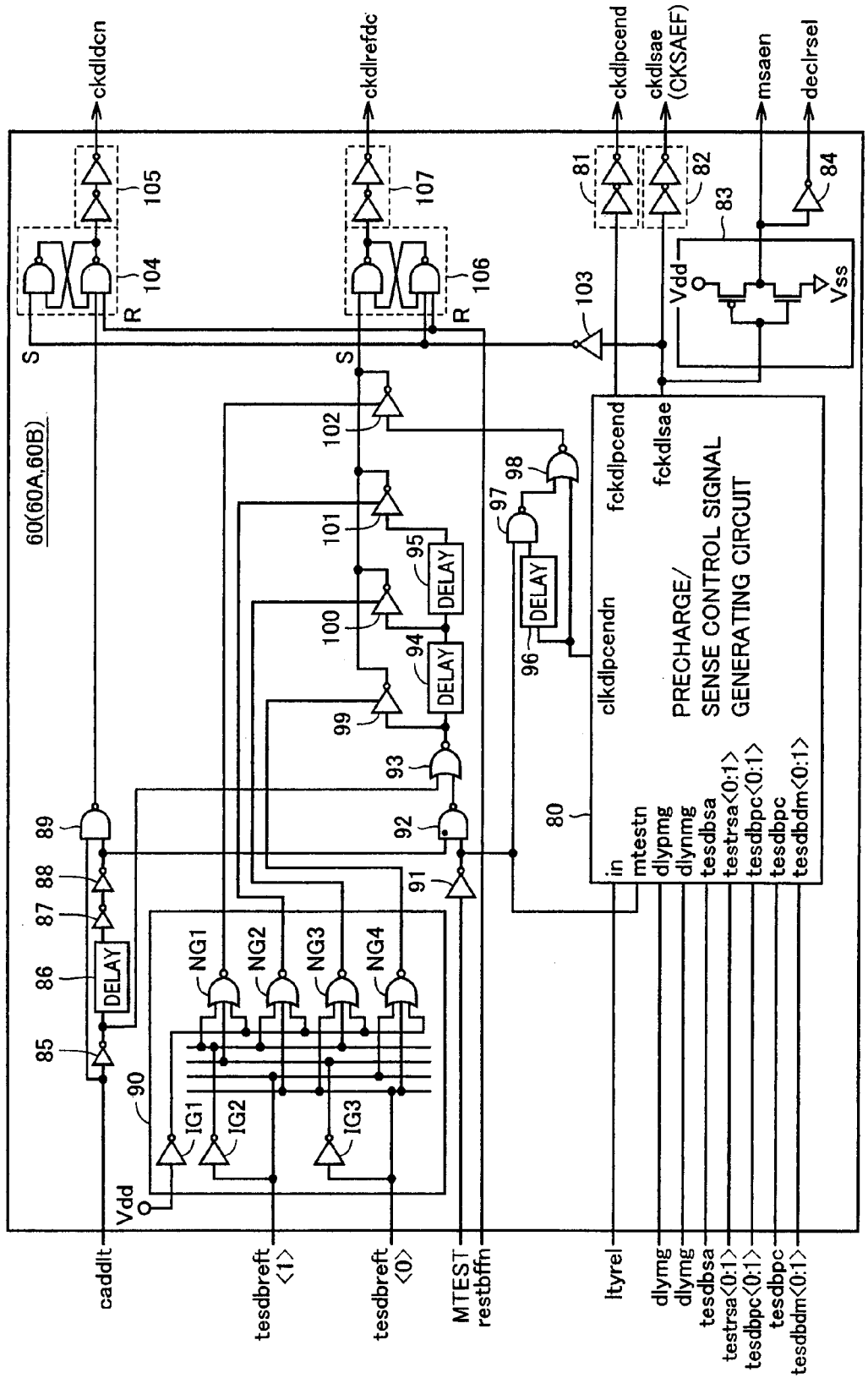
FIG. 23 shows an exemplary construction of a sense amplifier control circuit shown in FIG. 22.

FIG. 23 schematically shows the constructions of sense amplifier control circuits 60A and 60B shown in FIG. 20. The sense amplifier control circuits 60A and 60B have the same construction, and sense amplifier control circuit 60 is shown representative of the circuits 60A and 60B. Referring to FIG. 23, sense amplifier control circuit 60 includes: a precharge/sense control signal generating circuit 80 receiving at an input node in a read designating signal, ltyrel, and generating a subbit line precharge control signal, fckdlpcend, and a sense amplifier activation control signal, fckdlsae; a buffer circuit 81 buffering the output signal, fckdlpcend, of precharge/sense control signal generating circuit 80 and generating a subbit line precharge end control signal, ckdlpcend; a buffer circuit 82 buffering the output signal, fckdlsae, of precharge/sense control signal generating circuit 80 and generating a sense activation control signal, ckdlsea; an inverter 83 inverting the output signal, fckdlsae, of precharge/sense control signal generating circuit 80 and generating a monitor sense activation signal, msaen; and an inverter 84 inverting the output signal, msaen, of inverter 83 for generating the decoder reset signal, declrsel.

The sense amplifier control signal, ckdlsae, from buffer circuit 82 corresponds to the activation control signal CKSAEF shown in FIG. 16 above, and based on this signal, the address latch circuit is reset. The signal, declrsel, is for resetting a decoder, which is applied to X decoder 12 shown in FIG. 16. The decoder reset signal, declrsel, corresponds to the output signal of inverter 48 shown in FIG. 16, which may reset the decode circuits YBFA and YBFB in Y decoder 13. In any case, after activation of the signal, ckdldlsae, controlling activation of the sense amplifier, the decoder reset signal, declrsel, is generated, and the address latch circuit and the decoder are reset.

The internal construction of precharge/sense control signal generating circuit 80 will be described in greater detail later. The signal, ltyrel, applied to input node, in, indicates transition of the Y predecode address signal from the address latch circuit, which is activated in the read mode and indicates that operation of the Y system circuit has started.

The voltages, dlypmg and dlynmj, are reference voltages setting the amount of driving current in a current limited type delay circuit included in precharge/sense control signal generating circuit 80. The test signal, tesdbsa, is a timing test designating signal for changing the timing of activating the sense amplifier, and the signals, tesdrsa <0:1>, are test sense amplifier activation timing setting signals for setting the timing for activating the sense amplifier.

The signal, tesdbpc, is for designating a mode for testing a precharge end timing of a subbit line, and the signals, tesdbpc <0:1>, are for setting the subbit line precharge end timing.

The signals, tesdbdm <0:1>, are test control signals for adjusting magnitude of load capacitance of the output of the delay circuit included in precharge/sense control signal generating circuit 80.

Sense amplifier control circuit 60 further includes: an inverter 85 receiving a Y address latch designating signal, caddlt; a delay circuit 86 delaying an output signal of inverter 85 by a prescribed time period; cascaded inverters 87 and 88 of two stages, receiving an output signal of delay circuit 86; and an NAND gate 89 receiving an output signal from inverter 88 and the Y address latch designating signal, caddlt.

Based on the Y address latch designating signal, caddlt, the set signals SETAN, SETBN and YRSETN for the latch circuit shown in FIG. 16 are generated. Inverters 85, 87 and 88, delay circuit 86 and NAND gate 89 form in combination an inversion rise delay circuit to generate a one shot pulse signal, which in turn falls to the L level after elapse of the delay time of inverters 85, 87 and 88 and of delay circuit 86, from the rise of Y address latch designating signal, caddlt.

Sense amplifier control circuit 60 further includes: a reference current discharge timing decode circuit 90 for decoding reference current discharging test signals, tesdbreft <0:1>; an inverter 91 receiving the test mode designating signal MTEST; an NAND gate 92 receiving the output signals from inverters 88 and 91; an NOR gate 93 receiving an output signal of NAND gate 92 and an output signal of inverter 85; delay circuits 94 and 95 delaying, by respective prescribed time periods, the output signal of NOR gate 93; a delay circuit 96 delaying an output signal, clkdlpcendn, of precharge/sense control signal generating circuit 80 by a prescribed time period; an NAND gate 97 receiving an output signal of delay circuit 96 and an output signal of inverter 91; an NOR gate 98 receiving an output signal of NAND gate 97 and an output signal, clkdlpcendn, of precharge/sense control signal generating circuit 80; tristate inverters 99-102 selectively inverting and passing an output signal of NOR gate 93, the output signals of delay circuits 94 and 95 and an output signal of NOR gate 98, in accordance with an output signal of reference current discharge timing decoder 90; an inverter 103 receiving an output signal, fckdlsea, of precharge/sense control signal generating circuit 80; a set/reset flip-flop 104 set in accordance with an output signal of inverter 103 and reset in response to activation of the subbit line discharge timing signal, restbffn, or the output signal of NAND gate 89; a buffer circuit 105 for buffering a complementary output signal of set/reset flip-flop 104 and generating the subbit line discharge control signal, ckdldcn; a set/reset flip-flop 106 set in response to an output signal of any of tristate inverters 99-102 and reset in response to activation of an output signal of inverter 103 or the subbit line discharge timing signal, restbffn; and a buffer circuit 107 buffering an output signal of set/reset flip-flop 106 and generating the reference current discharge control signal, ckdlrefdc.

Flip-flops 104 and 106 each have a set input S and a reset input R, and set or reset when an L level signal is applied to the set input S or the reset input R.

Reference current discharge timing decode circuit 90 includes: an inverter IG1 receiving the power supply voltage, vdd; inverters IG2 and IG3 receiving test bits, tesdbreft <1> and tesdbreft <0>, respectively; an NOR gate NG1 receiving output signals of inverters IG1-IG3; an NOR gate NG2 receiving output signals of inverters IG1 and IG2 and test bit, tesdbreft <0>; an NOR gate NG3 receiving output signals of inverters IG1 and IG2 and test bit, tesdbreft <0>; and an NOR gate NG4 receiving an output signal of inverter IG1 and test bits, tesdbreft <1> and tesdbreft <0>.

Each of the NOR gates NG1-NG4 outputs a signal at the H level when the signals applied to the inputs thereof are all at the L level. Therefore, in accordance with the states of test bits, tsedbreft <0:1>, an output signal of any one of the NOR gates NG1-NG4 attains to the H level. The output signals of NOR gates NG1-NG4 are applied to control nodes of tristate inverter buffers 102-99, respectively, and in accordance with the output signals of NOR gates NG1-NG4, the output signals of tristate inverters 99-102 are activated. Thus, the delay time of the signal applied to the set input of set/reset flip-flop 106 can be adjusted.

Specifically, by setting test bits, tesdbreft <0:1>, to appropriate logic levels, the timing of activating the reference current discharge control signal, ckdlrefdc, which is a basic signal for the reference current control signals VFDCkN and VFDCjN shown in FIG. 8, can be adjusted and, in response, the timing of discharging the reference current, iref, can be adjusted.

Figure 24:
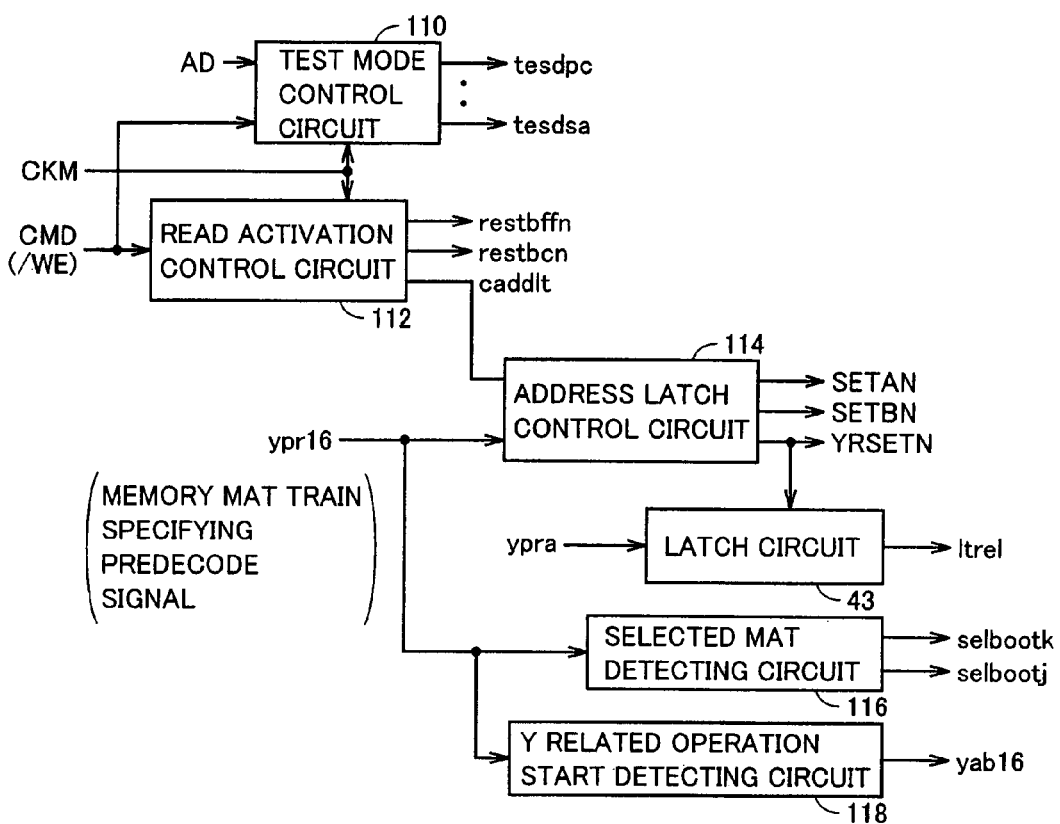
FIG. 24 schematically shows a construction of an input signal generating portion shown in FIG. 23.

FIG. 24 schematically shows a construction of a portion generating input signals (Y related control signals) to sense amplifier control circuit 60 shown in FIG. 23. Referring to FIG. 24, the Y related control signal generating portion includes: a test mode control circuit 101 taking an external command and an address AD in synchronization with the clock signal CKM (or CLK) and generating various test mode designating signals such as tesdpc and tesdsa; a read activation control circuit 112 taking an external command CMD in synchronization with the clock signal CKM and generating the reset signals, restbffn, restbcn, and the Y address latch designating signal, caddlt; an address latch control circuit 114 generating address latch designating signals SETAN, SETDN and YRSETN in accordance with a predecoded signal, ypr16, specifying a train of memory mats from a predecoder, not shown, and in accordance with the Y address latch designating signal, caddlt, from read activation control circuit 112; a latch circuit 43 latching a predecode signal, ypra, in accordance with the Y address latch designating signal YRSETN from address latch control circuit 114 and generating a Y address change detecting signal (read operation start designating signal), ltrel, in accordance with a change in the latch predecoded signal; a selected mat detecting circuit 116 generating the selected mat designating signals, selbootk and selbootj, in accordance with the predecoded signal, ypr16; and a Y related operation start detecting circuit 118 generating an operation start timing detecting signal, yab16, for the Y related circuitry, in accordance with the predecoded signal, ypr16.

The Y related circuitry includes the Y decoder, the sense amplifier circuit, the reference current supplying circuit, and circuits related to column selection and internal data reading such as the output latch circuit.

The predecoded signal ypr16 is a 2 bit signal (in case where one memory block includes two memory mat trains) that specifies which of the memory blocks MBA and MBB shown in FIG. 1 is designated, and designates from which of the upper and lower trains of memory mats in the selected memory block, the memory cell data should be read.

Latch circuit 43 is the same as latch circuit 43 FIG. 16, which sets the predecoded signal in accordance with the set signal YRSETN, and generates the subbit line selection signals, yra <0:7>, and further, by detecting the change in these signals, generates a read operation start designating signal ltrel.

The selected mat detecting circuit 116 generates the signals, selbootk and selbootj, that designate which of the upper and lower memory mat trains is selected, in accordance with the predecode signal ypr16. As will be described in detail later, the signals, selbootk and selbootj, control inversion/non-inversion of a selected single end signal when a single end signal is to be generated from complementary signals in an output buffer included in the output latch circuit.

Y related operation start detecting circuit 118 detects the change in predecoded signal ypr16, and generates the Y related operation start timing signal yab16.

The selected mat detecting circuit 116 and Y related operation start detecting circuit 118 are included in delay portion 44 shown in FIG. 16. The signal, ltrel, may also be generated by the address change (transition) detecting circuit at delay portion 44 shown in FIG. 16.

Read activation control circuit 112 sets the reset signals, restbffn and restcn, to the active state of L level in response to the rise of the clock signal CKM, when the command CMD instructs data reading (when the write enable signal AWE is at the H level), and after resetting, generates the Y address latch designating signal, caddlt.

Figure 25:
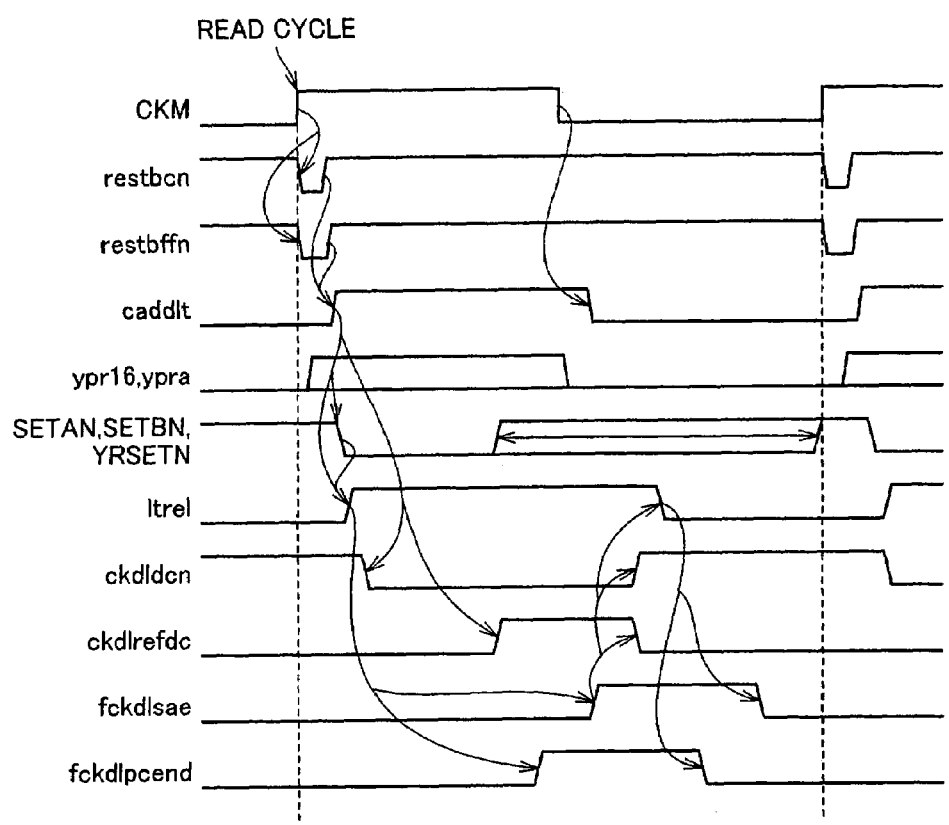
FIG. 25 is a diagram of signal waveforms representing an operation of the circuit shown in FIG. 24.

FIG. 25 is a timing diagram representing an operation of the circuitry shown in FIG. 24 in the read mode. In the following, the operation of the Y related control signal generating portion shown in FIG. 24 in a normal read operation mode will be described with reference to FIG. 25.

In a normal operation mode, when a write enable signal /WE, being the command CMD, for example, is set to the H level, the data read mode is designated. In response to the rise of the clock signal CKM, read activation control circuit 112 sets and maintains the reset signals, restbcn and restbffn, at the L level for a prescribed time period. In accordance with activation of these reset signals, restbcn and restbffn, internal signal lines (data bus and subbit line) are reset to the initial state. Here, as described in the first embodiment above, at a prescribed timing after activation of the sense amplifier activating signal SAE (sae), the internal state is reset, and in accordance with the reset signals, restbdcn and restbffn, the internal state is reliably set to the initial state at the start of each read cycle.

When these reset signals, restbcn and restbffn, are inactivated, the Y address latch designating signal caddlt is set to and kept at the H level for a prescribed time period.

In response to the rise of clock signal CKM, an internal address signal is generated, and through the predecoder, the predecoded signals, ypr16 and ypra, change. After the predecoded signals ypr16 and ypra are made definite and settled, in accordance with the activation of Y address latch designating signal caddlt, address latch control circuit 114 activates the address set signals SETAN, SETDN and YRSTEN for the selected memory block. In accordance with the Y address set signal YRSTEN, latch circuit 43 latches the predecoded signal, ypra. In accordance with the change of predecoded signal, ypra, the signal, ltrel, defining a subbit line selecting operation is activated.

In accordance with the activation of Y address latch designating signal caddlt, set/reset flip-flop 104 shown in FIG. 23 is reset, and the subbit line discharge timing signal, ckdldcn, is activated.

On the other hand, precharge/sense control signal generating circuit 80 shown in FIG. 23 activates the sense amplifier activation timing signal, fckdlsae, and the subbit line precharge end designating signal, fckdlpcend, at prescribed timings, respectively, in accordance with activation of the signal ltrel. In accordance with the activation of Y address latch designating signal caddlt, set/reset flip-flop 106 is set, and in response, the reference current control signal, ckdlrefdc, is, activated, so that supply of the reference current starts.

When the signal ltrel is inactivated after a prescribed time period from activation of the sense amplifier circuit, the precharge end control signal fckdlpcend is inactivated by precharge/sense control signal generating circuit 80 and, further, the sense amplifier activation control signal fckdlsae is inactivated.

In accordance with the activation of sense amplifier activation control signal, fckdlsae, the set/reset flip-flops 104 and 106 shown in FIG. 23 are set and reset, the signal, ckdldcn, is inactivated, and the signal, ckdlrefdc, is inactivated. Accordingly, supply of the reference current to the common bit line is stopped, and discharge of the memory cell current in the subbit line is stopped.

Further, in accordance with the activation of sense amplifier activation control signal, fckdlsae, the Y address latch circuit is reset, the signal ltrel is inactivated in response, and in accordance with inactivation of the signal ltrel, the sense amplifier activation control signal, fckdlsae, and the subbit line precharge end control signal, fckdlpcend, are inactivated.

In the operation timing shown in FIG. 25, the signal yab16 from Y related operation start detecting circuit 118 is not used. This is because the signal yab16 is used in the output control circuit 7 shown FIG. 20, for controlling operations of the output buffer and the output latch, as will be described in detail later.

Figure 26:
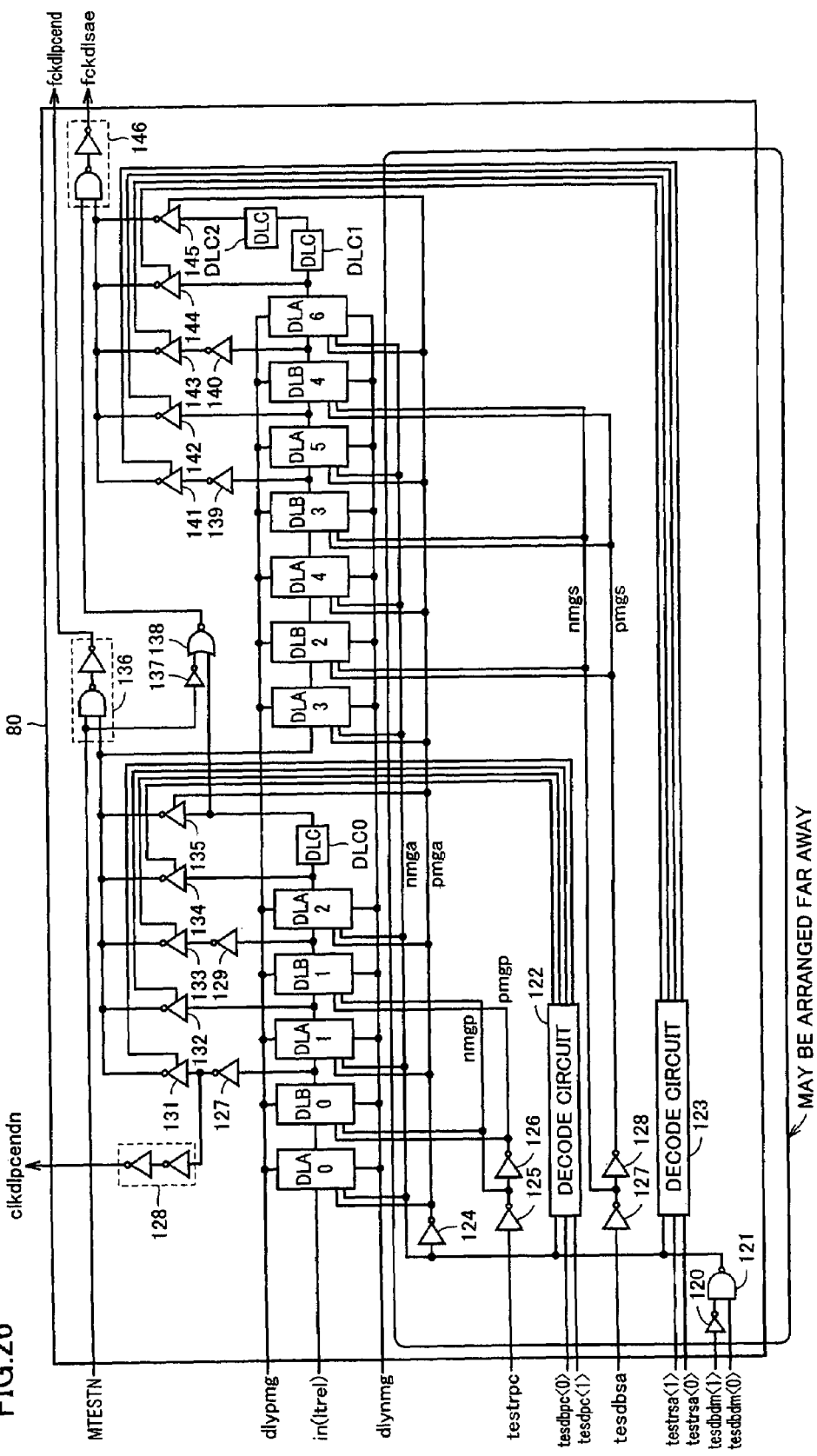
FIG. 26 schematically shows a construction of a precharge/sense control signal generating circuit shown in FIG. 23.

FIG. 26 schematically shows a construction of precharge/sense control signal generating circuit 80 shown in FIG. 23. Referring to FIG. 26, precharge/sense control signal generating circuit 80 includes: an inverter 120 receiving a test signal, tesdbdm <1>; an NAND gate 121 receiving an output signal of inverter 120 and a test signal tesdbdm <0>; a decode circuit 122 activated when the output signal of NAND gate 121 is at the H level, for decoding the precharge test timing signals, tesdpc <0> and tesdpc <1>; a decode circuit 123 activated when the output signal of NAND gate 121 is at the H level, for decoding the sense amplifier timing test signals, testrsa <1> and testrsae <0>; an inverter 125 receiving the precharge timing test signal, testrpc; an inverter 126 receiving an output signal nmgp of inverter 125 and generating a signal, pmgp; an inverter 127 receiving a sense amplifier activation timing test signal, tesdsa; and an inverter 128 receiving the output signal nmgs of inverter 127 and generating a signal, pmgs.

Decode circuits 122 and 123 are each a 2-bit decoder, which decodes an applied test signal of 2 bits and generates a control signal of 4 bits. By decode circuits 122 and 123, the timing of activating the precharge activation timing signal and the sense amplifier activation timing signal are changed.

Precharge/sense control signal generating circuit 80 further includes: delay circuits DLA0-DLA2 and DLB0 and DLB1 for delaying the signal ltrel applied to an input node, in; a delay circuit DLC0 further delaying an output signal of delay circuit DLA2; inverters 127 and 129 inverting output signals of delay circuits DLB0 and DLB1, respectively; a buffer circuit 128 buffering an output signal of inverter 127 to generate a signal, ckdlpcendn; a tristate inverter 131 inverting an output signal of inverter 127 when activated; a tristate inverter 132 inverting an output signal of delay circuit DLA1 when activated; a tristate inverter 133 inverting an output signal of inverter 129 when activated; a tristate inverter 134 inverting an output signal of delay circuit DLA2 when activated; and a tristate inverter 135 inverting an output signal of delay circuit DLC0 when activated.

Outputs of these tristate inverters 131-135 are coupled together. Tristate inverters 131-134 are selectively activated in accordance with an output signal of decode circuit 122, and tristate inverter 135 is activated when the output signal, pmga, of inverter 124 is at the H level.

Delay circuits DLA0-DLA2 and delay circuits DLB0-DLB1 are arranged alternately. The amount of delay of delay circuits DLA0-DLA2 is set in accordance with the output signals, nmga and pmga, of NAND gate 121 and inverter 124, while the amount of delay of delay circuits DLB0 and DLB1 are set in accordance with the output signals, nmgp and pmgp, of inverters 125 and 126. These delay circuits DLA0-DLA2 and DLB0, DLB1 are current limited type delay circuits of which amount of driving current is adjusted by reference voltages, dlypmg and dlynmg. These reference voltages, dlypmg and dlynmg, are reference voltages, and in order to maintain the voltage levels constant, they are transmitted using shielded lines.

Further, the signal lines transmitting the signals, nmga and pmga, are configured to have sufficiently small parasitic capacitance. Thus, the influence on the load capacitance provided at the outputs of delay circuits DLA0-DLA2 is reduced, and accurate delay time is set.

Precharge/sense control signal generating circuit 80 further includes: an inverter 126 receiving the test mode designating signal MTEST; an AND circuit 136 receiving an output signal of inverter 126 and an output signal of any of tristate inverters 131-135 and generating the precharge end control signal, fckdlpcend; an inverter 132 receiving an output signal of inverter 126; an NOR gate 138 receiving an output signal of delay circuit DLC0 and an output signal of inverter 137; delay circuits DLA3-DLA6 and DLB2-DLB4 delaying an output signal of any of tristate inverters 131-135; and cascaded delay circuits DLC1 and DLC2 for delaying an output signal of delay circuit DLA6.

Delay circuits DLA3-DLA6 and delay circuits DLB2-DLB4 are arranged alternately, and the amount of driving current thereof is adjusted in accordance with the reference voltages, dlypmg and dlynmg. Further, output load of delay circuits DLA3-DLA6 is adjusted by the signals, nmga and pmga. Further, output load of delay circuits DLAB2-DLB4 each is adjusted by the signals, nmgs and pmgs.

Precharge/sense control signal activating circuit 80 further includes: an inverter 139 receiving an output signal of delay circuit DLB3; an inverter 140 receiving an output signal of delay circuit DLB4; a tristate inverter 141 inverting an output signal of inverter 139 when activated; a tristate inverter 142 inverting an output signal of delay circuit DLA5 when activated; a tristate inverter 143 inverting an output signal of inverter 140 when activated; an inverter 144 inverting an output signal of delay circuit DLA6 when activated; a tristate inverter 145 inverting an output signal of delay circuit DLC2, when activated; and an AND circuit 146 receiving an output signal of NOR gate 138 and an output signal of any of tristate inverters 141-145 and generating a sense amplifier activation control signal, fckdlsae.

Tristate inverters 141-144 are selectively activated in accordance with an output signal of decode circuit 123, and tristate inverter 145 is activated when the output signal, pmga, of inverter 124 is activated.

Figure 27:
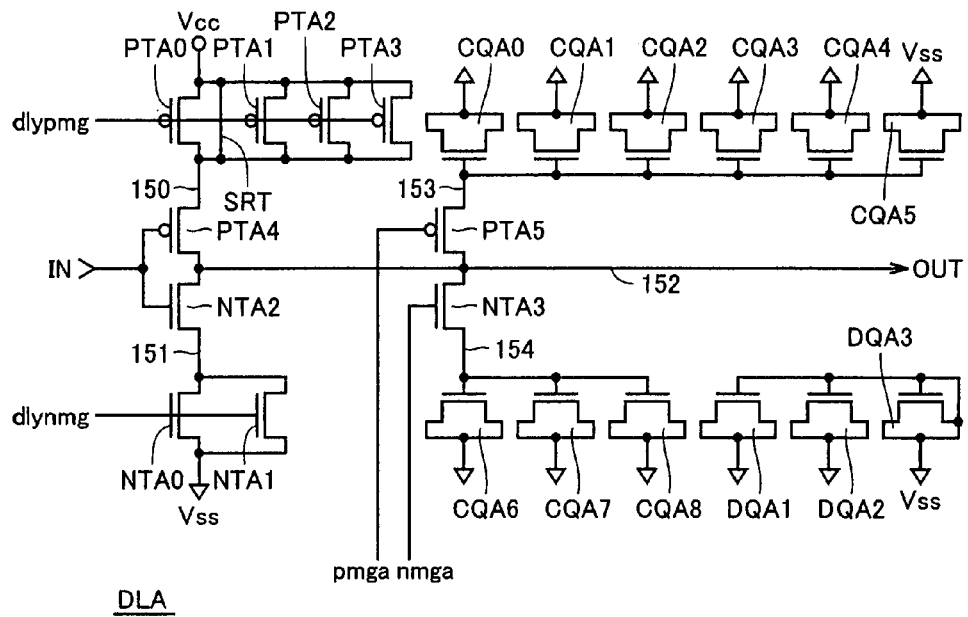
FIG. 27 shows an exemplary configuration of a delay circuit shown in FIG. 26.

FIG. 27 shows an exemplary construction of delay circuits DLA0-DLA6 shown in FIG. 26. In FIG. 27, delay circuits DLA0-DLA6 are the same in configuration, and therefore, one delay circuit DLA is shown as a representative.

Referring to FIG. 27, delay circuit DLA (DLA0-DLA6) includes: P channel MOS transistors PTA0-PTA3 connected in parallel between a power supply node and a node 150 and receiving, at respective gates, the reference voltage, dlypmg; a shorting interconnection line SRT for short-circuiting between the power supply node and node 150; a P channel MOS transistor PTA4 connected between node 150 and output node 152 and having its gate connected to an input node IN; an N channel MOS transistor NTA2 connected between a node 151 and output node 152 and having its gate connected to input node IN; N channel MOS transistors NTA0 and NTA1 connected between node 151 and a ground node and receiving at their gates the reference voltage, dlynmg; MOS capacitors CQA0-CQA5 formed of N channel MOS transistors having respective gates connected to a node 153 and their sources and drains coupled to the ground node; MOS capacitors CQA6-CQA8 formed of N channel MOS transistors having respective gates connected to a node 154 and respective sources and drains connected to the ground node; a P channel MOS transistor PTA5 coupling node 153 to output node 152 in accordance with a control signal, pmga; and an N channel MOS transistor NTA3 for coupling the node 154 to output node 152 in accordance with a control signal, nmga.

MOS capacitors DQA1-DQA3 are each formed of an MOS transistor having the gate, source and drain coupled to the ground node. These MOS capacitors RQA1-DQA3 are formed to maintain layout regularity, and do not function as a load to output node 152. Namely, they are arranged simply as dummy capacitors.

In delay circuit DLA, in accordance with the reference voltages, dlypmg and dlynmg, the amount of current driven by MOS transistors PTA0-PTA3 and NTA0, NTA1 is defined. Therefore, the capability of MOS transistors PTA4 and NTA2 for driving the output node 152 in accordance with the signal applied to input node IN is limited by the MOS transistors PTA0-PTA3 and NTA0 and NTA1, so that the speed of change in the output is adjusted, whereby the circuit functions as a delay circuit. The short interconnection line SRT has its passing current amount adjusted by the line width thereof.

MOS transistors PTA5 and NTA3 couple MOS capacitors CQA0-CQA5 and CQA6-CQA8 to output node 152, when rendered conductive. The control signals, pmga and nmga, are complementary signals (see FIG. 26), and when the voltage level of output node 152 changes, the MOS capacitors CQA0-CQA8 function as a capacitive load on output node 152, to slow down the speed of change of the output signal OUT from output node 152.

In delay circuit DLA, for the P channel MOS transistor, current supplying transistors PTA0-PTA3 are provided greater in number than the current supplying MOS transistors NTA0 and NTA1 for N channel MOS transistor NTA2. This is because the current drivability of a P channel MOS transistor is smaller than that of an N channel MOS transistor (provided that they have the same size). In order to adjust the difference in current drivability, the amount of driving current of P channel MOS transistor PTA4 is increased, so as to adjust the speed of rising and falling (equalize) of the output signal.

Figure 28:
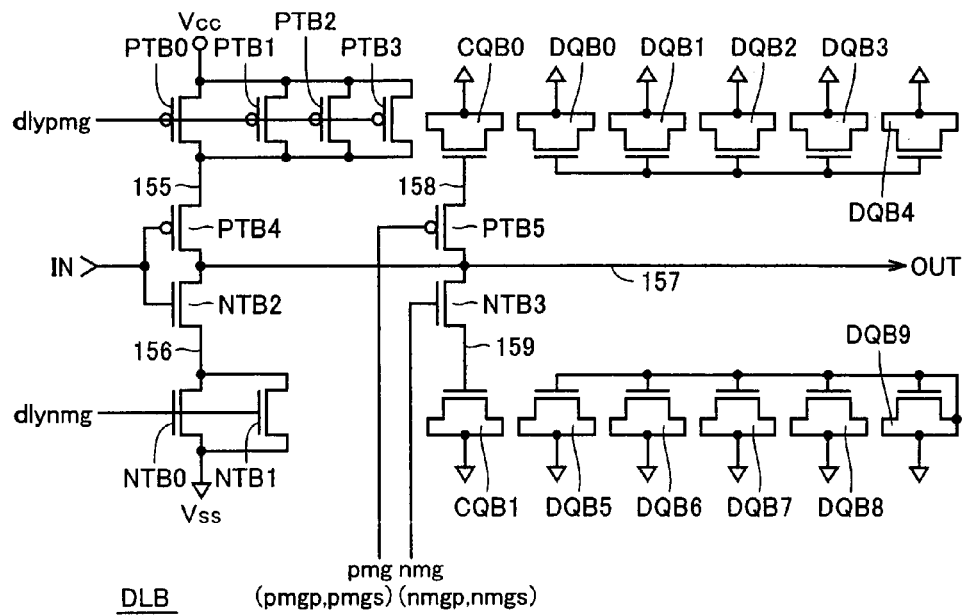
FIG. 28 shows an example of a second delay circuit shown in FIG. 26.

FIG. 28 schematically shows a construction of delay circuit DLB (DLB0-DLB4) shown in FIG. 26. As delay circuits DLB0-DLB4 have the same construction, FIG. 28 shows one delay circuit DLB as a representative. Referring to FIG. 28, delay circuit DLB includes: P channel MOS transistors PTB0-PTB3 connected in parallel between the power supply node and a node 155 and receiving, at respective gates, the reference voltage dlypmg; a P channel MOS transistor PTB4 connected between node 155 and an output node 157 and having its gate connected to an input node IN; N channel MOS transistors NTB0 and NTB1 connected between a node 156 and a ground node and receiving, at respective gates, the reference voltage dlynmg; an N channel MOS transistor NTB2 connected between output node 157 and node 156 and having its gate connected to input node IN; an MOS capacitor CQB0 formed of an N channel MOS transistor having its gate connected to a node 158 and its source and drain nodes connected to the ground node; a P channel MOS transistor PTB5 electrically coupling node 158 to output node 157 in accordance with a control signal pmg (pmgp or pmgs); an MOS capacitor CQB1 formed of an N channel MOS transistor having its gate connected to a node 159 and its source and drain connected to the ground node; and an N channel MOS transistor NTB3 coupling node 159 to output node 157 in accordance with the control signal nmg (nmgp or nmgs).

MOS capacitors BQB0-BQB4 are formed of N channel MOS transistors arranged in parallel with MOS capacitor CQB0 and are arranged as dummy capacitors, with the gates, sources and drains coupled to the ground node. Similarly, MOS capacitors BQB5-BQB9 arranged in parallel with MOS capacitor CQB1 are arranged as dummy capacitors, with the gates, drains and sources coupled to the ground node. These dummy capacitors BQB0-BQB9 are arranged simply to maintain layout regularity of the delay circuit. MOS capacitors CQB0 and CQB1 are smaller in size than MOS capacitors CQA0-CQA5 and CQA6-CQA8 of delay circuit DLA shown in FIG. 27, and configured to have smaller capacitance value.

Delay circuit DLB shown in FIG. 28 also has the amount of driving current of output node 157 adjusted in accordance with the reference voltages, dlypmg and dlynmg, and the delay time thereof set. MOS capacitors CQB0 and CQB1 are coupled to output node 157 when MOS transistors PTB5 and NTB3 are rendered conductive, and function as a capacitor when the voltage at output node 157 changes. Therefore, by these MOS capacitors CQB0 and CQB1, the speed of change of the output signal OUT is slowed down.

In delay circuits DLA and DLB shown in FIGS. 27 and 28, as an issue in design, parasitic capacitance of output nodes 152 and 157 is made as small as possible, parasitic capacitance of source nodes of MOS transistors PTA4, PTB4, NTA2 and NTB2 for driving current is made sufficiently small, so as to eliminate unnecessary cause of delay and to provide the delay time close to the designed value.

Delay circuits DLC0-DLC2 are delay elements with the amount of driving current adjusted, and they do not perform inversion of input signal logic level.

Again returning to FIG. 26, when the test mode designating signal MTEST is at the H level, the inverted test mode designating signal MTESTN applied to sense/precharge control signal generating circuit 80 is at the L level, and the output signal, fckdlpcend, of AND circuit 136 is at the L level. Further, as the output signal of inverter 137 attains to the H level, the output signal of NOR gate 138 attains to the L level, and the signal, fckdlsae, from AND circuit 146 is at the L level. Therefore, when the test mode designating signal MTEST is active, the decoder and the address latch circuit are not reset, the subbit line is not precharged, and internal reading is stopped.

Figure 29:
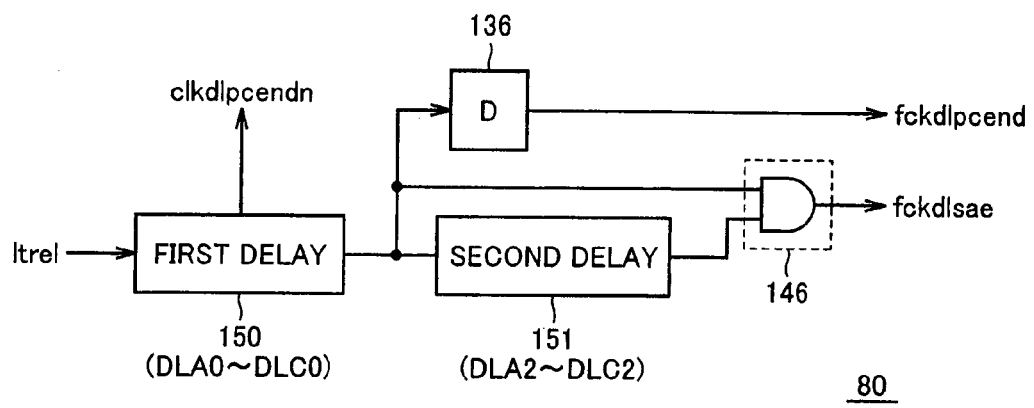
FIG. 29 schematically shows an equivalent construction of the circuit shown in FIG. 26 in a normal reading mode.

FIG. 29 schematically shows an equivalent construction of precharge/sense control signal generating circuit 80 in a normal read mode. Referring to FIG. 29, precharge/sense control signal generating circuit 80 includes: a first delay circuit 150 delaying an input signal, ltrel, by a prescribed time period in the normal read mode; an AND circuit 136 generating the precharge control timing signal, fckdlpcend, in accordance with an output signal of the first delay circuit 150; a second delay circuit 151 further delaying an output signal of the first delay circuit 150; and an AND circuit 146 generating a signal, fckdlsae, in accordance with output signals from the first and second delay circuits 150 and 151. From an intermediate delay stage in the first delay circuit 150, the signal, clkdlpcendn, is generated.

The first delay circuit 150 includes delay stages DLA0-DLC0, while the second delay circuit 151 includes delay stages DLA2-DLC2.

Figure 30:
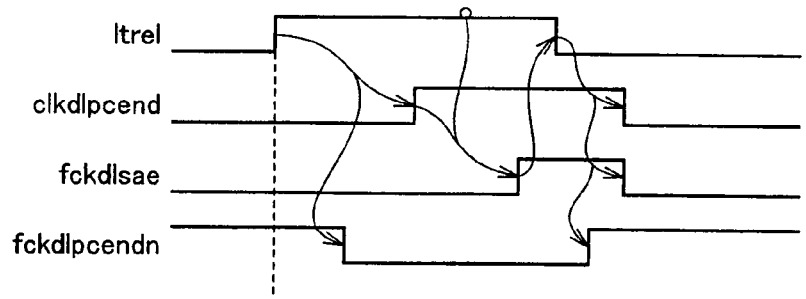
FIG. 30 is a timing diagram representing an operation of the circuit shown in FIG. 29.

FIG. 30 is a timing diagram representing an operation of precharge/sense control signal generating circuit 80 shown in FIG. 29. In the following, an operation of precharge/sense control signal generating circuit 80 shown in FIG. 29 at the time of normal data reading will be described with reference to FIG. 30.

Referring to FIG. 30, the internal read operation start designating signal, ltrel, attains to the H level, and after a prescribed time period, the signal, clkdlpcendn, from the intermediate stage in first delay circuit 150 falls to the L level. As shown in FIG. 23, by the signal clkdlpcendn or the Y address latch designating signal caddl, the timing of discharging the reference current is defined.

After the delay time of the first delay circuit 150, the output signal, fckdlpcend, of AND circuit 136 attains to the H level, and after the delay time of the second delay circuit 151, the signal, fckdlsae, from AND circuit 146 rises to the H level.

When the output signal, fckdlsae, of AND circuit 146 rises to the H level, the decoder and the address latch circuit are reset as described in the first embodiment previously, and the signal, ltrel, attains to the inactive state of L level. In response, the signal, clkdlpcendn, attains to the inactive state of H level, and output signals, fckdlpcend and fckdlsae, of AND circuits 136 and 146 attain to the L level.

In a timing test, the test mode designating signal MTEST is set to the L level, and in response, the signal MTESTN attains to the H level. In this state, the test bits tesdbdm <0:1> are set to (1, 0), respectively. In response, the output signal of NAND gate 121 attains to the L level, the control signals pmga and nmga attain to the H level and L level, respectively, output load of delay stages DLA0-DLA6 are isolated from respective output nodes, and the delay time becomes shorter. Tristate inverter buffers 135 and 145 are activated in accordance with the control signal, pmga. As decode circuits 122 and 123 are inactive, when the test timing designating signals, testrpc and tesdbsa, are set to the L level, the output load control signals nmgp, pmgp and nmgs and pmgs to the delay stages DLB0-DLB1 and delay stages DLB2-DLB4 can be activated. In response, delay times of the first and second delay circuits 150 and 151 can be made longer.

When test bits teddbdm <0:1> are at the state other than that described above, the output signal of NAND gate 121 attains to the H level, the control signals pmga and nmga responsively attain to the L level and H level, respectively, and tristate inverter buffers 135 and 145 are set to the output high impedance state. Further, output loads of delay stages DLA0-DLA6 become effective. Decode circuits 122 and 123 are enabled, to select the tristate inverter selection signal in accordance with test bits tesdpc <0:1> and tesdsa <0:1>, and it becomes possible to perform the test while adjusting the timing of activating the precharge end activation control signal, fckdlpcend, and the sense amplifier activation control signal, fckdlsae.

By appropriately setting the delay times of the first and second delay circuits 150 and 151 to the exact time based on the result of testing, the timing of reading operation shown in FIG. 9 can accurately be determined.

Figure 31:
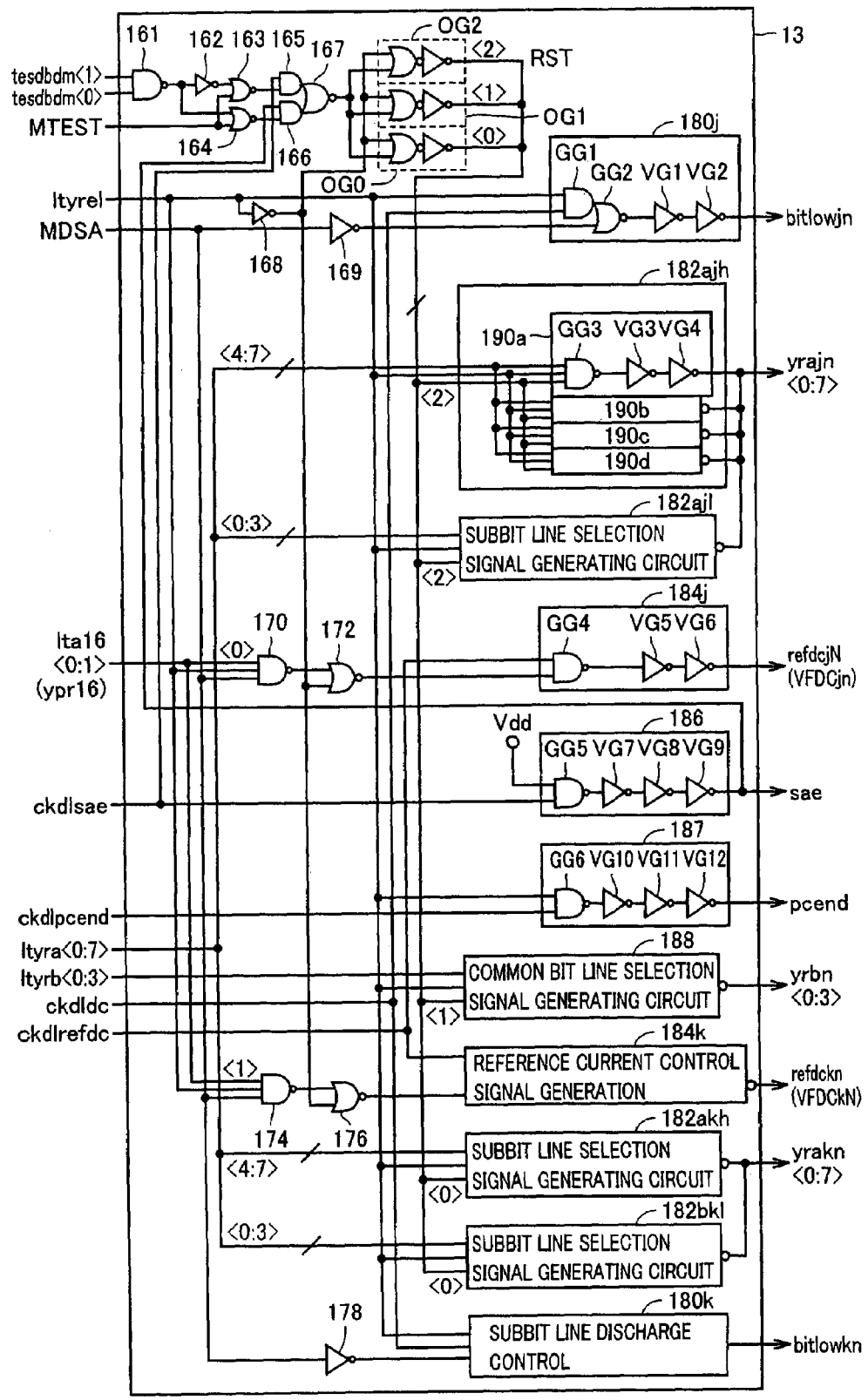
FIG. 31 shows an exemplary construction of a Y decoder in accordance with the fifth embodiment of the present invention.

FIG. 31 shows in detail the construction of Y decoder 13 shown in FIG. 16. The Y decoder shown in FIG. 31 generates Y related control signals for the corresponding memory block, in accordance with the output signal from sense amplifier control circuit 60A or 60B shown in FIG. 20.

Referring to FIG. 31, Y decoder 13 includes: an NAND gate 161 receiving the test control signals, tesdbdm <1> and tesdbdm <0>; an inverter 162 receiving an output signal of NAND gate 161; an NOR gate 163 receiving an output signal of inverter 162 and the test mode designating signal MTEST; an MOS gate 164 receiving the test mode designating signal MTEST and an output signal from NAND gate 161; an AND gate 125 receiving an output signal of NOR gate 163 and the sense amplifier activation control signal (reset signal), ckdlsae; an AND gate 166 receiving an output signal of NOR gate 164 and the sense amplifier activating signal sae (SAE); an NOR gate 167 receiving output signals of AND gates 125 and 166; an inverter 168 receiving the internal read start designating signal, ltyrel; OR circuits OG0-OG2 each receiving an output signal of NOR gate 167 and an output signal of inverter 168 and generating the reset signals RST <2>-RST <0>; an inverter 169 receiving the read mode designating signal MDSA; an NAND gate 170 receiving a memory mat train specifying predecode signals, lta16 <0:1>, the internal read start designating signal, ltyrel, and the read mode designating signal MDSA; an NOR gate 172 receiving an output signal of NAND gate 170 and an output signal of inverter 168; an NAND gate 174 receiving the memory mat train specifying predecode signals lta16 <0:1>, the internal read start designating signal ltyrel and the read mode designating signal MDSA; an NOR gate 176 receiving an output signal of NAND gate 174 and an output signal of inverter 168; and a subbit line selection signal generating circuit 182aj receiving the latch predecoded signals ltyra <4:7>, the internal read start designating signal, ltyrel, and an output signal of OR gate OG0, and generating, when enabled, a subbit line selection signals, yrajn <4:7>, in accordance with the received latch predecode signals, ltyra <4:7>.

Y decoder 13 further includes: a subbit line selection signal generating circuit 182ajl receiving the latch predecode signals ltyra <0:3>, the internal read start designating signal ltyrel and an output signal of OR gate OG2 and generating subbit line selection signals yrajn <0:3>; a reference current control signal generating circuit 184 receiving the reference current discharge control signal, ckdlrefdc, and an output signal of NOR gate 172 and generating the reference current discharge control signal, refdcjn; a sense amplifier activating signal generating circuit 186 receiving the power supply voltage vdd and the sense amplifier activation control signal, ckdlsae, and generating the sense amplifier activating signal sae; a precharge control signal generating circuit 187 receiving the signal ltyrel and the bit line precharge end control signal, ckdlpcend, and generating a precharge end signal, pcend; and a common bit line selection signal generating circuit 188 receiving the latch predecoded signals ltyre <0:3>, the signal ltyrel and an output signal of OR gate OG1, and generating a common bit line selection signal yrbls <0:3>.

Y decoder 13 further includes: a reference current control signal generating circuit 184k for generating the reference current control signal, refdckm, in accordance with the reference current discharge timing control signal, ckdlrefdc, and an output signal of NOR gate 176; a subbit line selection signal generating circuit for 182akh generating the subbit line selection signals yrakn <4:7> in accordance with the latch predecode signals ltyra <4:7>, the signal ltyrel and an output signal of OR gate OG1; a subbit line selection signal generating circuit 182bkl receiving the latch predecoded signals ltyra <0:3>, an output signal of OR gate OG0 and the signal ltyrel, and generating the subbit line selection signals yrakn <0:3>; a subbit line discharge control circuit 180k receiving an output signal of inverter 178, the signal ltyrel and the discharge timing control signal ckdldc, and generating a subbit line discharge control signal, bitlowkn; and a subbit line discharge control circuit 180j receiving an output signal of inverter 169, the signal ltyrel and the subbit line discharge control signal ckdldc, and generating a subbit line discharge control signal, bitlowjn.

The subbit line discharge control signal, bitlowjn, is a control signal for discharging the selected subbit line of memory mat MMj to the ground voltage level. Subbit line discharge control circuit 180j includes: an AND gate GG1 receiving the discharge control signal ckdldc and the signal ltyrel; an NOR gate GG2 receiving an output signal of AND gate GG1 and an output signal of inverter 169; and cascaded inverters VG1 and VG2 of two stages, receiving an output signal of NOR gate GG2 and generating the subbit line discharge control signal, bitlowjn.

Subbit line discharge control circuit 180k has the same construction as subbit line discharge control circuit 180j. Inverters 169 and 178 both invert the read mode designating signal MDSA, and therefore, the subbit line discharge control signals, bitlowjn and bitlowkn, are activated/inactivated at the same timing.

Subbit line selection signal generating circuits 182ajh, 182ajl, 182akh and 182bkl have the same construction, and FIG. 31 shows a construction of a portion of subbit line selection signal generating circuit 182ajh generating the subbit line selection signal.

Subbit line selection signal generating circuit 182ajh includes selection signal generation circuits 190a-190d receiving the latch predecoded signals ltyra <7:4>, the signal ltyrel and an output signal of OR gate OG2, for generating the bits yrajn <7:4>. Corresponding to respective bits of the predecode signals ltyra <4:7>, selection signal generating circuits 190a-190d are provided to generate the respective bits yrajn <7:4>. These selection signal generating circuits 190*a*-190*d* have the same construction, and FIG. 31 shows the construction of selection signal generating circuit 190*a* as a representative.

Selection signal generating circuit 190*a* includes: an NAND gate GG3 receiving the internal read operation start designating signal ltyrel, the latch predecoded signal ltyra <7> and the reset signal RST<2>; and cascaded inverters VG3 and VG4 of two stages for receiving an output signal of NAND gate G&3 and generating a bit yrajn <7>.

By subbit line selection signal generating circuits 182*ajh* and 182*ajl*, the subbit line selection signals yrajn <0:7> for memory mat MMj are generated.

Reference current control signal generating circuits 184*j* and 184*k* have the same construction and in FIG. 31, the construction of reference current control signal generating circuit 184*j* is shown as a representative. Reference current control signal generating circuit 184*j* includes: an NAND gate GG4 receiving an output signal of NOR gate 172 and the reference current discharge control signal, ckdlrefdc; and cascaded inverters VG5 and VG6 of two stages for receiving an output signal of NAND gate GG4 and generating the reference current control signal, refdcjn. The reference current control signal, refdcjn, corresponds to the control signal VFDCjN shown in FIG. 8. To NAND gate 170, the latch predecoded signal lta16 <0> designating a memory mat MMk is applied, and to NAND gate 174, the latch predecoded signal lta16 <1> designating the memory mat MMj is applied. Therefore, when memory mat MMk is selected, the reference current control signal, refdcjn, attains to the L level in accordance with the reference current discharge control signal ckdldc, and the reference current is driven by the memory mat MMj.

Sense amplifier activating signal generating circuit 186 includes: an NAND gate GG5 receiving the power supply voltage vdd and the sense amplifier activation control signal (reset timing signal), ckdlsae; and cascaded inverters VG7-VG9 of three stages for receiving an output signal from NAND gate GG5. The sense amplifier activating signal, sae, is output from inverter VG9.

Sense amplifier activating signal generating circuit 186 is essentially a buffer circuit, and generates the sense amplifier activating signal, sae, in accordance with the sense amplifier activation timing control signal, ckdlsae.

Precharge end control signal generating circuit 187 includes: an NAND gate GG6 receiving the signal, ltyrel, and the precharge end activating signal, ckdlpcend; and cascaded inverters VG10-VG12 of three stages for receiving an output signal of NAND gate GG6. The precharge end designating signal, pcend, is output from the inverter VG12 of the last stage.

In the construction of Y decoder 13 shown in FIG. 31, when the test mode designating signal MTEST is at the H level, output signals of NOR gates 163 and 164 are at the L level, the output signal of NOR gate 167 attains to the H level, and output signals RST <0>-RST <2> of OR circuits OG0-OG2 all attain to the H level. Consequently, resetting operation responsive to the sense amplifier activating timing on subbit line selection signal generating circuits 182*ajh*, 182*ajl*, 182*akh* and 182*bkl* is inhibited. In this case, as shown in FIG. 26, the inverted signal MTESTN of the test mode designating signal MTEST is at the L level, the control signals, fckdlpcend and fckdlsae, are fixed at the L level, and the internal data is not read.

When the test mode designating signal MTEST is at the L level, and the test mode designating signals tesddbdm <1> and tesdbdm <0> are both set to the H level, then the output signal of NAND gate 161 attains to the L level and the output signal of inverter 162 attains to the H level. Therefore, in this case, the output signal of NOR gate 164 attains to the H level, and in accordance with the sense amplifier activating signal, sae, the output signal of NOR gate 167 attains to the L level. As the output signal of inverter 168 is at the L level, output signals RST <0:2> of OR circuits OG0-OG2 attain to the L level, subbit line selection signal generating circuits 182*ajh*, 182*ajl*, 182*akh* and 182*bkl* are reset, and the subbit line selection signals yrajn <0:7> and yrakn <0:7> and the bit line selection signals yrbn <0:3> are all returned to the initial state.

When the output signal of NAND gate 161 is at the H level, the output signal of NOR gate 163 attains to the H level, and in accordance with the sense amplifier activation timing control signal, ckdlsae, the output signal of NOR gate 167 attains to the L level. Therefore, in this case, in accordance with the sense amplifier activation timing control signal, ckdlsae, the subbit line selection signals yrajn <0:7> and yrakn <0:7> and the common bit line selection signals yrabn <0:3> are reset.

Therefore, when the timings of sense amplifier activation and subbit line precharging are to be adjusted in the construction of precharge/sense control circuit 80 shown in FIG. 26, the Y related circuits can be reset in accordance with the adjusted timing of sense amplifier activation.

In a normal operation mode, the output signal of one of NOR gates 163 and 164 attains to the H level, and in accordance with the sense amplifier activating signal, sae, or the sense amplifier activation timing control signal, ckdlsae, the selecting operation of the subbit line and the common bit line is reset (in the first embodiment, the Y decoder is reset in accordance with the sense amplifier activation timing control signal ckdlsae).

In the normal operation mode, in data reading, the read mode designating signal MDSA attains to the H level, and the output signal of inverter 169 is at the L level. Therefore, in accordance with activation of the read operation start timing control signal, ltyrel, the bit line discharge control signals, bitlowjn and bitlowkn, attain to the L level in accordance with the bit line discharge control signal ckdldc, and discharge of the subbit line is stopped.

As can be seen from FIG. 26, in the read operation mode, the test mode designating signal MTEST is at the L level (signal MTESTN is at the H level), and based on the internal read start designating signal ltrel, the signals, ckdlpcend and ckdlsae, are generated.

In the normal operation mode, when the signals ltyrel and MDSA both attain to the H level, NAND gates 170 and 174 are enabled, and in accordance with the latch predecodes signal lta16 <0:1>, a train of the memory mat is designated. In FIG. 31, to NAND gate 170, the latch predecoded signal lta16 <0> is applied, and to NAND gate 174, the latch precoded signal lta16 <1> is applied, as an example. In the selected memory block, the output signal of NAND gate 170 or 174 corresponding to the unselected memory mat train attains to the L level.

At the time of data reading, the signal ltyrel is at the H level, the output signal of inverter 168 attains to the L level in response, and NOR gates 172 and 176 each operate as an inverter. Therefore, the reference current control signal generating circuits 184*j* and 184*k* drive, when the corresponding memory mat does not include the selected memory cell, the reference current control signal, refdcjn or refdckn, to the L level, in accordance with the reference current discharge timing control signal, ckdlrefdc, respectively. Accordingly, as in the test operation described above, the reference current driving source is connected to the reference memory mat.

Subbit line selection signal generating circuits 182*ajh*, 182*ajl*, 182*akh* and 182*bkl* generate, when the signal ltyrel is at the H level and the output signals (reset signal RST) of OR circuits OG0-OG2 are at the H level, the subbit line selection signals yrajn <0:7> and yrakn <0:7> as well as the common bit line selection signal yrbn <0:3>, in accordance with applied latch predecoded signals ltyra <0:7> and ltyrb <0:3>, respectively.

Precharge control signal generating circuit 187 drives the precharge end signal, pcend, to the H level when the signal ltyrel is at the L level and the precharge end timing control signal, ckdlpcend, attains the H level, and to the L level when one of the signals, ltyrel and ckdlpcend, is at the L level.

Therefore, in the construction of Y decoder 13 shown in FIG. 31 also, when the test mode designating signal MTEST is at the H level, reset of the subbit line selection signal and the common bit line selection signal by the sense amplifier activating signal, sae, or the sense amplifier activation timing control signal, ckdlsae, is stopped. When the test mode designating signal MTEST is at the L level, the subbit line selection signals yrajn <0:7> and yrakn <0:7> and the common bit line selection signals yrbn <0:3> are reset, in accordance with the sense amplifier activating signal sae or the sense amplifier activation timing control signal ckdlsae.

Figure 32:
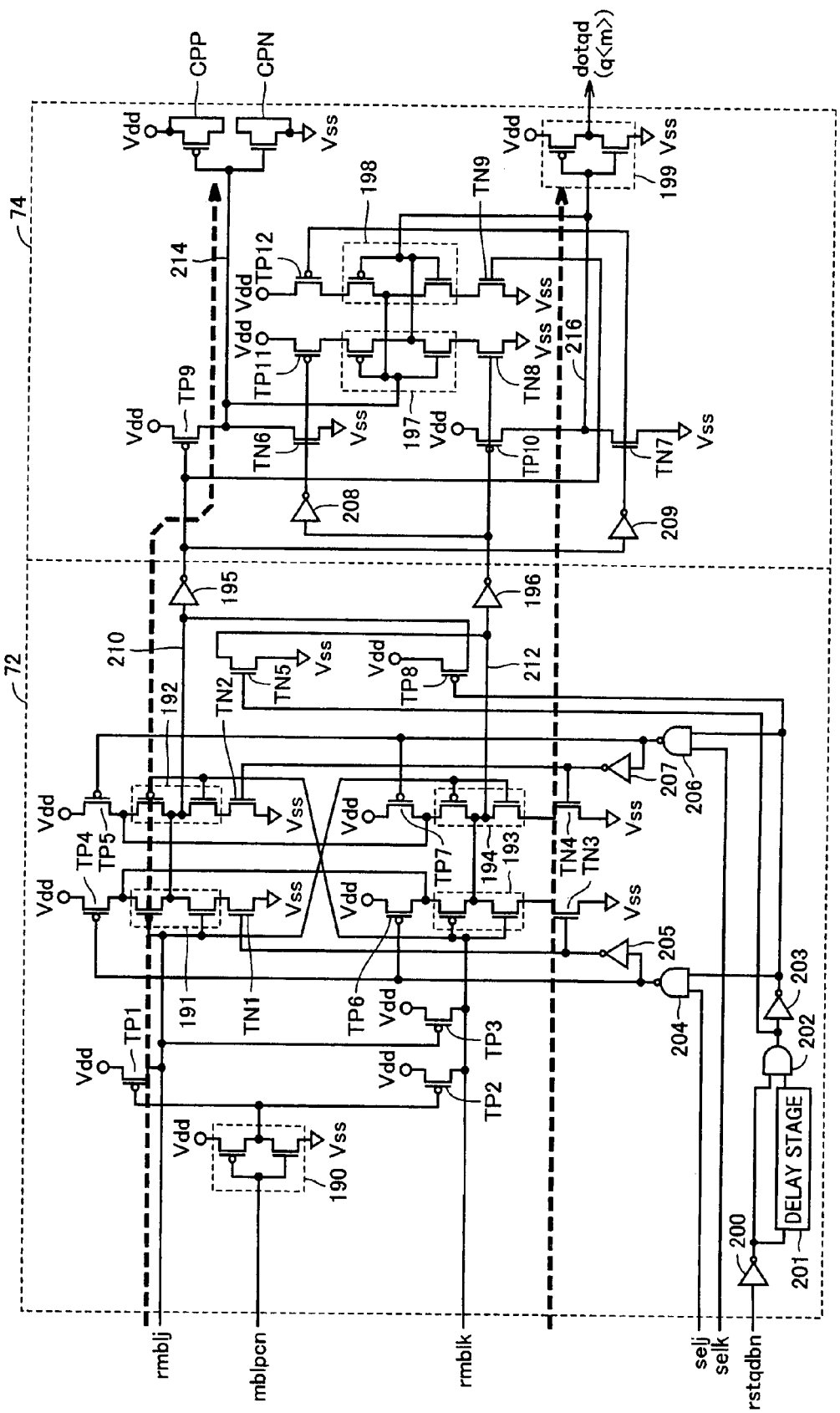
FIG. 32 shows exemplary constructions of an output latch and an output buffer shown in FIG. 22.

FIG. 32 shows an example of a specific constructions of output latch 72 and output buffer 74 shown in FIG. 22. Referring to FIG. 32, output latch 72 includes: an inverter 190 receiving the main bit line precharge designating signal mblpcn; P channel MOS transistors TP1 and TP2 precharging, when the output signal of inverter 190 is at the L level, read main bit lines, rmblj and rmblk, to the level of the power supply voltage Vdd, respectively; a p channel MOS transistor TP3 rendered conductive when the read main bit line rmlj is at the L level, and charging the read main bit line, rmblk to the level of the power supply voltage Vdd; a CMOS inverter 191 inverting and transmitting to internal node 210, the potential of read main bit line rmblk, when activated; a CMOS inverter 193 inverting and transmitting to an internal node 212 a potential of read main bit line rmblk, when activated; a CMOS inverter 194 inverting and transmitting to internal node 212 a signal on read main bit line rmblj, when activated; an inverter 195 inverting and transmitting to output buffer 74 a signal of internal node 210; and an inverter 196 inverting and transmitting to output buffer 72 a signal of internal node 212.

The power supply voltage Vdd may be the voltage from the same power source as that for power supply voltage vdd used in the Y decoder, or it may be a power supply voltage from a power source dedicated for the output.

Output latch 72 performs an operation of amplifying the signals on read main bit lines rmlj and rmblk and transmitting the amplified signals to output buffer 74, and an operation of exchanging the data of read main bit lines rmblj and rmblk for transmission to output buffer 74. As will be described in greater detail later, this is because data inversion becomes necessary dependent on the position of the selected memory mat, in order to generate a single end internal read data dotqd (Q <m>) from the differential signal between read main bit lines rmblj and rmblk.

In order to control activation/inactivation of output latch 72, the following components are provided: an inverter 200 receiving an output latch reset signal rstqd; a delay stage 201 delaying an output signal of inverter 200 by a prescribed time period; an AND gate 202 receiving an output signal of delay stage 201 and the output signal of inverter 200; an inverter 203 receiving an output of AND gate 202; an NAND gate 204 receiving an output signal of inverter 203 and the selected memory mat designating signal selj; an inverter 205 receiving an output signal of NAND gate 204; an NAND gate 206 receiving an output signal of inverter 203 and the selected memory mat designating signal selk; an inverter 207 receiving an output signal of NAND gate 206; P channel MOS transistors TP4 and TP6 rendered conductive when the output signal of NAND gate 204 is at the L level, and coupling high-side power supply nodes of CMOS inverters 191 and 193 to a power supply node, respectively; N channel MOS transistors TN1 and TN3 rendered conductive when the output signal of inverter 205 is at the H level, and coupling low-side power supply nodes of CMOS inverters 191 and 193 to the ground node, respectively; P channel MOS transistors TP5 and TP7 rendered conducive when the output signal of NAND gate 206 is at the L level, and connecting high-side power supply nodes of CMOS inverters 192 and 194 to the power supply node, respectively; N channel MOS transistors TN2 and TN4 rendered conductive when the output signal of inverter 207 is at the H level, and coupling low-side power supply nodes of CMOS inverters 192 and 194 to the ground node, respectively; an N channel MOS transistor TN5 coupling an internal node 212 to the ground node when the output signal of AND gate 202 is at the H level; and a P channel MOS transistor TP8 rendered conductive when the output signal of inverter 203 is at the L level, and coupling the internal node 210 to the power supply node.

The portion for generating the control signals may be provided commonly to all the output latches in the output latch circuit, or it may be arranged corresponding to each output latch, for each read data bit.

The selected memory mat designating signals, selj and selk, are generated based on the mat selection signals, selbootk and selbootj, generated by selected mat detecting circuit 116 shown in FIG. 24. Inverter 200, delay stage 201 and AND gate 202 form an inversion fall delay circuit, and generate a signal that falls to the L level when the reset signal, rstqdbn, rises to the H level, and rises to the H level after the delay time of delay stage 201 when the reset signal, rstqdbn, falls to the L level.

As will be described in greater detail later, the main bit line precharge signal, mblpcn, is generated based on the monitor signal MSAE, from the output control circuit.

In output latch circuit 72, when the main bit line precharge signal mblpcl is at the H level, the output of CMOS inverter 190 attains to the L level, so that MOS transistors TP1 and TP2 turn on, to set the read main bit lines, rmblj and rmblk, to the level of the power supply voltage Vdd, respectively.

When the reset signal, rstqdbn, attains to the L level, the output signal of AND gate 202 attains to the H level after the delay time of delay stage 201, and the output signal of inverter 203 attains to the L level. In response, MOS transistors TN5 and TP8 turn on, so that internal node 212 is set to the level of the ground voltage Vss and the internal node 210 is set to the level of power supply voltage Vdd.

When the reset signal, rstqdbn, is at the H level, the output signal of inverter 200 is at the L level, and the output signal of AND gate 202 is at the L level. Therefore, in this state, MOS transistors TN5 and TP8 are kept off.

When the output signal of inverter 203 is at the H level, NAND gates 204 and 206 are enabled, to invert the selected memory mat designating signals, selj and selk, respectively. When the selected memory mat designating signal, selj, is at the H level, the selected memory mat designating signal, selk, is at the L level. In this state, the output signal of NAND gate 204 attains to the L level, MOS transistors TP4, TN1, TP6 and TN3 turn on, CMOS inverters 191 and 193 are enabled, so that the signal potentials on read main bit lines, rmblj and rmblk, are inverted and transmitted to internal nodes 210 and 212, respectively.

On the contrary, when the selected memory mat designating signal, selj, is at the L level and the selected memory mat designating signal, selk, is at the H level, the output signal of NAND gate 206 attains to the L level, and the output signal of NAND gate 204 attains to the H level. CMOS inverters 191 and 193 attain to the output high impedance state. As MOS transistors TP5, TN2, TP7 and TN4 turn on, CMOS inverters 192 and 194 are enabled, so that signal potentials on read main bit lines, rmblj and rmblk, are inverted by CMOS inverters 194 and 192, respectively, and transmitted to internal nodes 212 and 210.

The voltages of internal nodes 210 and 212 are inverted by inverters 195 and 196 and transmitted to output buffer 74.

Output buffer 74 includes: an inverter 208 receiving an output signal of inverter 196; an inverter 209 receiving an output signal of inverter 195; a P channel MOS transistor TP9 rendered conductive when the output signal of inverter 195 is at the L level, and coupling an internal node 214 to the power supply node; an N channel MOS transistor TN6 rendered conductive when the output signal of inverter 208 is at the H level, and coupling internal node 214 to the ground node; an N channel MOS transistor TP10 rendered conductive when the output signal of inverter 196 is at the L level, and coupling internal node 216 to the power supply node; an N channel MOS transistor TN7 rendered conductive when the output signal of inverter 209 is at the H level, and coupling internal node 216 to the ground node; an CMOS inverter 197 inverting and transmitting to internal node 216 the signal on internal node 214, when activated; a CMOS inverter 198 inverting and transmitting to internal node 214 the signal on internal node 216, when activated; and a CMOS inverter 199 inverting the signal on internal node 216 and generating an internal output data dotqb (Q <m>).

Output buffer 74 further includes: a P channel MOS transistor TP11 rendered conductive when the output signal of inverter 208 is at the L level, and coupling the high-side power supply node of CMOS inverter 197 to the power supply node; an N channel MOS transistor TN8 rendered conductive when the output signal of inverter 196 is at the H level and coupling a low-side power supply node of CMOS inverter 197 to the ground node; a P channel MOS transistor TP12 rendered conductive when the output signal of inverter 209 is at the L level and coupling a high-side power supply node of CMOS inverter 198 to the power supply node; an N channel MOS transistor TN9 rendered conductive when the output signal of inverter 195 is at the H level and coupling a low-side power supply node of CMOS inverter 198 to the ground node; and MOS capacitors CPP and CPN coupled to internal node 214.

MOS capacitor CPP is formed of a P channel MOS transistor having its gate coupled to internal node 214 and its source and drain nodes coupled to the power supply node. MOS capacitor CPN is formed of an N channel MOS transistor having its gate coupled to internal node 214 and its source and drain coupled to the ground node. Therefore, when internal node 214 is at the H level, MOS capacitor CPN functions as a capacitor element, and when internal node 214 is driven to the level of the ground voltage, MOS capacitor CPP functions as a capacitor element. By these MOS capacitors CPP and CPN, a load that imitates the gate capacitance of CMOS inverter 199 is connected to internal 214, so as to equalize the loads on internal nodes 214 and 216.

When output latch 72 is in a reset state, internal node 210 is at the level of power supply voltage Vdd and internal node 212 is at the level of ground voltage Vss. Therefore, output signals of inverters 195 and 196 attain to the L level and H level, respectively, MOS transistor TP9 is on, MOS transistor TP10 is off, and internal node 214 is kept at the level of the power supply voltage Vdd. MOS transistors TP11 and TN8 turn on, so that CMOS inverter 197 is activated to invert and transmit to internal node 216 the signal at the level of the power supply voltage Vdd on internal node 214, and in response, internal node 216 is kept at the level of the power supply voltage.

At this time, the voltage level of internal node 210 of output latch 72 is at the power supply voltage level, and the output signal of inverter 209 is at the H level. Therefore, MOS transistor TN7 turns on, and internal node 216 is coupled to the ground node. The output signal of inverter 209 is at the H level and the output signal of inverter 195 is at the L level. Therefore, MOS transistors TP12 and TN9 are off, and CMOS inverter 198 enters the output high impedance state. Therefore, in this set state, the internal node 214 is at the level of the power supply voltage Vdd, and internal node 216 is at the level of the ground voltage Vss.

In the internal data read mode, in accordance with the output signals of inverters 195 and 196, one of the CMOS inverters 197 and 198 is activated, and the other is inactivated (output high impedance state). Therefore, internal node 216 is set to the level according to the output signals of inverters 195 and 196, and by inverter 199, internal output data dotqd (Q <m>) is generated.

By way of example, when the output signal of inverter 195 is at the H level and the output signal of inverter 196 is at the L level, MOS transistors TM6 and TP10 turn on, and internal nodes 214 and 216 are driven to the levels of the ground voltage Vss and the power supply voltage Vdd, respectively. In this case, CMOS inverter 198 is activated, inverts the signal at the H level on internal node 216, and transmits the L level signal to internal node 214. By inverter 198 and MOS transistors TN6 and TP10, voltage levels of internal nodes 214 and 216 are maintained.

Figure 33:
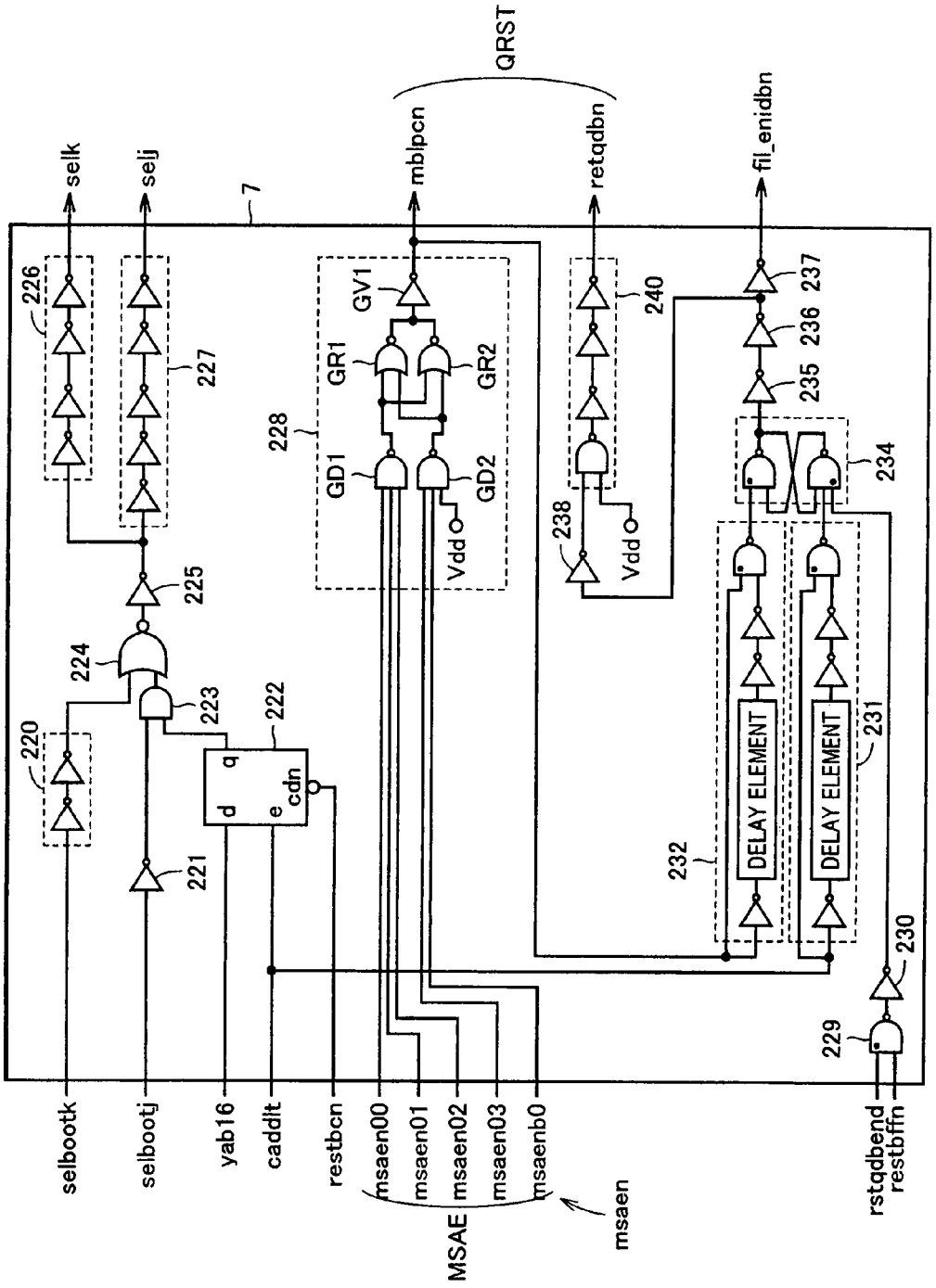
FIG. 33 shows an exemplary construction of an output control circuit shown in FIG. 20.

FIG. 33 shows an example of a specific construction of output control circuit 7 shown in FIG. 20. Referring to FIG. 33, output control circuit 7 includes: a buffer circuit 220 receiving the selection signal selbootk; an inverter 221 receiving the selection signal, selbootj; a flip-flop 222 reset in response to activation of the reset signal, restbcn and taking the Y related operation start designating signal yab16 in response to activation of the Y address latch designating signal caddlt; an AND gate 223 receiving a signal from an output q of flip-flop 222 and an output signal from inverter 211; an NOR gate 224 receiving an output signal of buffer circuit 220 and an output signal of AND gate 223; an inverter 225 receiving an output signal of NOR gate 224; a buffer circuit 226 delaying an output signal of inverter 225 by a prescribed time period and generating a selected memory mat designating signal selk; an inversion buffer circuit 227 inverting and delaying by a prescribed time period the output signal of inverter 225 and generating the selected memory mat designating signal selj; and a main bit line precharge control signal generating circuit 228 receiving monitor signals msaen00-msaen03 and msaenb0, and generating the main bit line precharge designating signal mblpcn.

As will be described in detail later, the memory array is divided into 10 trains of memory mats, and corresponding to each pair of memory mat trains, a train of sense amplifiers (sense amplifier band) is arranged. Sense amplifier activating signals are generated corresponding to each of the five trains of sense amplifiers. By the sense amplifier control circuit (see FIG. 23) arranged corresponding to each sense amplifier train (band), monitor signals msaen00-msaen03 and msaenb0 are generated, corresponding to these sense amplifier activating signals. The monitor signals msaen00-03 and msaenb0 each correspond to the monitor signal msaen (MSAE) generated from the sense amplifier control circuit shown in FIG. 23, of which logic level is inverted from that of monitor signal MSAE. At the time of sensing operation, any of the monitor signals msaen00-msaen03 and msaenb attains to the L level (monitor signal MSAE attains to the H level), signaling that the corresponding sense amplifier train (band) is activated.

Main bit line precharge control signal generating circuit 228 includes: an NAND gate GD1 receiving monitor signals msae00-msae02; an NAND gate GD2 receiving the power supply voltage Vdd and monitor signals msae03 and msaeb0; NOR gates GR1 and GR2 having output nodes coupled together and receiving respective output signals of NAND gates GD1 and GD2; and a buffer circuit GV1 buffering a signal from the common output node of NOR gates GR1 and GR2, and generating the main bit line precharge designating signal, mblpcn.

When the monitor signals msaen00-msaen03 and msaenb0 all attain to the H level, output signals of NAND gates GD1 and GD2 attain to the L level, and the output signals of NOR gates GR1 and GR2 attain to the H level. In response, the main bit line precharge designating signal, mblpcn, from buffer circuit GV1 attains to the H level, precharging of the read main bit lines, rmblj and rmblk, starts and the internal read data is reset at the output latch.

When sensing operation is performed and at least one of the monitor signals msaen00-msaen03 and msaenb0 is activated and attains to the L level, the output signal of at least one of NAND gates GD1 and GD2 attains to the H level, and the output signals of NOR gates GR1 and GR2 attain to the L level. In response, the main bit line precharge designating signal, mblpcn, from buffer circuit GV1 attains to the L level, the output signal from inverter 190 shown in FIG. 32 attains to the H level, precharging of read main bit lines, rmblj and rmblk, ends, and the signal transferred over the read main bit line is latched.

Output control circuit 7 further includes: an NAND gate 229 receiving the reset signals, rstqdbend and restbffn; an inverter 230 inverting an output signal of NAND gate 229; a one shot pulse generating circuit 231 for generating a one shot pulse signal in response to the rise of the Y address latch designating signal caddlt; a one shot pulse generating circuit 232 for generating a one shot pulse signal in response to the rise of the main bit line precharge designating signal, mblpcn; a set/reset flip-flop 234 reset when one of the output signals of inverter 230 and one shot pulse generating circuit 231 is at the L level, and set when the output signal of one shot pulse generating circuit 232 is at the L level; an inverter 235 receiving an output signal of set/reset flip-flop 234; cascaded inverters 236 and 237 of two stages, for buffering the output signal of inverter 235 and generating an input buffer enable signal fil_enidbn; an inverter 238 inverting an output signal of inverter 236; and a buffer circuit 240 buffering an output signal of inverter 238 and generating a reset signal, rstqdbn.

Buffer circuit 240 includes, at its input portion, an NAND gate that receives the power supply voltage Vdd and the output signal of inverter 238, and the NAND gate operates as an inverter. Therefore, buffer circuit 240 is equivalently formed by an even-number of stages (4 stages in FIG. 33) of inverters, and buffers the output signal of inverter 238 to generate the reset signal, rstqdbn.

The signals, mblpcn and rstqdbn, from output control circuit 7 correspond to the reset signal QRST shown in FIG. 20, and in accordance with these signals, precharging of the read main bit lines rmblj and rmblk and resetting of the internal node of the output latch are performed, as shown in FIG. 33.

Figure 34:
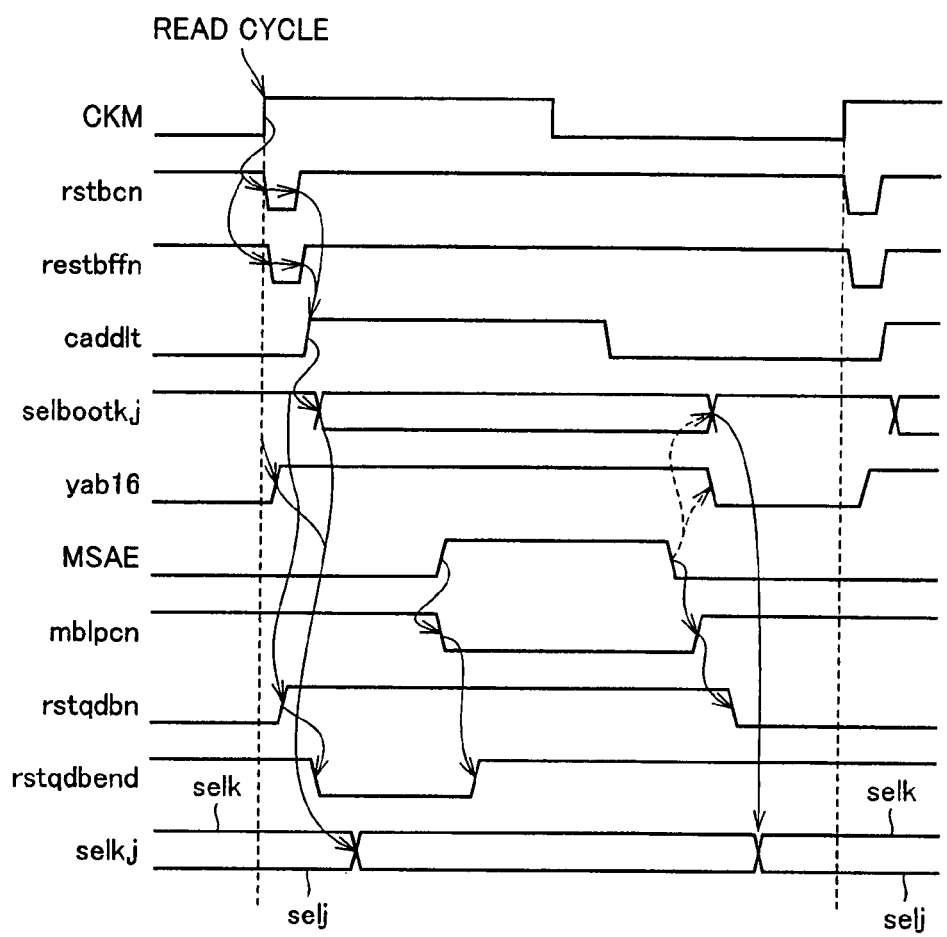
FIG. 34 is a timing diagram representing an operation of the output control circuit shown in FIG. 33.

FIG. 34 is a timing diagram representing an operation of output control circuit 7 shown in FIG. 33. The operation of output control circuit 7 shown in FIG. 33 will be described in the following with reference to FIG. 34.

In a read cycle of performing data reading, in response to the rise of clock signal CKM, the reset signals, restbcn and restbff, attain to and kept at the L level for a prescribed time period. In response, the output signal of NAND gate 229 attains to the H level, and the output signal of inverter 230 attains to the L level. In this state, the main bit line precharge signal, mblpcn, has already been raised to the H level, the output signal of one shot pulse generating circuit 232 is at the H level, the output state of set/reset flip-flop 234 does not change, the output signal of inverter 235 is at the L level, and the reset signal rstqdben is kept at the H level.

When the reset signals, restbffn and restbcn, attain to the H level, the Y address latch signal caddlt attains to the H level. Flip-flop 222 is reset in accordance with activation of the reset signal, restbcn, and then latches, in accordance with the Y address latch signal caddlt, the signal, yab16, designating the start of internal column selecting operation, which has been already made definite and settled by the predecoding operation, to produce an H level signal from an output q.

Further, by the time the Y address latch designating signal caddlt is activated, the predecode operation has been performed by the predecoder, so that the states of selection signals, selbootk and selbootj, have been decided. Therefore, the selection signals selk and selj from buffer circuit 226 and inversion buffer circuit 227 have their states set in accordance with these selection signals, selbootk and selbootj.

In response to activation of the reset signal restbffn, the output signal of inverter 230 attains to the L level, and flip-flop 234 is reset. In response, the output signal of inverter 236 attains to the L level, the buffer reset signal, rstwdbn, from buffer circuit 240 attains to the H level, and the reset state of the internal node of the output latch is released, to enter the state of waiting for data reading.

Further, the output signal of one shot pulse generating circuit 231 attains to and kept at the L level for a prescribed time period in response to the rise of Y address latch designating signal caddlt, flip-flop 234 is reset, the output signal of inverter 235 attains to the H level, flip-flop 234 that has been reset at the fall of reset signal restbffn is reset reliably in response, and the buffer reset signal, restqdbn, is kept at the H level. In response to the activation of Y address latch designating signal caddlt, the reset signal, rstqdbend, attains to the L level, and the reset signal, rstqdbn, is surely maintained at the inactive state.

When the reset signal, rstqdbn, is inactivated, the output signal of inverter 203 attains to the H level, and in accordance with the selected memory mat designating signals selj and selk, the data transfer path in the output latch is established, as shown in FIG. 32.

When the subbit line selection and sense amplifier activation are performed internally, the monitor signal MSAE is activated in synchronization with the activation of the sense amplifier. When the monitor signal MSAE is activated (when either one of the monitor signals msaen00-msaen03 and msaenb0 attains to the L level), the main bit line precharge signal, mblpcn, attains to the L level, the precharging operation of the read main bit line in the output latch is completed, and the transmitted memory cell data is amplified and latched, as shown in FIG. 32.

In accordance with the activation of the sense amplifier, the reset signal, rstqdbend, attains to the H level, flip-flop 234 is released from the forced reset state, and is made ready for the reset of the internal node of the output latch in response to the reset of the read main bit line. Here, the reset signal, rstqdbend, may be adapted to attain to the H level when the main bit line precharge signal, mblpcn, attains to the L level.

The internal data reading of the read main bit line and data transfer inside the output latch circuit are performed, and the internal output data is output from the output buffer.

When reading of the internal data is completed and sense amplifier activation is completed, the monitor signal MSAE is inactivated in response. Then, the main bit line precharge signal, mblpcn, from main bit line precharge control signal generating circuit 228 rises to the H level in response, and the precharge of the read main bit line in the output latch is executed again.

In accordance with the sense amplifier activating signal generated corresponding to the monitor signal MSAE, the address latch circuit is reset and the decoder circuit is reset, and the selection signals, selbootk and selbootj, are reset to the H level. In response, the selection signals, selk and selj, are reset to the H level and L level, respectively.

The output buffer reset end signal, rstqdbend, is at the H level. In response to the rise of the main bit line precharge signal mblpcn, an L-level one shot pulse is generated from one shot pulse generating circuit 232, flip-flop 234 is set, the output signal of inverter 236 attains to the H level, the reset signal, rstqdbend, attains to the L level in response, and the internal node of the output latch is reset. As shown in FIG. 32, after the delay time of delay stage 201 from when the reset signal, rstqdbend, attains to the L level, the output signal of AND gate 201 attains to the H level, and internal nodes 210 and 212 are reset. In response, the output signal from output buffer 74 is also initialized.

The reset signal, rstqdbend, is reset to the H level, after the reset signal rstqdbn attains to the L level, in accordance with detection of a change in the main bit line precharge signal mblpcn or with detection of the predecoded address changing into the reset state, or at a prescribed timing.

Therefore, in output control circuit 33, the read main bit line precharge signal, mblpcn, and the output latch reset signal, rstqdbn, are activated and inactivated in accordance with activation/inactivation of the monitor signal MSAE, and accordingly, the internal read data can be amplified and latched at the timing when the internal read data has been transmitted to the output latch through the read main bit line. Hence, the output latch and the output buffer can be reset reliably after the end of amplification and latching of the internal read data.

Figure 35:
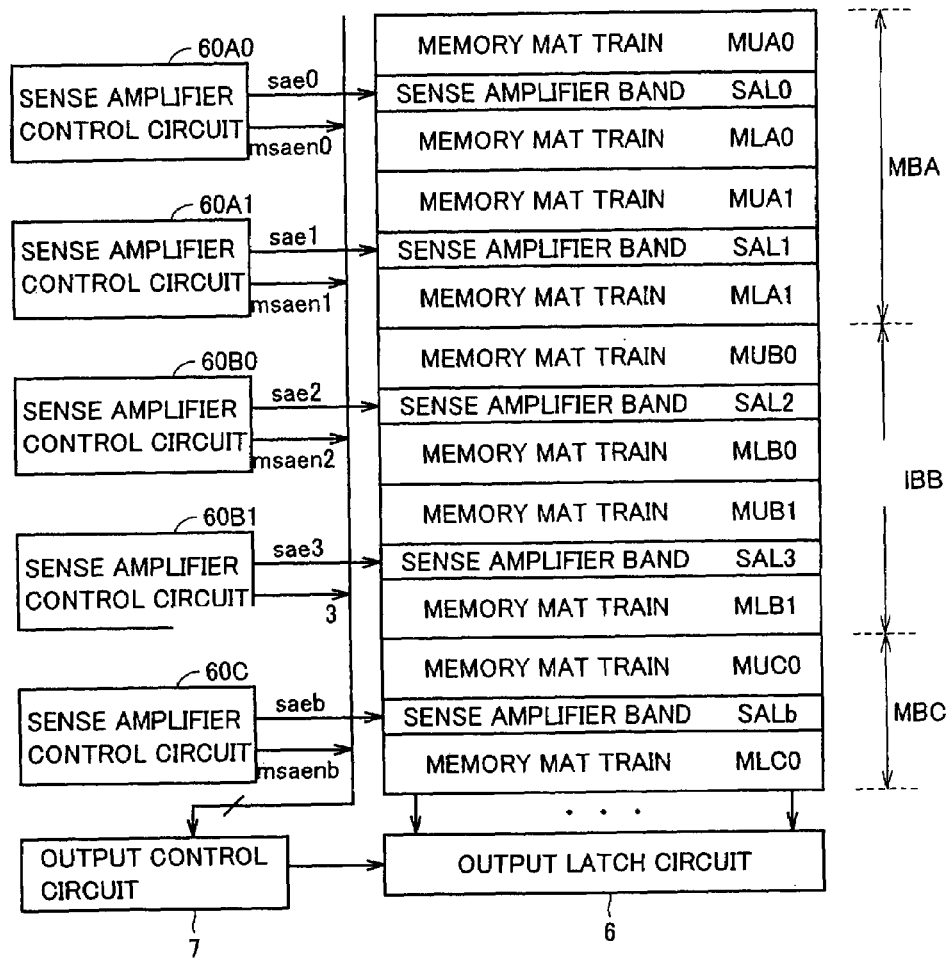
FIG. 35 schematically shows a construction of a sense amplifier band in the fifth embodiment of the present invention.

FIG. 35 schematically shows the specific construction of the memory array and the arrangement of the sense amplifiers. Memory blocks MBA and MBB each include four trains of memory mats. Specifically, memory block MBA includes memory mat trains MUA0, MLA0, MUA1 and MLA1, while memory block MBB includes memory mat trains MUB0, MLB0, MUB1 and MLB1.

The memory array further includes a memory block MBC for storing special data. The memory block includes a special data storage region for storing data such as activation program information including a boot program, and a redundant memory cell arrangement region for arranging redundant memory cells for redundancy replacement. Memory block MBC includes memory mat trains MUC0 and MLC0.

Each of the memory mat trains MUA0-MLC0 includes four memory mats, as shown in the previous described second embodiment. For one memory block, an X decoder for selecting 1024 control gate lines is arranged, and therefore, in each memory mat train, 256 control gate lines are arranged.

Between these mat trains, a sense amplifier band including sense amplifier circuits, a read buffer and a reference current supplying circuit are arranged. Specifically, between memory mat trains MUA0 and MLA0, a sense amplifier band SAL0 is arranged, and between memory mat trains MUA1 and MLA1, a sense amplifier band SAL1 is arranged. Between memory mat trains MUB0 and MLB0, a sense amplifier band SAL2 is arranged, and between memory mat trains MUB1 and MLB1, a sense amplifier band SAL3 is arranged. Between memory mat trains MUC0 and MLC0, a sense amplifier band SALb is arranged.

For the sense amplifier bands SAL0-SAL3 and SALb, sense amplifier control circuits 60A0, 60A1, 60B0, 60B1 and 60C are provided, respectively, and from corresponding sense amplifier control circuits, the sense amplifier activating signals sae0-sae3 and saeb are applied to the respective sense amplifier bands SAL0-SAL3 and SALb.

Sense amplifier control circuits 60A0-60C generate monitor signals msaen0-msaen3 and msaenb in correspondence to the sense amplifier activating signals sae0-sae3 and saeb, and transfer the monitor signals to output control circuit 7.

In internal data reading, one sense amplifier band is selected and sensing operation is performed. The flight time of the internal read data transferred from the selected sense amplifier band to output latch circuit 7 differs dependent on the position of the selected sense amplifier band. However, the time for the internal read data generated by the selected sense amplifier band to be transferred to reach the output latch circuit 6 is substantially the same as the transfer time of the monitor signal, msaen, from the sense amplifier control circuit corresponding to the selected sense amplifier band to the output control circuit 7.

As for the Y decoder, a construction similar to that of Y decoder shown in FIG. 31 is arranged corresponding to each sense amplifier band, similar to the sense amplifier control circuit. For the selected memory mat train (selected sense amplifier band), the subbit line selection signal and the common bit line selection signal are output, and in the unselected sense amplifier band, the subbit line and the common bit line are not selected. Further, the reference current supplying circuit is also kept at the unselected state for the unselected memory mat train. Selection of the memory mat train is performed in accordance with the predecode memory block selection signal. Similar to the Y decoder, the Y address latch circuit may be arranged corresponding to each sense amplifier band, that is, each of Y decoder. The X decoder is required to select 1024 control gate lines and is arranged for each memory block. It is noted that the X decoder is naturally arranged corresponding to each memory mat train as in the first embodiment.

Figure 36:
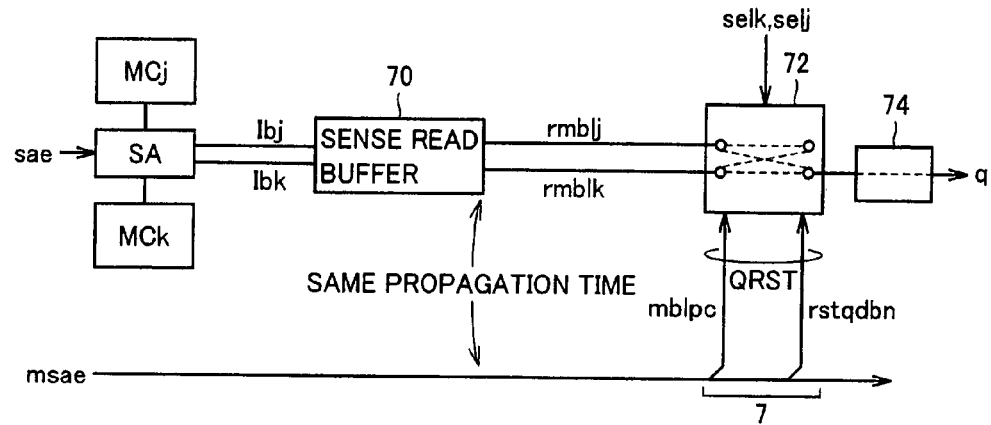
FIG. 36 schematically shows propagation paths of an internal read data and a monitor signal, in a sixth embodiment of the present invention.

FIG. 36 schematically shows a data transmission path from one sense amplifier circuit SA to output latch 72 and output buffer 74.

Referring to FIG. 36, to the sense amplifier circuit SA, memory cells MCj and MCk are coupled, and sensing and detection of the memory cell data are performed in accordance with the sense amplifier activating signal sae. The output signal from sense amplifier circuit SA is transmitted through sense output lines Ibj and Ibk to a sense read buffer 70. The sense read buffer 70 is activated in accordance with a complementary sense amplifier activating signal (saeb: inverted signal of sense amplifier activating signal sae) as shown in FIG. 22, and amplifies the signals on sense output lines Ibj and Ibk and transmits the resultant signals to the read main bit lines rmblj and rmblk.

Output latch 72 amplifies and latches the signals on read main bit lines rmblj and rmblk, when activated. In output latch 72, in accordance with the selected memory mat designating signal selk and selj, switch/non-switch of that transmission path of the internal read data (inversion/non-inversion of internal read data) is selectively performed.

Output buffer 74 generates a single end internal read data q in accordance with one of the complementary signals transmitted by output latch 72. Specifically, when the data of memory cell MCk is to be read, output buffer 74 generates the internal read data q in accordance with the data on the read main bit line rmblk. When data of memory cell MCj is to be read, output buffer 74 generates the internal read data q based on the data of the read main bit line rmblj.

Parallel to the transfer of the internal read data, a monitor signal msaen (MSAE) is generated at the same timing as the sense amplifier activating signal sae and transferred to the output control circuit. In output control circuit 7, the main bit line precharge signal, mblpc, and the output reset signal, rstqdbn, are generated in accordance with the monitor signal, msaen.

Therefore, the data propagation time of the path from activation of the sense amplifier activating signal, sae, through sensing operation of the sense amplifier circuit SA and transmission of the internal read data is substantially the same as the signal propagation time of monitor signal msaen. Therefore, the state of reading of the internal read data can be monitored by the monitor signal, msaen. By resetting the output latch in accordance with the monitor signal msaen, activation/inactivation of output latch 72 and output buffer 74 can be controlled in accordance with the state of transmission of internal read data (state of reading of internal read data).

Figure 37:
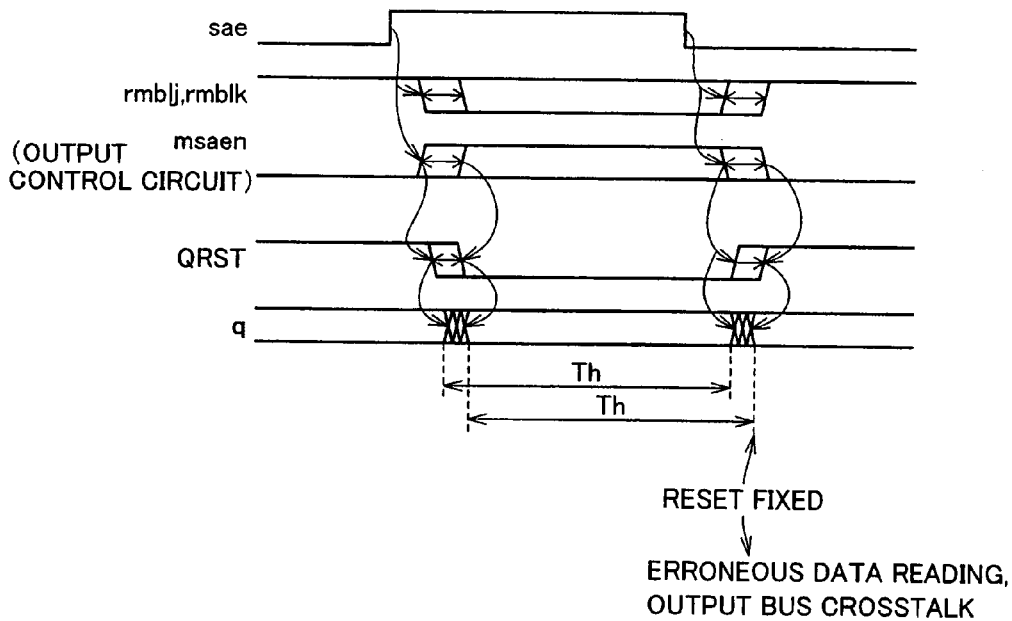
FIG. 37 is a timing diagram representing an operation of the circuit shown in FIG. 36.

FIG. 37 is a timing diagram representing an operation of the internal read data transmitting path shown in FIG. 36. Referring to FIG. 37, when the sense amplifier activating signal, sae, is activated, the monitor signal, msaen, is also activated and transmitted to output control circuit (7). In accordance with activation of the sense amplifier activating signal, sae, the internal read data is transmitted to read main bit lines rmblj and rmblk, and then transmitted to output latch circuit 72.

The propagation time of the internal read data to output latch 72 is substantially the same as the propagation time of monitor signal, msaen, to the output control circuit. In accordance with the monitor signal, msaen, the reset signal QRST is generated in output control circuit 7, so as to control activation/inactivation and particularly, resetting to the initial state, of output latch 72 and output buffer 74.

Therefore, even when the position of the selected memory mat train (sense amplifier band) is different and the propagation time of the internal read data is different, the reset signal QRST can be activated accurately in output control circuit 7, in accordance with the state of internal data reading in output latch 72 and output buffer 74. Activation of the reset signal QRST is performed in accordance with the state of propagation of the internal read data (state of internal data reading), and the time period of holding the internal read data q of from output buffer 74 changes in accordance with the arrival time of the internal read data. Therefore, no matter whether the arrival time of the internal read data is early or late at output buffer 74, the data holding time can be made substantially constant to Th.

By way of example, assume that the reset timing of output latch 72 and output buffer 74 is set fixedly for the latest arrival time of the read data, considering the operation margin. In this case, the internal read data may possibly be reset at a faster timing and the reset data would be read, that is, erroneous data would be read. Further, by such erroneously read data, the signal potential of the internal read data changes, to cause a crosstalk on the internal output bus, resulting in an erroneous reading. When resetting of output latch 72 and output buffer 74 is controlled in accordance with the state of data reading, the output control phase can be set reliably in accordance with the state of reading of the internal read data, and hence, the internal data can be read accurately.

Further, it is unnecessary to set the reset timing fixedly for the earliest arrival time of the internal read data in order to prevent possible erroneous reading caused by resetting. Therefore, sufficiently long data holding time can be ensured, and the operation margin can be enlarged.

As described above, according to the fifth embodiment, resetting of the output latch circuit and completion of resetting of the read main bit line are controlled in accordance with the state of reading of the internal data, and therefore, the output control phase can automatically be set in accordance with the state of reading of the internal data, and operation margin can be enlarged.

Sixth Embodiment

Figure 38:
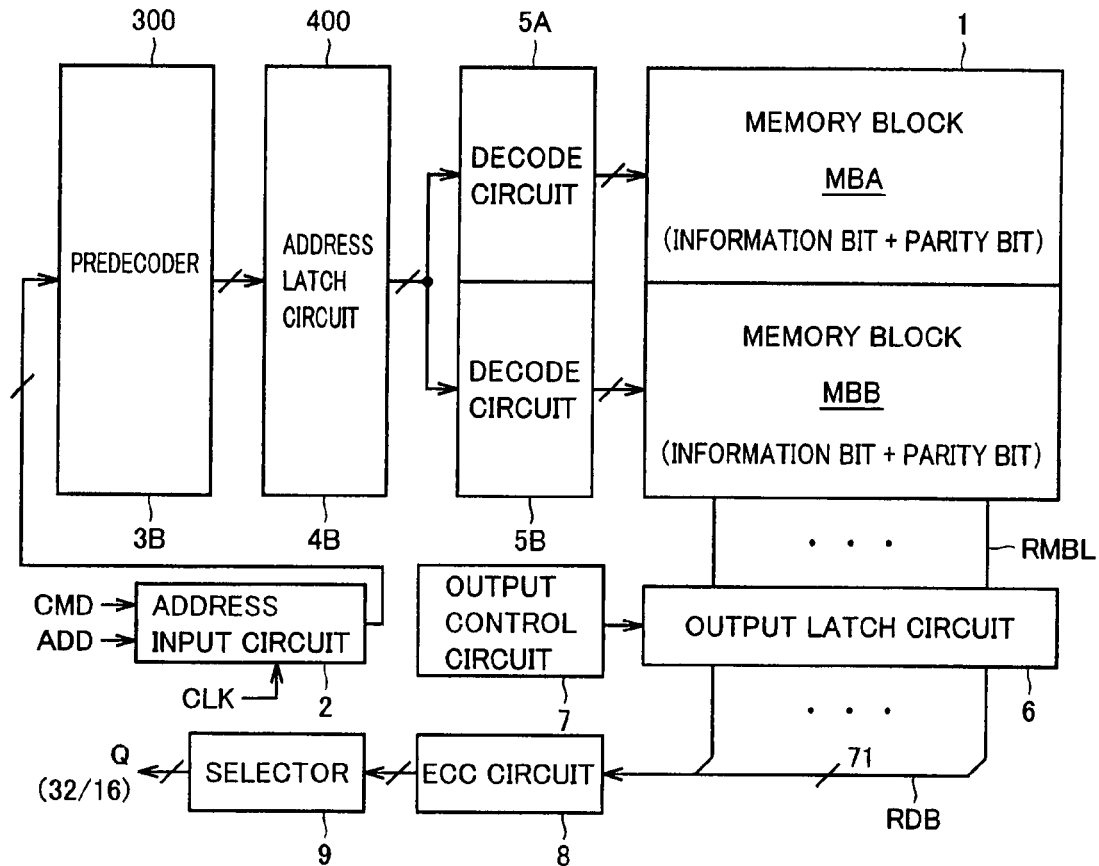
FIG. 38 schematically shows a construction of a main portion of the non-volatile semiconductor memory device in accordance with the sixth embodiment of the present invention.

FIG. 38 schematically shows a construction of a non-volatile semiconductor memory device in accordance with the sixth embodiment of the present invention. In the non-volatile semiconductor memory device shown in FIG. 38, a predecoder 300 for predecoding an address signal from address input circuit 2 and an address latch circuit 400 for latching an output signal of predecoder 300 are provided commonly to memory blocks MBA and MBB. Decode circuits 5A and 5B are arranged corresponding to memory blocks MBA and MBB, respectively. Except for these points, the construction of non-volatile semiconductor memory device shown in FIG. 38 is the same as that of non-volatile semiconductor memory device shown in FIG. 1, and therefore, corresponding portions are denoted by the same reference characters and description thereof will not be repeated.

In the construction of non-volatile semiconductor memory device shown in FIG. 38, predecoder 300 generates a block predecoded signal specifying memory blocks MBA and MBB, and in accordance with the block specifying predecoded signal latched by address latch circuit 400, one of decode circuits 5A and 5B is activated to perform the decoding operation.

Decode circuits 5A and 5B each include X decoders 12u and 12l and Y decoder 13 shown in FIG. 5, and after activation of the sense amplifier, the decoding operation thereof is reset. Further, after the activation of the sense amplifier, latch address of address latch circuit 400 is reset.

Further, output control circuit 7 monitors the state of reading of the internal read data, and in accordance with the results of monitoring, sets/resets the output latch circuit 6 selectively.

In the case when the internal state can be initialized with sufficient margin before the start of the next read cycle due to the resetting of the internal circuitry being performed based on the sense amplifier activating signal, the read cycle time can be made shorter by latching the predecoded signal by address latch circuit 400, even in the construction having predecoder 300 and address latch circuit 400 provided commonly to memory blocks MBA and MBB.

Figure 39:
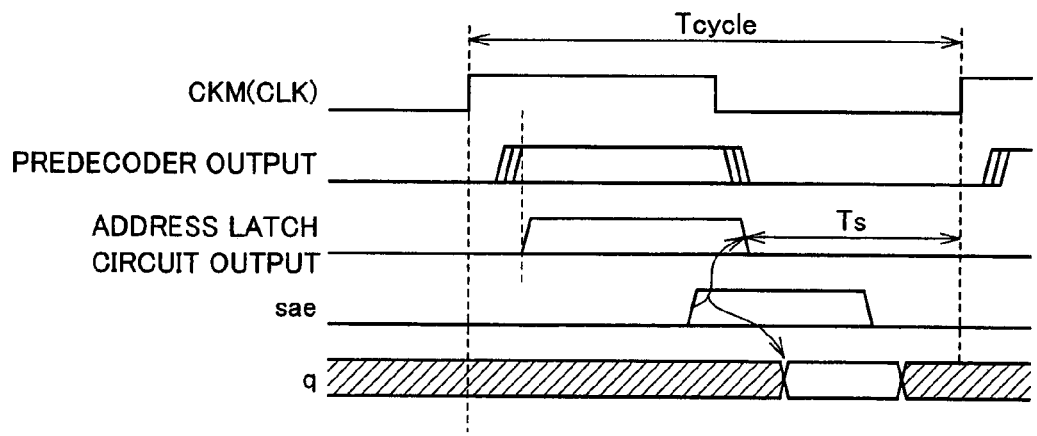
FIG. 39 is a diagram of signal waveforms representing an operation of the non-volatile semiconductor memory device shown in FIG. 38.

Specifically, as shown in FIG. 39, when the internal address is transmitted from address input circuit 2 in accordance with the clock signal CKM (CLK) and the predecoded signal is output from predecoder 300, if there is a skew in the output signal of predecoder 300 resulting from variation (skew) in signal propagation delay from address input circuit 2, the output signal of address latch circuit 400 is set considering the worst case to be driven to the definite state. After the output signal of address latch circuit 400 is made definite and settled, the sense amplifier activating signal, sae, is activated at a prescribed timing, address latch circuit 400 is reset in response, and decode circuit 5A or 5B is reset.

Here, the time Ts before the start of the next read cycle after resetting of address latch circuit 400 can be made sufficiently long, and the next read cycle can be started from the initial state. At the start of internal data reading operation, the state change of the internal signal occurs always in one direction. Among the signals of the same kind such as the subbit line selection signals, change to the unselected state and change to the selected state do not occur in parallel, and therefore, driving to the data reading state can be finished quickly. Thus, latching and decoding of the address signal can be performed with sufficient margin in the next read cycle.

In accordance with the monitor signal of sense amplifier activating signal, sae, the output data bit, q, is output from output latch circuit 6. From selector 9, data Q is output in synchronization with the clock signal CKM (or CLK), or the data is output at such a timing that the output data Q is made definite at the timing of the rise of clock signal CKM.

Therefore, even when there is a skew resulting from variation in internal address signal propagation delay in the output signal of predecoder 300, the read cycle time Tcycle can be made shorter, and high-speed reading can be achieved.

In the construction shown in FIG. 38, predecoder 300 and address latch circuit 400 can be provided commonly to memory blocks MBA and MBB, so that the area occupied by the circuits can be reduced, and current consumption can be reduced.

In the construction shown in FIG. 38 also, resetting process of address latch circuit 400 and decode circuits 5A and 5B may be configured to be stopped in the test mode.

Further, even when a plurality of sense amplifier bands are arranged in one memory block, similar effects can be obtained by arranging the Y decode circuit in correspondence with each sense amplifier band, in decode circuits 5A and 5B.

The present invention provides high-speed reading when applied to a general non-volatile semiconductor memory device such as a flash memory. The non-volatile semiconductor memory device is not limited to an MONOS type non-volatile semiconductor memory and other MNOS (Metal-Nitride-Oxide-Semiconductor) type memory, a magnetic memory utilizing variable magnetic resistance element, phase change memory using a phase change element or non-volatile semiconductor memory devices of other construction may be used.

Further, the construction of the circuitry related to data reading in accordance with the present invention is applicable not only to the non-volatile semiconductor memory devices but also to a volatile semiconductor memory devices such as an SRAM (Static Random Access Memory).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory array having a plurality of memory cells arranged in of rows and columns;
   address latch circuitry for latching an address signal designating a memory cell of said memory array;
   cell selecting circuitry for selecting an addressed memory cell of said memory array in accordance with a latched address signal of said address latch circuitry, said cell selecting circuitry resetting said address latch circuitry to an initial state after selection of said memory cell in a data read mode of operation; and
   data reading circuitry for reading data of the memory cell selected by said cell selecting circuitry for generating an internal data in said data read mode of operation.

2. The semiconductor memory device according to claim 1, wherein
   said cell selecting circuitry resets said cell selecting circuitry concurrently with the resetting of said address latch circuitry, after the selection of said memory cell.

3. The semiconductor memory device according to claim 1, wherein
   said cell selecting circuitry stops an operation of said resetting, when a test mode is set.

4. The semiconductor memory device according to claim 1, further comprising:
   a data output circuit for generating an internal output data from the internal data received from said data reading circuitry; and
   an output control circuit for monitoring a state of data reading from said data reading circuitry, and resetting said data output circuit in accordance with the monitored state.

5. The semiconductor memory device according to claim 4, wherein
   said data output circuit includes a data latch circuit for latching the internal data received from said data reading circuitry; and
   said data output control circuit resets said data output circuit in response to a monitor signal generated in accordance with an activating signal controlling activation of said data reading circuitry.

6. The semiconductor memory device according to claim 4, wherein
   said output control circuit receives a monitor signal through a signal line providing a signal propagation delay corresponding to signal propagation delay of a signal propagation path from said data reading circuitry to said data output circuit, and resets said data output circuit in accordance with the received monitor signal, said monitor signal being generated in correspondence to an activating signal activating said data reading circuitry.

* * * * *